(12) United States Patent
McElvain et al.

(10) Patent No.: US 8,166,434 B2
(45) Date of Patent: Apr. 24, 2012

(54) INTEGRATED CIRCUIT DEVICES AND METHODS AND APPARATUSES FOR DESIGNING INTEGRATED CIRCUIT DEVICES

(75) Inventors: Kenneth S. McElvain, Los Altos, CA (US); William Halpin, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 557 days.

(21) Appl. No.: 12/358,214

(22) Filed: Jan. 22, 2009

(65) Prior Publication Data

US 2009/0189244 A1 Jul. 30, 2009

Related U.S. Application Data

(60) Division of application No. 11/305,425, filed on Dec. 16, 2005, now Pat. No. 7,739,624, which is a continuation-in-part of application No. 10/626,031, filed on Jul. 23, 2003, now Pat. No. 7,943,436.

(60) Provisional application No. 60/399,760, filed on Jul. 29, 2002.

(51) Int. Cl.
*G06F 17/50* (2006.01)

(52) U.S. Cl. ........ 716/115; 716/100; 716/101; 716/106; 716/109; 716/110; 716/111; 716/120; 438/731; 257/409; 257/508; 257/659; 257/662

(58) Field of Classification Search .......... 716/100–101, 716/106, 109, 110–111, 115, 120; 257/409, 257/508, 659, 662; 438/731
See application file for complete search history.

(56) References Cited

U.S. PATENT DOCUMENTS

| | | | |
|---|---|---|---|
| 4,353,040 A | 10/1982 | Krumm et al. | |
| 5,075,753 A | 12/1991 | Kozono | |
| 5,288,949 A | 2/1994 | Crafts | |
| 5,334,800 A | 8/1994 | Kenney | |
| 5,682,124 A | 10/1997 | Suski | |
| 5,723,908 A | 3/1998 | Fuchida et al. | |
| 5,999,440 A | 12/1999 | Crafts | |

(Continued)

FOREIGN PATENT DOCUMENTS

EP 1497864 B1 6/2000

(Continued)

OTHER PUBLICATIONS

PCT International Search Report for PCT International Application No. US03/23559, mailed Sep. 6, 2004 (9 pages).

(Continued)

*Primary Examiner* — Nghia Doan
(74) *Attorney, Agent, or Firm* — Blakely, Sokoloff, Taylor & Zafman LLP; Judith A. Szepesi

(57) ABSTRACT

Methods and apparatuses to design an Integrated Circuit (IC) with a shielding of wires. In at least one embodiment, a shielding mesh of at least two reference voltages (e.g., power and ground) is used to reduce both the capacitive coupling and the inductive coupling in routed signal wires in IC chips. In some embodiments, a type of shielding mesh (e.g., a shielding mesh with a window surrounded by a power ring, or a window with a parser set of shielding wires) is selected to make more routing area available in locally congested areas. In other embodiments, the shielding mesh is used to create or add bypass capacitance. Other embodiments are also disclosed.

13 Claims, 40 Drawing Sheets

U.S. PATENT DOCUMENTS

| | | | |
|---|---|---|---|
| 6,180,998 B1 * | 1/2001 | Crafts | 257/659 |
| 6,218,631 B1 | 4/2001 | Hetzel et al. | |
| 6,278,148 B1 | 8/2001 | Watanabe et al. | |
| 6,348,722 B1 * | 2/2002 | Yoshikoshi | 257/508 |
| 6,353,189 B1 | 3/2002 | Shimada et al. | |
| 6,388,200 B2 | 5/2002 | Schaper | |
| 6,396,150 B2 | 5/2002 | Kohno | |
| 6,483,374 B1 | 11/2002 | Mizuno et al. | |
| 6,510,545 B1 | 1/2003 | Yee et al. | |
| 6,530,066 B1 | 3/2003 | Ito et al. | |
| 6,603,165 B2 | 8/2003 | Yamauchi et al. | |
| 6,622,294 B2 * | 9/2003 | Saxena et al. | 716/127 |
| 6,664,638 B2 * | 12/2003 | Ushiyama et al. | 257/773 |
| 6,734,472 B2 | 5/2004 | Ho | |
| 7,166,352 B2 | 1/2007 | Watanabe et al. | |
| 7,217,887 B2 | 5/2007 | Ho | |
| 7,361,975 B2 | 4/2008 | Ushiyama et al. | |
| 7,436,008 B2 | 10/2008 | Ho | |
| 2001/0013422 A1 | 8/2001 | Schaper | |
| 2002/0076941 A1 | 6/2002 | Ushiyama et al. | |
| 2002/0101759 A1 | 8/2002 | Jasinski et al. | |
| 2003/0155642 A1 | 8/2003 | Davis et al. | |
| 2004/0178424 A1 | 9/2004 | Ho | |

FOREIGN PATENT DOCUMENTS

| | | |
|---|---|---|
| JP | 01-152642 | 6/1989 |
| JP | 02-051252 | 2/1990 |
| JP | 03-120743 | 5/1991 |
| JP | 06-291256 | 10/1994 |
| JP | 11-191611 | 7/1999 |
| JP | 2001-127162 | 5/2001 |
| JP | 2002-190573 | 7/2002 |
| TW | 462214 | 11/2001 |
| TW | I 285953 | 8/2007 |
| WO | WO 03/092070 A2 | 11/2003 |
| WO | WO 03/092070 A3 | 11/2003 |

OTHER PUBLICATIONS

PCT International Search Report for PCT International Application No. US02/24267, mailed May 10, 2004, (6 pages).

PCT International Preliminary Report on Patentability for PCT International Application No. US02/24267, mailed Apr. 27, 2006 (4 pages).

PCT Written Opinion for International Application No. US02/24267, mailed Jun. 23, 2005, (4 pages).

PCT Written Opinion for International Application No. US03/23559, mailed Apr. 30, 2008, (5 pages).

Magma Design Automation, Inc., "Deep-Submicron Signal Integrity", white paper, 2002, pp. 19 total.

Mezhiba, Audrey V. et al., "Scaling Trends of On-Chip Power Distribution Noise", SLIP'02, Apr. 6-7, 2002, San Diego, California, USA, pp. 47-53.

Nassif, Sani R. et al., "Technology Trends in Power-Grid-Induced Noise", SLIP'02, Apr. 6-7, 2002, San Diego, California, USA, pp. 55-59.

Shin, Seongkyun, et al., "Analytical Signal Integrity Verification Models for Inductance-Dominant Multi-Coupled VLSI Interconnects", SLIP'02, Apr. 6-7, 2002, San Diego, California, USA, pp. 61-68.

Khatri, S. et al., "A Novel VLSI Layout Fabric for Deep Sub-Micron Applications", in Proceedings of the Design Automation Conference, (New Orleans), Jun. 1999, pp. 6 total.

Khatri, Sunil P. et al., "Cross-Talk Immune VLSI Design using a Network of PLAs Embedded in a Regular Layout Fabric", IEEE/ACM International Conference on Computer Aided Design, ICCAD-2000, Nov. 5-9, 2000, San Jose, CA, USA, pp. 8 total.

Khatri, Sunil P. et al., "Cross-Talk Noise Immune VLSI Design Using Regular Layout Fabrics", Kluwer Academic Publishers: Boston, 2001 (front cover, pp. i-xix, 1-51, 95-112 and back and cover).

Yu et al., "Fast Placement-Dependent Full Chip Thermal Simulation", 2001, IEEE, pp. 249-252.

Hebrard et al., "Design Automation of Power Integrated Circuit in Edge Environment", 1992, IEEE, pp. 252-256.

Banerjee et al., "Analysis and Optimizaiton of Thermal Issues in High-Performance VLSI," ACM, 2001, pp. 230-237.

* cited by examiner

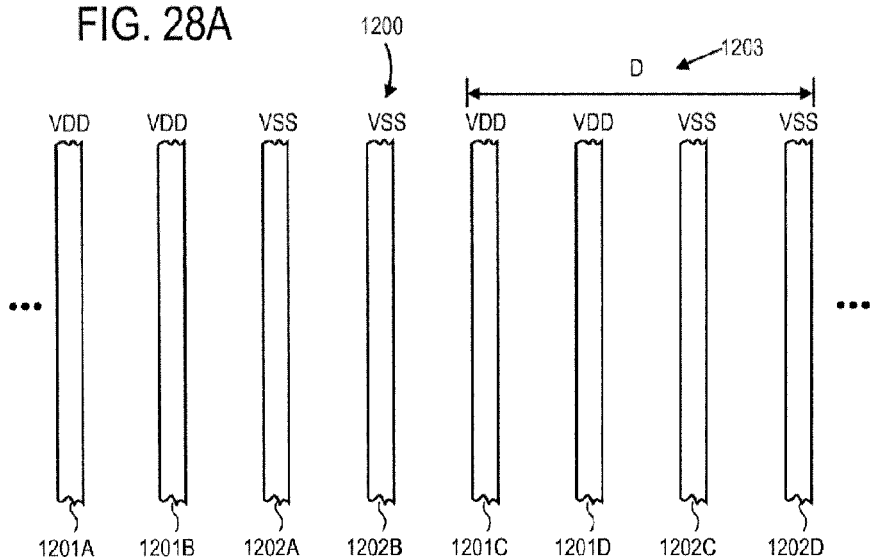
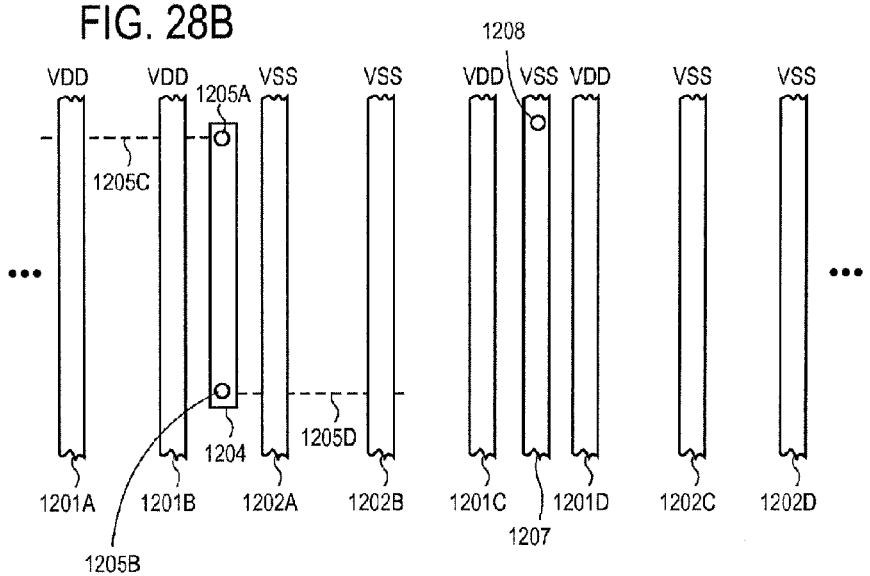

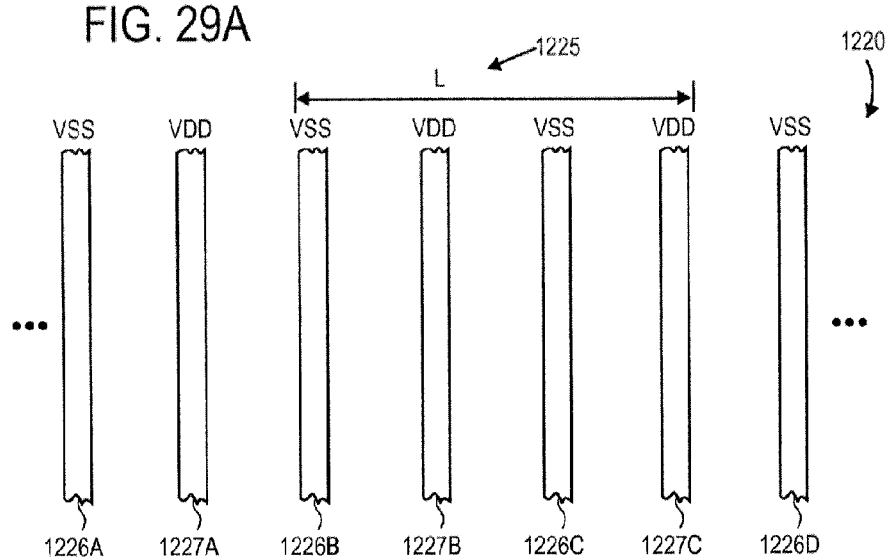
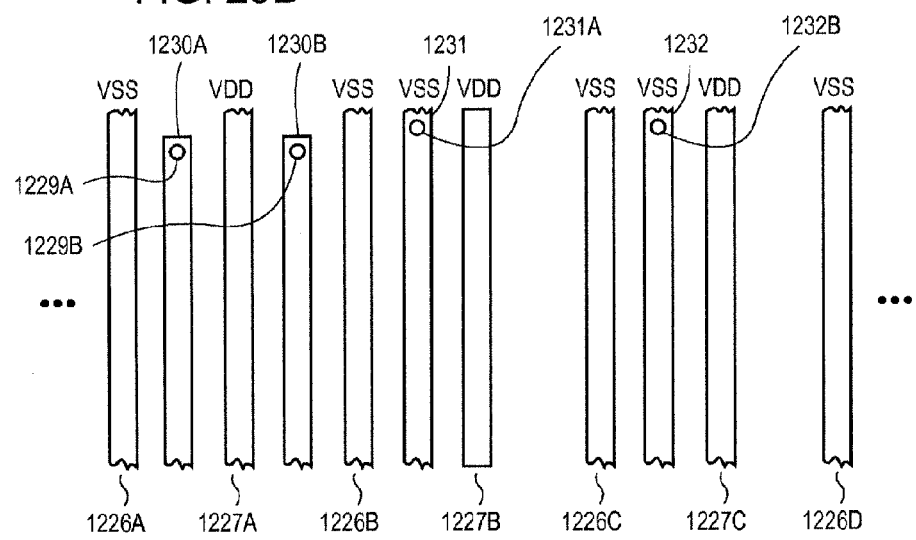

INTEGRATED CIRCUIT DEVICES AND METHODS AND APPARATUSES FOR DESIGNING INTEGRATED CIRCUIT DEVICES

This application is a divisional of U.S. patent application Ser. No. 11/305,425, filed Dec. 16, 2005, now U.S. Pat. No. 7,739,624 which is a continuation-in-part of U.S. patent application Ser. No. 10/626,031, filed Jul. 23, 2003, now U.S. Pat. No. 7,943,436 which is related to and claims the benefit of the filing date of U.S. provisional application Ser. No. 60/399,760, filed Jul. 29, 2002, and entitled "Method and Apparatus for Designing Integrated Circuit Devices with Shielding" by the inventor Kenneth S. McElvain.

FIELD OF THE INVENTION

The invention relates to designing integrated circuits, and more particularly to shielding wires from capacitive and inductive coupling.

BACKGROUND OF THE INVENTION

Integrated Circuits (ICs) are used in numerous applications, such as cellular phones, wristwatch cameras, and hand-held organizers, and others. As the commercial markets and consumer demands for smaller Integrated Circuits grow, IC size requirement trends continue towards a small form factor and lowered power consumption.

For the design of digital circuits on the scale of VLSI (very large scale integration) technology and beyond, designers often employ computer aided techniques. Standard languages such as Hardware Description Languages (HDLs) have been developed to describe digital circuits to aide in the design and simulation of complex digital circuits. Several hardware description languages, such as VHDL and Verilog, have evolved as industry standards. VHDL and Verilog are general purpose hardware description languages that allow definition of a hardware model at the gate level, the register transfer level (RTL) or the behavioral level using abstract data types. As device technology continues to advance, various product design tools have been developed to adapt HDLs for use with newer devices and design styles.

In designing an integrated circuit with an HDL code, the code is first written and then compiled by an HDL compiler. The HDL source code describes at some level the circuit elements, and the compiler produces an RTL netlist from this compilation. The RTL netlist is typically a technology independent netlist in that it is independent of the technology/architecture of a specific vendor's integrated circuit, such as field programmable gate arrays (FPGA) or an application-specific integrated circuit (ASIC). The RTL netlist corresponds to a schematic representation of circuit elements (as opposed to a behavioral representation). A mapping operation is then performed to convert from the technology independent RTL netlist to a technology specific netlist which can be used to create circuits in the vendor's technology/architecture. It is well known that FPGA vendors utilize different technology/architecture to implement logic circuits within their integrated circuits. Thus, the technology independent RTL netlist is mapped to create a netlist which is specific to a particular vendor's technology/architecture.

One operation, which is often desirable in this process, is to plan the layout of a particular integrated circuit and to control timing problems and to manage interconnections between regions of an integrated circuit. This is sometimes referred to as "floor planning." A typical floor planning operation divides the circuit area of an integrated circuit into regions, sometimes called "blocks," and then assigns logic to reside in a block. These regions may be rectangular or non-rectangular. This operation has two effects: the estimation error for the location of the logic is reduced from the size of the integrated circuit to the size of the block (which tends to reduce errors in timing estimates), and the placement and the routing typically runs faster because as it has been reduced from one very large problem into a series of simpler problems.

As the IC size shrinks, semiconductor manufacturers are forced to design circuits at a much smaller level than in the past. Previously, as the industry moved from Very Large Scale Integration (VLSI) to Ultra Large Scale Integration (ULSI), the relative capacitive and inductive coupling of the circuit itself was not realized to be as critical of an issue.

However, when the semiconductor industry designs and implements circuitry based on the sub-micron level technology and beyond, where spacing between circuitry lines is less than 10-6 microns, the capacitive and inductive coupling of the signal lines within the circuitry itself is realized to be a critical problem for designers. As circuit size becomes smaller and the lengths of signal lines become longer relative to the width of the lines, the problem of coupling and/or cross talk between signal lines and ground or power lines becomes more evident. Furthermore, as the signal line to ground (and/or other signal lines) coupling becomes stronger, the signal to noise ratio for a given signal decreases proportionally. This particular issue of capacitive and inductive coupling in signals is becoming increasingly difficult as the industry advances and moves towards reduction in circuit device size (for example, from 0.25 micron technology to 0.18 micron, 0.15 micron, 0.13 micron and beyond).

One approach to increase the signal to noise ratio (e.g., with respect to the noise caused by capacitive and inductive coupling from adjacent signal lines) is to strengthen the signal drive level. By increasing the signal strength, the signal to noise ratio for the signal is improved. Unfortunately, to increase the signal strength, the device must also be supplied with higher power, which is inconsistent with the requirement of reducing power consumption in ICs for heat issues, portability issues and environmental issues. In addition to the higher power consumption, increasing the signal strength does not eliminate signal coupling. The signal of increased strength may cause increased noise in the adjacent signal lines through capacitive and inductive coupling.

Another approach is to reduce the effective (R-L-C) impedance of the signal lines by increasing the spacing between signal lines, which is usually combined with the approach of strengthen the signal drive level, to reduce coupling and to improve signal to noise ratio. In general, when the spacing between the signal lines is increased by three-fold, the coupling effect is reduced by fifty percent. However, increasing the spacing is inconsistent with the requirement for circuit compactness.

Another approach is to insert buffers/repeaters to keep the wires short, reducing resistance and coupling capacitance. This approach works for a moderate number of signals, where an excessive number of buffers/repeaters are not required.

Another approach is to shield the signal lines by using either a supply voltage (e.g., VDD) or ground. The shielding line (ground) is wide enough to have low impedance so that the shielding line itself does not transfer the noise to other signal lines. FIG. 2 shows a top view of shielding lines and signal lines. A signal line (e.g., line 201 or 205) is routed along with a shielding line (e.g., line 203 or 207), which is connected to a supplied voltage or ground to shield the noise from a neighbor signal line. For sub-micron technologies, the lengths of these signal lines and shielding lines can be relatively long with respect to their width. When the path is long, the shielding wires become resistive; and, coupling can take place across the shielding wires to the next neighbor, which tends to reduce the signal to noise ratio or increase cross talk within the circuit on a given substrate.

The above approaches have a lower area and performance cost, but require expensive analyses, which are often questionable, to show that the signal integrity of the wires in the IC is preserved.

SUMMARY OF THE DESCRIPTION

Methods and apparatuses to design an Integrated Circuit (IC) with a shielding of wires of at least two different voltages are described here. In one aspect of the invention, an exemplary method for designing an integrated circuit includes determining at least one temperature of an integrated circuit and inserting, in response to the determining, a representation of a shielding mesh into at least one layer of the integrated circuit. In one implementation of this method, a plurality of temperatures may be determined at a plurality of different locations on the integrated circuit. This plurality of temperatures represents a temperature profile, and the shielding mesh is capable of reducing a variation of temperatures in the temperature profile.

In another aspect of the invention, an exemplary method for designing an integrated circuit includes introducing at least one shielding mesh into a representation of a design of the integrated circuit and routing representations of signal lines in the shielding mesh prior to an optimization which determines whether signal lines should be shielded.

In another aspect of the invention, an exemplary method for designing an integrated circuit includes creating a representation of a shielding mesh and a representation of a design of the integrated circuit, wherein the shielding mesh comprises a first single layer shielding mesh and a first double layer shielding mesh which is coupled to the first single layer shielding mesh, and the method also includes creating a representation of a second shielding mesh having at least a first layer and having a first set of lines which are diagonally oriented relative to a second set of lines in the first single layer shielding mesh and are diagonally oriented relative to a third set of lines in the first double layer shielding mesh.

In another aspect of the invention, an exemplary method for designing an integrated circuit includes creating a representation of a shielding mesh in a representation of a design of the integrated circuit, wherein the shielding mesh includes a first single layer shielding mesh and a first double layer shielding mesh which is coupled to the first single layer shielding mesh, and creating a representation of an interconnection device coupled between a first line in one of the layers of the first double layer shielding mesh and a further line which is routed through the first double layer shielding mesh.

In another aspect of the invention, an exemplary method for designing an integrated circuit includes generating a representation of a shielding mesh in at least one layer of a representation of a design of the integrated circuit, wherein the shielding mesh has a first plurality of lines which are designed to provide a first reference voltage and has a second plurality of lines which are designed to provide a second reference voltage, and wherein the shielding mesh also includes a window in which signal lines are routed with less shielding than signal lines which are routed in the shielding mesh. The method further includes generating a representation of power supply lines in at least a further layer of the representation of the integrated circuit, wherein the further layer is different than the at least one layer which contains the shielding mesh, and the power supply lines are coupled to the shielding mesh and are larger in width than the first plurality of lines and the second plurality of lines.

In another aspect of the invention, an exemplary method for designing an integrated circuit includes creating a representation of a shielding mesh in a representation of a design of the integrated circuit, wherein the shielding mesh includes at least one layer having a first plurality of lines which are designed to provide a first reference voltage, and the first layer has a second plurality of lines, which are designed to provide a second reference voltage, and wherein at least one of the first plurality of lines or the second plurality of lines has an opening, and the method further includes creating a representation of a signal line disposed in the shielding mesh, wherein the signal line has an enlarged portion adjacent to the opening and has at least two connection vias which electrically couple the signal line to a conductor on another layer.

In another aspect of the invention, an exemplary method includes searching for at least one first signal line in a shielding mesh of a representation of the integrated circuit which does not require shielding, and determining that at least one second signal line should be shielded in the shielding mesh and placing the at least one second signal line into the shielding mesh and removing the at least one first signal line from the shielding mesh.

In one aspect of the invention, an exemplary method for designing an integrated circuit (IC) includes determining a desired amount of decoupling capacitance in a representation of a design of the IC, routing signal lines in at least one layer of a shielding mesh of the representation (the routing taking into account the desired amount of decoupling capacitance to provide a preserved space in the shielding mesh for decoupling lines), and routing capacitive decoupling lines in the shielding mesh, thereby using the preserved space.

In another aspect of the invention, an exemplary IC includes at least one layer in the IC which includes a shielding mesh that has a first plurality of lines designed to provide a first reference voltage (e.g. VSS) and a second plurality of lines designed to provide a second reference voltage (e.g. VDD) and a plurality of signal lines routed through the shielding mesh, wherein each of the signal lines is disposed adjacent to at least one of the first plurality or the second plurality of lines and wherein at least one of the first plurality of lines and at least one of the second plurality of lines are adjacent to each other, without a signal line intervening, to provide a capacitive coupling between them.

In another aspect of the invention, an exemplary method for designing an IC includes creating a representation of at least one layer of said IC, the at least one layer having a repeating pattern of at least two adjacent first plurality of lines (designed to provide a first reference voltage, such as, e.g., VSS) and at least two adjacent second plurality of lines (designed to provide a second reference voltage, such as, e.g., VDD) and includes creating a representation of at least one signal line disposed adjacent to at least one of the first or the second plurality of lines. This method may further include creating a representation of at least one additional line designed to carry said first reference voltage and routed between an adjacent pair of lines of the second plurality of lines, wherein this additional line creates a decoupling capacitor between itself and the adjacent pair of lines.

In another aspect of the present invention, a method to design an Integrated Circuit (IC) device includes: determining a shielding mesh in a substrate, which includes a first plurality of connected wires for a first reference voltage and a second plurality of connected wires for a second reference voltage; and routing a first portion of a first plurality of signal wires in the substrate to shield the first portion of each of the first plurality of the signal wires between one of the first plurality of connected wires and one of the second plurality of connected wires from adjacent signal wires. A second portion of the first plurality of signal wires are adjacent to each other in a region defined by the first and second pluralities of connected wires. This region may be a window. In one example, the wires of the shielding mesh are interconnected such that an average length of segments of the first and second pluralities of connected wires between nodes each of which joins more than two wires in the shielding mesh is substantially less than an average length of the first plurality of signal wires. In one example, the first plurality of connected wires and the second plurality of connected wires are in two layers in the substrate; a first plurality of vias connect the first plurality of wires; a second plurality of vias connect the second plurality of wires; and the first and second pluralities of vias divide the first and second pluralities of connected wires into segments that are substantially shorter than an average length of the first plurality of signal wires. In one example, the first reference voltage is power; the second reference voltage is ground; and the shielding mesh is used both to distribute power and to shield signal lines from capacitive and inductive coupling.

In one embodiment of the present invention, the shielding mesh contains a window defined by a subset of the first and second pluralities of connected wires in a top view of the IC; a third plurality of signal wires are routed within the window without shielding. Each of the third plurality of signal wires are adjacent to at least one of the third plurality of signal wires without shielding in between. In one example, each of the subset of wires is substantially wider than the third plurality of signal wires so that the subset of wires form a power ring that reduces the impedance in the shielding mesh caused by the window in shielding mesh. The window may be created as a result of a congestion analysis which indicates a need for routing resources.

In one embodiment of the present invention, a second plurality of signal wires are routed in the substrate to shield each of the second plurality of signal wires between two of the first plurality of connected wires from adjacent signal wires. The second plurality of signal wires are less subjected to signal integrity problems than the first plurality of signal wires if routed without shielding; and the critical signal lines are routed between shielding wires of different voltages. In one example, the shielding mesh has tracks for routing signal lines between parallel shielding wires of the same voltage; these tracks can be used to widen the shielding wires to increase the current carrying capacity of the shielding wires, if they are not used for signal lines. In one example, at least two of adjacent ones of the first plurality of connected wires are combined into one wider wire; in another example, an area between two of the first plurality of connected wires is filled in to generate one wider wire. Thus, some shielding wires are wider than other shielding wires. For example, one shielding wire is wider than the combined width of one of the first and second pluralities of connected wires and one of the first plurality of signal wires. Alternatively, rather than widening an existing wire, an additional reference voltage line may be added. This additional reference voltage line may be the same or different voltage as the surrounding wires.

In one example, a third plurality of signal wires are routed in a first layer in the substrate between first two wires of the first and second pluralities of connected wires; the first two wires are substantially wider than the third plurality of signal wires; the third plurality of signal wires are substantially parallel to each other; and each of the third plurality of signal wires is adjacent to at least one of the third plurality of signal wires without shielding in between. Thus, the first two wires define a first window in the shielding mesh within which at least some signal lines are not shielded in the first layer. Further, a fourth plurality of signal wires are routed in a second layer in the substrate with second two wires of the second and second pluralities of connected wires; the second two wires are substantially wider than the fourth plurality of signal wires; the fourth plurality of signal wires are substantially parallel to each other; and each of the fourth plurality of signal wires is adjacent to at least one of the fourth plurality of signal wires without shielding in between. Thus, the second two wires define a second window within which at least some signal lines are not shielded in the second layer. In one example, the first and second windows substantially coincide with each other in a top view of the IC. In another example, there is only one window for unshielded signal wires in one of the layers. In one example, an allowable unshielded length of a signal line that can be unshielded by the shielding mesh is determined; and the signal line is routed with a portion of the signal line unshielded by the shielding mesh shorter than the allowable unshielded length.

In one embodiment of the present invention, the first and second pluralities of connected wires of the shielding mesh are routed within a region defined by an IP block, which is described below, in a top view of the IC. Some of the first plurality of signal wires are a part of the IP block; and some of the first plurality of signal wires are not a part of the IP block. In one example, at least one of the first plurality of signal wires that is not a part of the IP block is within a region defined by the IP block in a top view of the IC. In one example, at least one of the first plurality of signal wires that is a part of the IP block is re-routed in the shielding mesh.

The present invention includes apparatuses which perform these methods, including data processing systems which perform these methods and computer readable media which when executed on data processing systems cause the systems to perform these methods. The present invention also includes IC devices designed according to these methods or having the features described herein.

Other features of the present invention will be apparent from the accompanying drawings and from the detailed description which follow.

BRIEF DESCRIPTION OF THE DRAWINGS

The present invention is illustrated by way of example and not limitation in the figures of the accompanying drawings in which like references indicate similar elements.

FIG. 28A shows a top view of a shielding mesh of another exemplary embodiment of the invention.

FIG. 28B shows a top view of the shielding mesh of FIG. 28A after a signal line is routed in the mesh and after an additional voltage reference line, for decoupling capacitance, has been routed in the mesh.

FIG. 29A shows a top view of another shielding mesh.

FIG. 29B shows a top view of the shielding mesh of FIG. 29A after signal lines have been routed in the mesh and after additional voltage reference lines, for decoupling capacitance, have been routed in the mesh.

DETAILED DESCRIPTION

The following description and drawings are illustrative of the invention and are not to be construed as limiting the invention. Numerous specific details are described to provide a thorough understanding of the present invention. However, in certain instances, well known or conventional details are not described in order to avoid obscuring the description of the present invention.

Many of the methods of the present invention may be performed with a digital processing system, such as a conventional, general purpose computer system. Special purpose computers which are designed or programmed to perform only one function may also be used.

Figure 1:
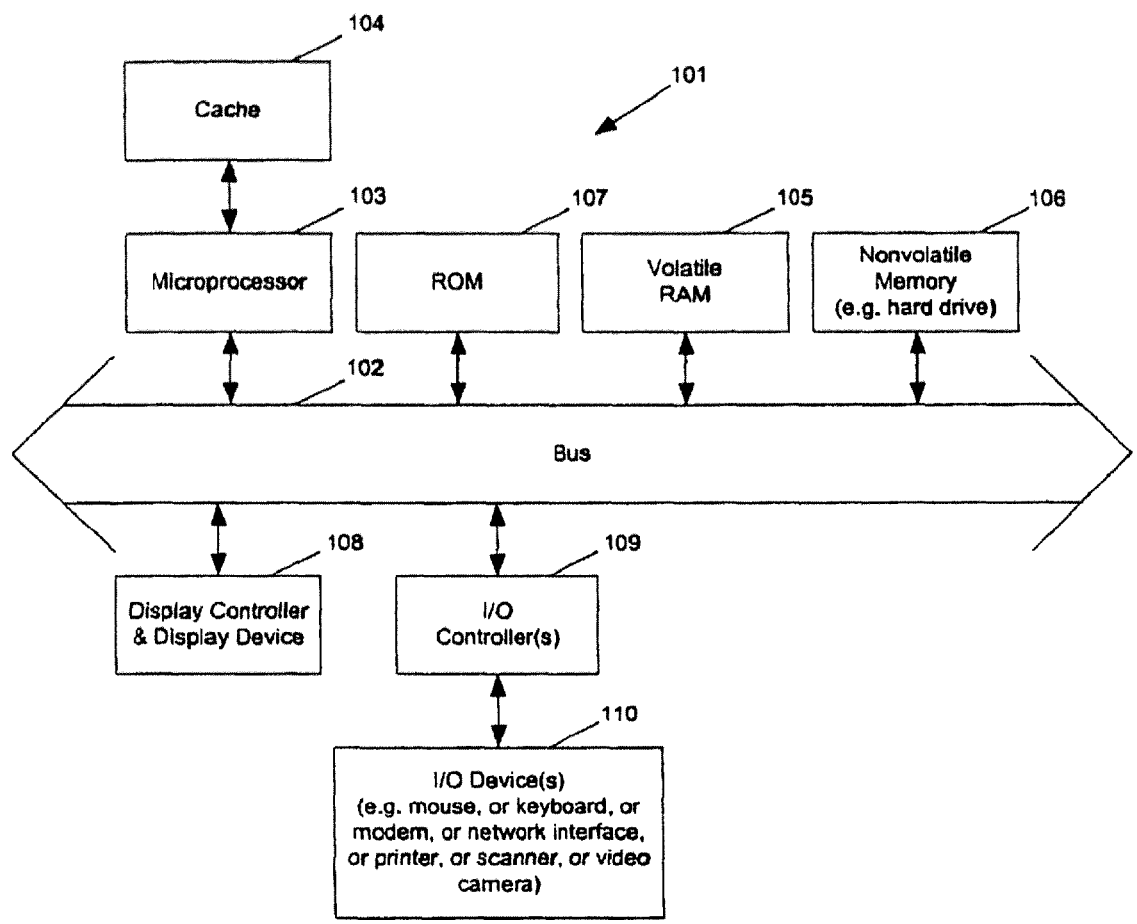
FIG. 1 shows a block diagram example of a data processing system which may be used with the present invention.
Figure 2:
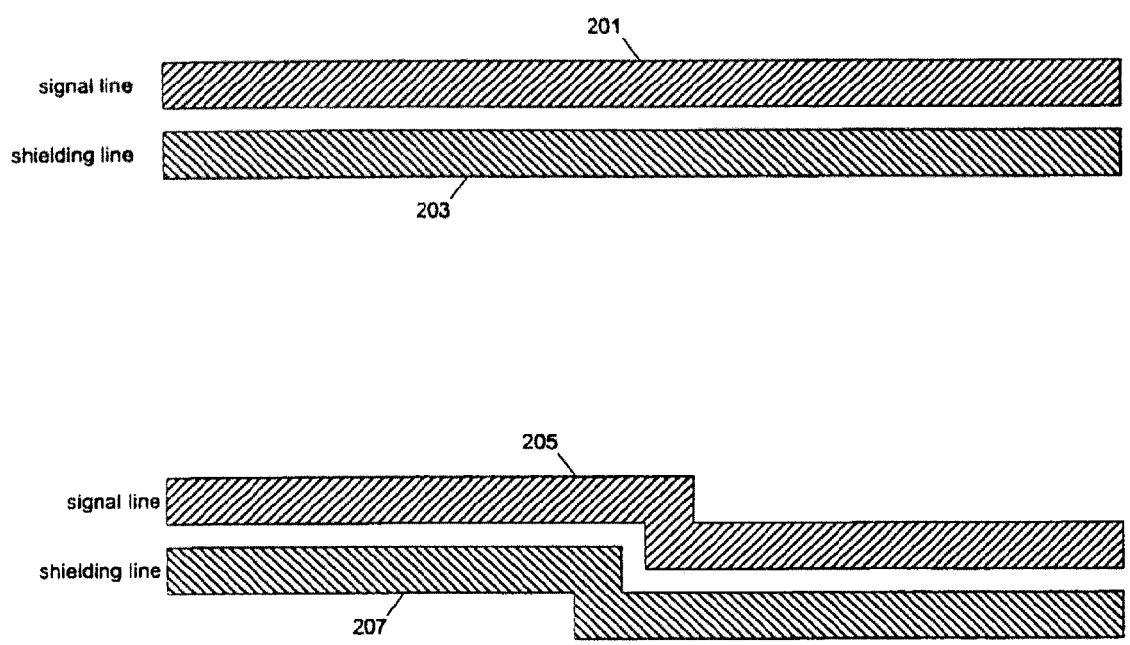
FIG. 2 shows a top view of shielding lines and signal lines.

FIG. 1 shows one example of a typical computer system which may be used with the present invention. Note that while FIG. 1 illustrates various components of a computer system, it is not intended to represent any particular architecture or manner of interconnecting the components as such details are not germane to the present invention. It will also be appreciated that network computers and other data processing systems which have fewer components or perhaps more components may also be used with the present invention. The computer system of FIG. 1 may, for example, be an Apple Macintosh computer or a computer system which runs a Windows or UNIX operating system.

As shown in FIG. 1, the computer system 101, which is a form of a data processing system, includes a bus 102 which is coupled to a microprocessor 103 and a ROM 107 and volatile RAM 105 and a non-volatile memory 106. The microprocessor 103, which may be a G3 or G4 microprocessor from Motorola, Inc. or IBM is coupled to cache memory 104 as shown in the example of FIG. 1. The bus 102 interconnects these various components together and also interconnects these components 103, 107, 105, and 106 to a display controller and display device 108 and to peripheral devices such as input/output (I/O) devices which may be mice, keyboards, modems, network interfaces, printers, scanners, video cameras and other devices which are well known in the art. Typically, the input/output devices 110 are coupled to the system through input/output controllers 109. The volatile RAM 105 is typically implemented as dynamic RAM (DRAM) which requires power continually in order to refresh or maintain the data in the memory. The non-volatile memory 106 is typically a magnetic hard drive or a magnetic optical drive or an optical drive or a DVD RAM or other type of memory systems which maintain data even after power is removed from the system. Typically, the non-volatile memory will also be a random access memory although this is not required. While FIG. 1 shows that the non-volatile memory is a local device coupled directly to the rest of the components in the data processing system, it will be appreciated that the present invention may utilize a non-volatile memory which is remote from the system, such as a network storage device which is coupled to the data processing system through a network interface such as a modem or Ethernet interface. The bus 102 may include one or more buses connected to each other through various bridges, controllers and/or adapters as is well known in the art. In one embodiment the I/O controller 109 includes a USB (Universal Serial Bus) adapter for controlling USB peripherals, and/or an IEEE-1394 bus adapter for controlling IEEE-1394 peripherals.

It will be apparent from this description that aspects of the present invention may be embodied, at least in part, in software. That is, the techniques may be carried out in a computer system or other data processing system in response to its processor, such as a microprocessor, executing sequences of instructions contained in a memory, such as ROM 107, volatile RAM 105, non-volatile memory 106, cache 104 or a remote storage device. In various embodiments, hardwired circuitry may be used in combination with software instructions to implement the present invention. Thus, the techniques are not limited to any specific combination of hardware circuitry and software nor to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as the microprocessor 103.

A machine readable media can be used to store software and data which when executed by a data processing system causes the system to perform various methods of the present invention. This executable software and data may be stored in various places including for example ROM 107, volatile RAM 105, non-volatile memory 106 and/or cache 104 as shown in FIG. 1. Portions of this software and/or data may be stored in any one of these storage devices.

Thus, a machine readable media includes any mechanism that provides (i.e., stores and/or transmits) information in a form accessible by a machine (e.g., a computer, network device, personal digital assistant, manufacturing tool, any device with a set of one or more processors, etc.). For example, a machine readable media includes recordable/non-recordable media (e.g., read only memory (ROM); random access memory (RAM); magnetic disk storage media; optical storage media; flash memory devices; etc.), as well as electrical, optical, acoustical or other forms of propagated signals (e.g., carrier waves, infrared signals, digital signals, etc.); etc.

In at least one embodiment of the present invention, a shielding mesh of at least two reference voltages (e.g., power and ground) is used to reduce both capacitive coupling and inductive coupling in signal wires in IC chips. According to one embodiment of the present invention, a circuit device with a plurality of signal lines disposed within a substrate has a shielding mesh of wires connected to provide power to the circuitry of the substrate circuit and to shield signal lines from each other to reduce the effects of cross talk between nearby signal lines within the circuit device.

It is understood that in this application the width of a wire or line refers to the shorter dimension of the wire parallel to the layer for the wire; and the thickness of a wire refers to the dimension of the wire in a direction that is perpendicular to the layer.

Figure 3:
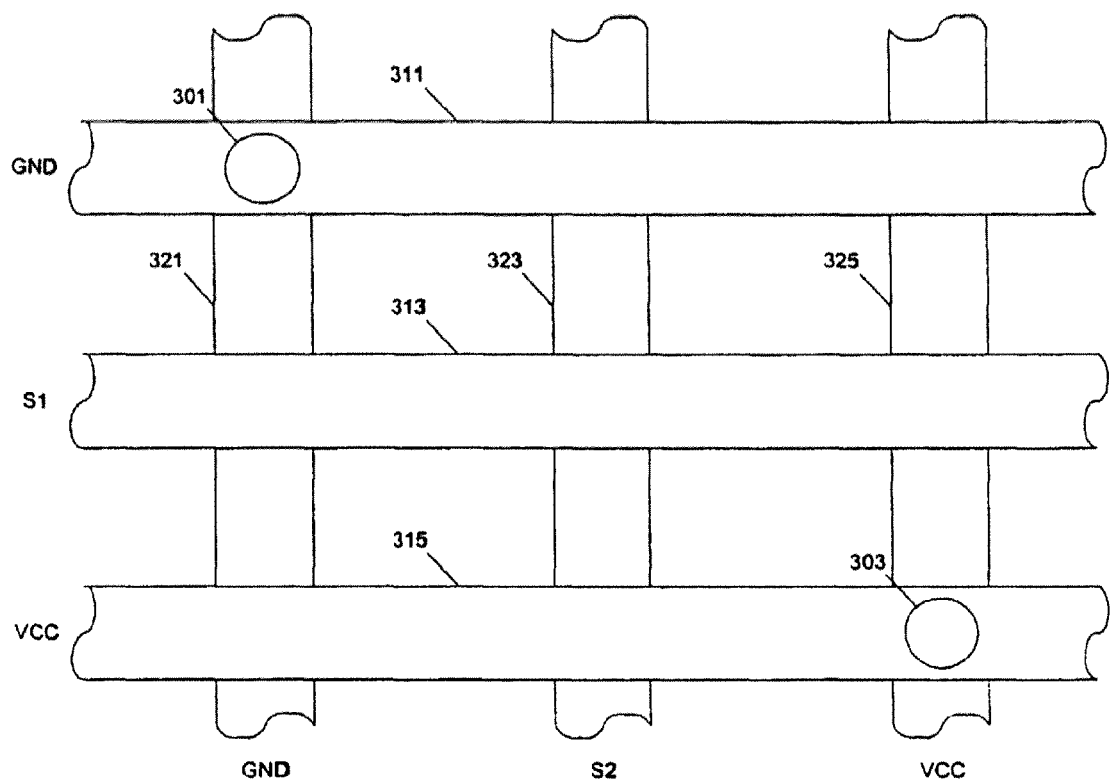
FIG. 3 shows a top view of signal lines shielded by a two-layer shielding mesh according to one embodiment of the present invention.
Figure 4:
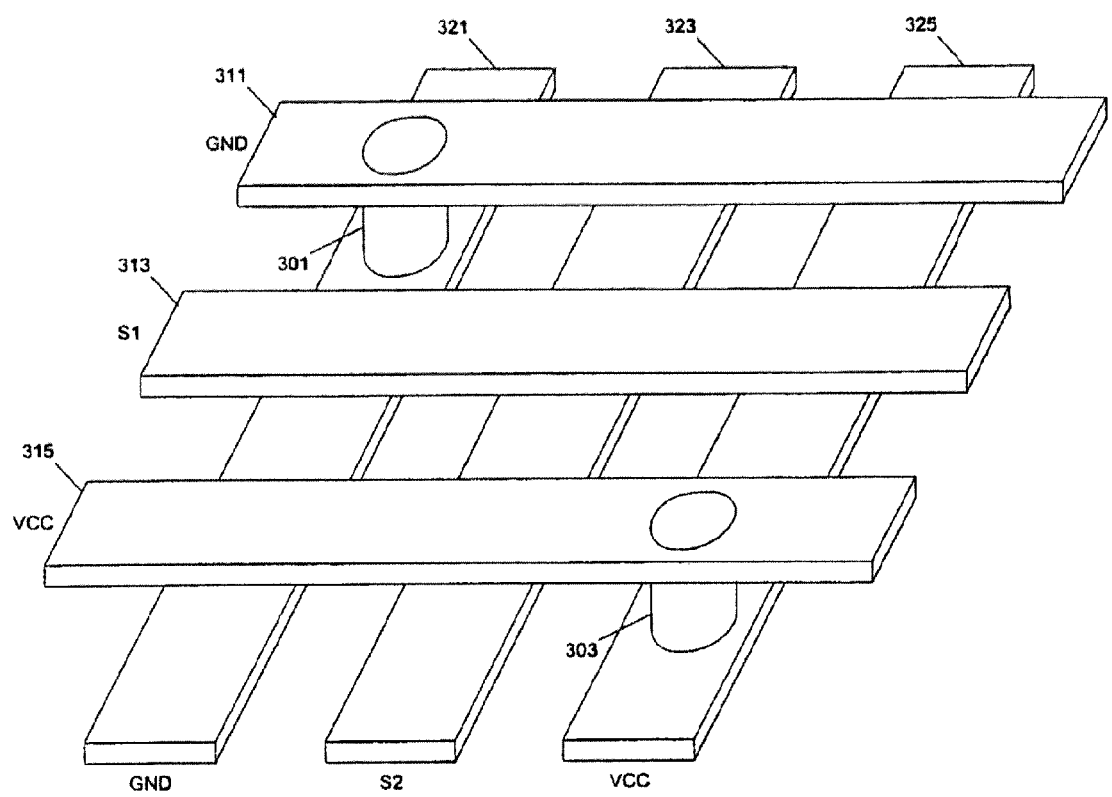
FIG. 4 shows a perspective view of signal lines shielded by a two-layer shielding mesh according to one embodiment of the present invention (the insulating layer between the two-layer shielding mesh is not shown).

FIG. 3 shows a top view of signal lines shielded by a two-layer shielding mesh according to one embodiment of the present invention; and, FIG. 4 shows a perspective view of the signal lines shielded by the two-layer shielding mesh.

According to this embodiment, a signal line is shielded on both sides by a shielding mesh connected to reference voltages GND (ground) and VCC (power). Lines 311-315 are on one layer of an IC; and lines 321-325 are on another layer of the IC. Lines 311 and 321, connected by via 301, provide shielding at voltage GND; and, lines 315 and 325, connected by via 303, provide shielding at voltage VCC. Signal line 313 is shielded at both sides by lines 311 and 315 of different voltages; and signal line 323 is shielded at both sides by lines 321 and 325. The lines in the two layers are running in an angle (e.g., 90 degrees, 45 degrees, or an acute angle or an angle other than 90 degrees) so that one shielding line in one layer can be connected to several shielding lines in another layer through vias. For example, vias 301 and 303 connects lines 321, 311 and lines 315 and 325 to form two interwoven meshes, each of which is a mesh of wires interconnected through vias and energized by one or more reference voltages (e.g., GND or VCC).

In accordance with one embodiment of the present invention the shielding mesh is included on an IC in addition to a power grid used to supply power and ground to the circuitry. According to another embodiment, for example in a 0.25 micron technology, the relative segment distance of the VDD and VSS lines may be reduced to as small as 0.94 micron. Reducing the segment lengths of shielding lines reduces their effective RC component and the coupling effects which are the sources of noises.

Due to close proximity of the shielding lines coupled with the fact that the shielding lines are of relatively short segments (e.g., due to connections at vias 311 and 303), the effective RC impedance, as well as the signal coupling between signal lines, is reduced. In one embodiment of the present invention, the width of the signal lines is the same as the width of the shielding lines; in other embodiments of the present invention, the widths of some of the shielding lines are different from that of the typical signal lines. The density of lines in a shielding mesh depend on the IC and the application and purpose of the mesh relative to the IC. In one case, the reference voltage lines (e.g. VSS and VDD) may be as dense as at least two reference voltage lines in a distance of less than 1 micron; in other words, a distance separating two adjacent reference voltage lines may be less than 1 micron and the density in an area may be higher than 10 lines in a 10 micron by 10 micron area. The density of all lines in the mesh in this case (including signal lines routed between reference voltage lines and any additional reference voltage lines which are added into the mesh for decoupling capacitance purposes) is even higher than 10 lines in a 10 micron by 10 micron area. The widths of these lines also depend on the IC and the application and purpose of the line. The signal lines may have a width as small as the currently available technology allows (e.g. smaller than 0.5 microns or smaller) and the width of the reference voltage lines may be as small.

In one embodiment of the present invention, a single layer shielding mesh has a plurality of shielding wires of different reference voltages for shielding a plurality of signal lines from each other.

Figure 5:
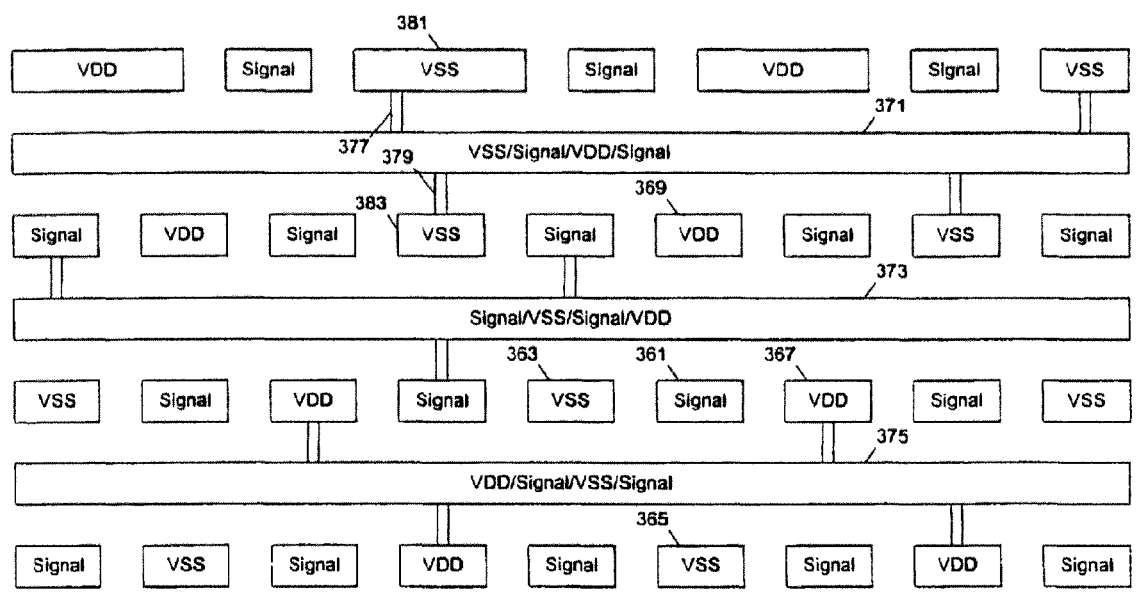
FIG. 5 shows a vertical cross-sectional view of signal lines shielded by a multi-layer shielding mesh according to one embodiment of the present invention.

FIG. 5 shows a vertical cross-sectional view of signal lines shielded by a multi-layer shielding mesh according to one embodiment of the present invention. Layers 371, 373 and 375 separate the layers on which lines 381, 383, 363 and 365 are located respectively. Within each layer, only one signal line is routed between two reference voltage lines. For example, signal line 361 is shielded on the layer by reference voltage lines 363 and 367, which are for reference voltages VSS and VDD respectively. Reference voltage lines may also shield a signal line across the layers. For example, reference voltage lines 369 and 365 may provide inter-layer shielding for signal line 361. The lines on layers 371, 373 and 375 at the cross-sectional cut can be for VSS, Signal and VDD (or, Signal/VDD/Signal, VSS/Signal/VDD and Signal/VSS/Signal) respectively so that a signal line on one layer is shielded by one or more lines of reference voltages in other layers. In one embodiment of the present invention, the signal lines and reference voltage lines in different layers are all aligned to form a grid structure (e.g., between layers 371 and 375) where lines in a first layer are parallel within the layer and extend in one direction (e.g. from left to right) and lines in another layer are parallel within the another layer but are perpendicularly arranged relative to the first layer; in other embodiments of the present invention, the signal lines and reference voltage lines for different layers are not all aligned to a grid structure (e.g., the layers above and below layer 371). The shielding lines are of the same width in one embodiment; the shielding lines can be of different widths in other embodiments, as illustrated by the cross sections of lines 381 and 383. Vias (e.g., vias 377, 379) are used to interconnect the wires on different layers, especially the wires of reference voltages to reduce the segment sizes of the shielding wires. In one embodiment of the present invention, the shielding lines of different voltages (e.g., VSS and VDD) are on alternating locations in the shielding mesh so that each signal line are shielded between two closest adjacent lines which are of different reference voltages and which are parallel to the signal line in a layer or across several layers).

In one embodiment of the present invention, vias of varying sizes are utilized in as close proximity as possible without dependency of grid size. Utilizing the close proximity of the vias, relative segment lengths of each signal shielded in the shielding mesh are reduced.

According to another embodiment of the present invention, the shielding mesh is utilized to provide a path for connecting an integrated circuit device to the main power grid. For example, line 383 taps into line 381 through vias 379 and 377; and, line 381 is in turn connected to the main power grid.

In some embodiments of the present invention, a type of shielding mesh is selected to make more routing area available in locally congested areas, or to increase the ability of the shielding mesh to deliver current with low voltage drop.

FIGS. 6-10 show examples of shielding meshes for shielding signal lines within a layer according to embodiments of the present invention. It is understood that the reference voltage lines (e.g., lines 401, 405, 411, 415) may have the same voltage, or have different voltages.

Figure 6:
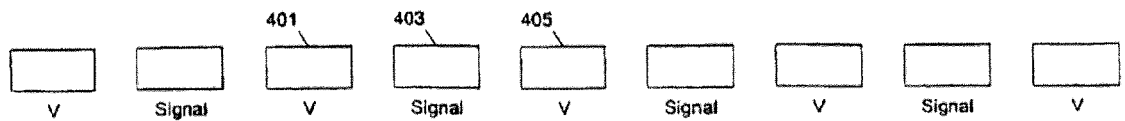
FIGS. 6-10 show examples of shielding meshes for shielding signal lines within a layer according to embodiments of the present invention.

In FIG. 6, each signal line (e.g., line 403) is shielded by two adjacent parallel reference voltage lines (e.g., lines 401 and 405). In one embodiment of the present invention, the two adjacent parallel reference voltage lines for each of the signal lines are of different voltages (e.g., VCC and GND) such that the signal lines are in the sequence of: . . . , VCC, Signal, GND, Signal, VCC, . . . ; in other embodiments of the present invention, the pairs of adjacent parallel reference voltage lines for some signal lines are of the same voltage (e.g., in the sequence of: . . . , VCC, Signal, VCC, . . . GND, Signal, GND, . . . ). The sequence or the pattern of the lines can be selected according to the congestion level in the area, the power distribution requirement, the noise level of the signal lines, and other parameters.

Figure 7:
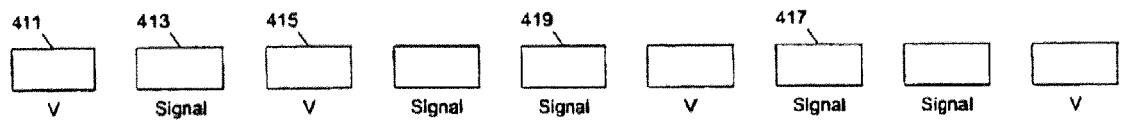

FIG. 7 shows a situation where some of the signal lines are only shielded from one side. Although signal line 413 is shielded from both sides by reference voltage lines 411 and 415, line 419 is shielded only at the right hand side; and line 417 is shielded only at the left hand side. For example, a sequence of VCC, Signal, GND, Signal, Signal, VCC, Signal, Signal, GND can be used for the example of FIG. 7; or a sequence of VCC, Signal, VCC, Signal, Signal, GND, Signal, Signal, GND can be used for the example of FIG. 7. Such a shielding mesh can be used for a relatively congested area, where a large portion of the area is used for routing signal wires. Signal lines that are not subjected to signal integrity problems can be routed next to each other within two shielding lines.

Figure 8:
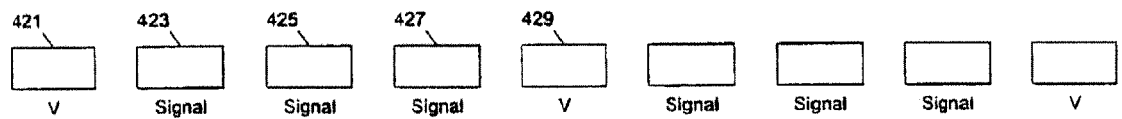

FIG. 8 shows a situation where some of the signals are only shielded from one side and some of the signal lines are not shielded. Although signal lines 423 and 427 are each shielded at the one side by reference voltage lines 421 and 429, signal line 425 is not shielded. Such a shielding mesh can be used for a congested area to provide more areas for routing signal wires. For example, a reference voltage line at the location of 425 is replaced with a signal line that does not cause signal integrity problems when routed between signal lines 423 and 427. This replacement of one reference voltage line, at a location such as location 425, with a signal line may be performed during automated placing and/or routing of components on an IC as part of the computer aided process of designing the IC and it may be performed as a result of detecting congestion in the computer aided routing process. In one scenario, signal line 425 has only a short segment running between signal lines 423 and 427 so that a large portion (in the length direction) of signal lines 423 and 427 are still shielded between adjacent reference voltage lines from both sides. In another scenario, when the timing of signal lines 423-427 are such that coupling between lines 423 and 425 and coupling between lines 425 and 427 do not cause a signal integrity problem, signal line 425 is used as a shielding line to reduce the coupling between lines 423 and 427. An example of such a timing scenario is one where lines 423 and 427 switch states at about the same time in a clock cycle and line 425 switches its state at a different time in the cycle.

Figure 9:
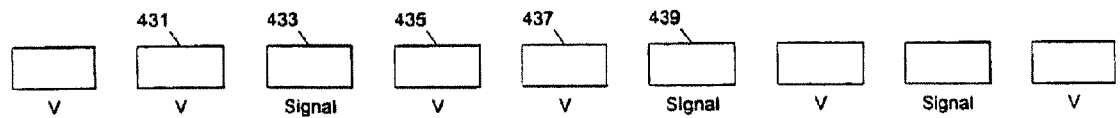

FIG. 9 shows a situation where more than two reference voltage lines are used to separate two signal lines. For example, reference voltage lines 435 and 437 separate signal lines 433 and 439. The extra voltage lines may be used to reduce the impedance of the reference lines, or to change a line sequence or a pattern of the voltage reference lines. Such a shielding mesh can be used in a non-congested region, where more areas can be used for distribution power. In one scenario, segments of some of the reference voltages lines are reconnected to route signal lines, especially short signal lines, which do not have strong coupling with neighbor signal lines.

Figure 10:
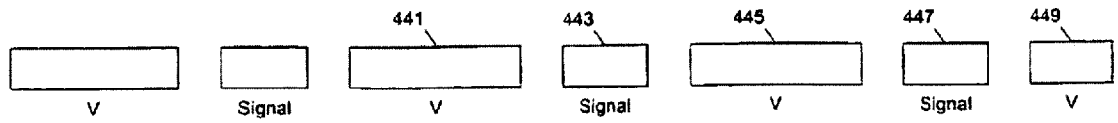

FIG. 10 shows a situation where the reference voltage lines are of different sizes. For example, wider lines 441 and 445 are used to shield line 443, which may be a strong source of noise; and narrower reference voltage line 449 is used to shield line 447. Lines 441 and 445 may be generated by combining one or more adjacent tracks (between the lines) that are not used for routing signal lines.

The shielding meshes as shown in FIGS. 6-10 can be interconnected through vias in different layers to form a multilayer shielding mesh, such as the mesh as shown in FIG. 5.

In one example of the present invention, the shielding mesh within one layer contains at least three parallel shielding wires for completely shielding two or more signal lines, each of which is deposited (e.g. routed) between two shielding wires and shielded from any neighbor signal line. In another example of the present invention, the shielding mesh within one layer contains more than five (or seven) parallel shielding wires. The shielding wires in the shielding mesh are energized by more than one reference voltages (e.g., GND and VCC, which are also used for distributing power in the IC). In one embodiment of the present invention, shielding meshes in more than one layer are interconnected so that the average length of the segments of the shielding wires between nodes each of which joins more than two wires in the shielding mesh is not very long (e.g., less than 10~15 times the average spacing between the signal lines within the mesh). In one embodiment of the present invention, the average length of the segments of the shielding wires between nodes each of which joins more than two wires is less than 3 times the average spacing between the signal lines within the mesh. In one embodiment of the present invention, the average length of the segments of the shielding wires between nodes each of which joints more than two wires is substantially less than the average length of the signal lines within the mesh.

Figure 11:
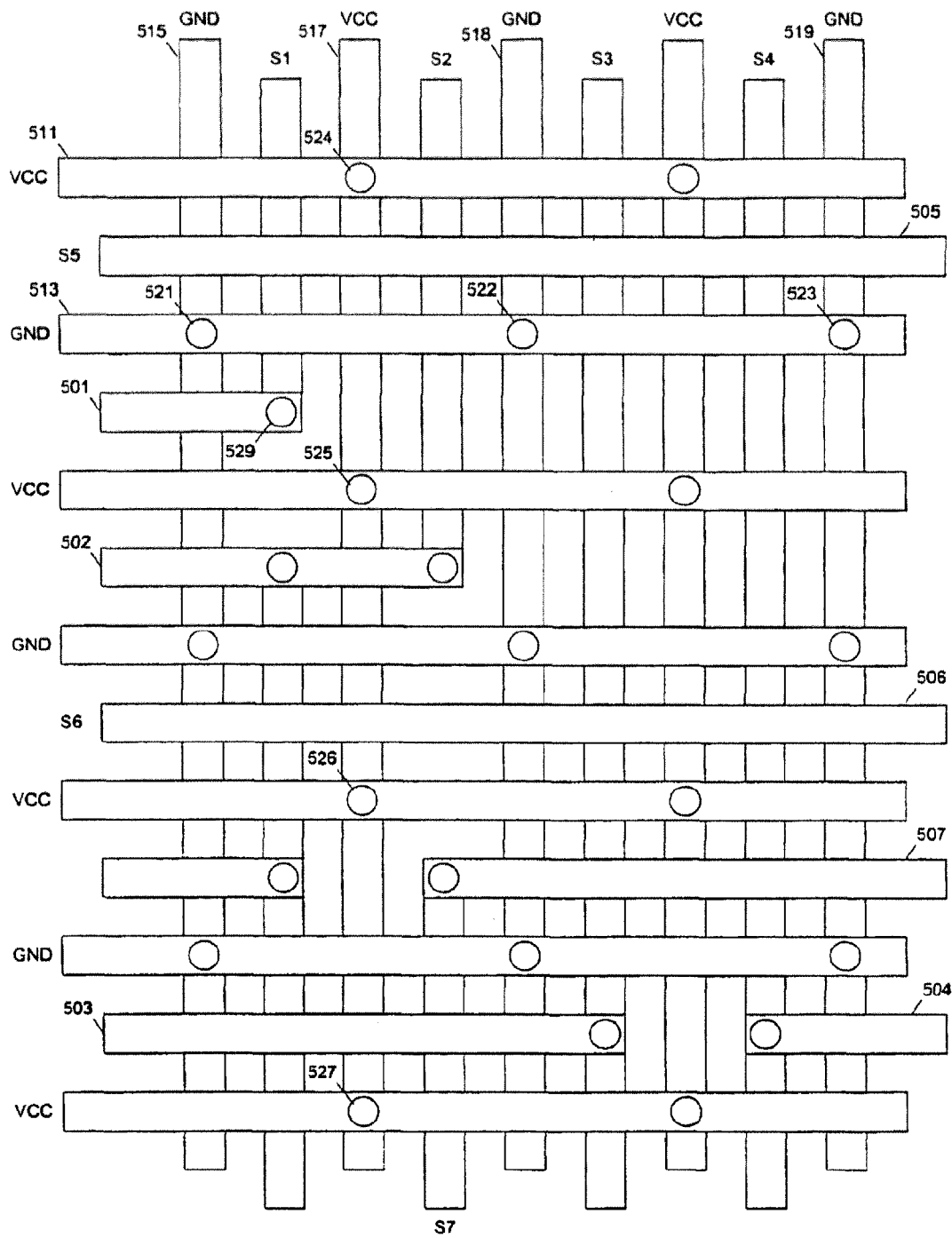
FIGS. 11-13 show detailed examples of signal lines shielded by two-layer shielding meshes according to embodiments of the present invention.
Figure 12:
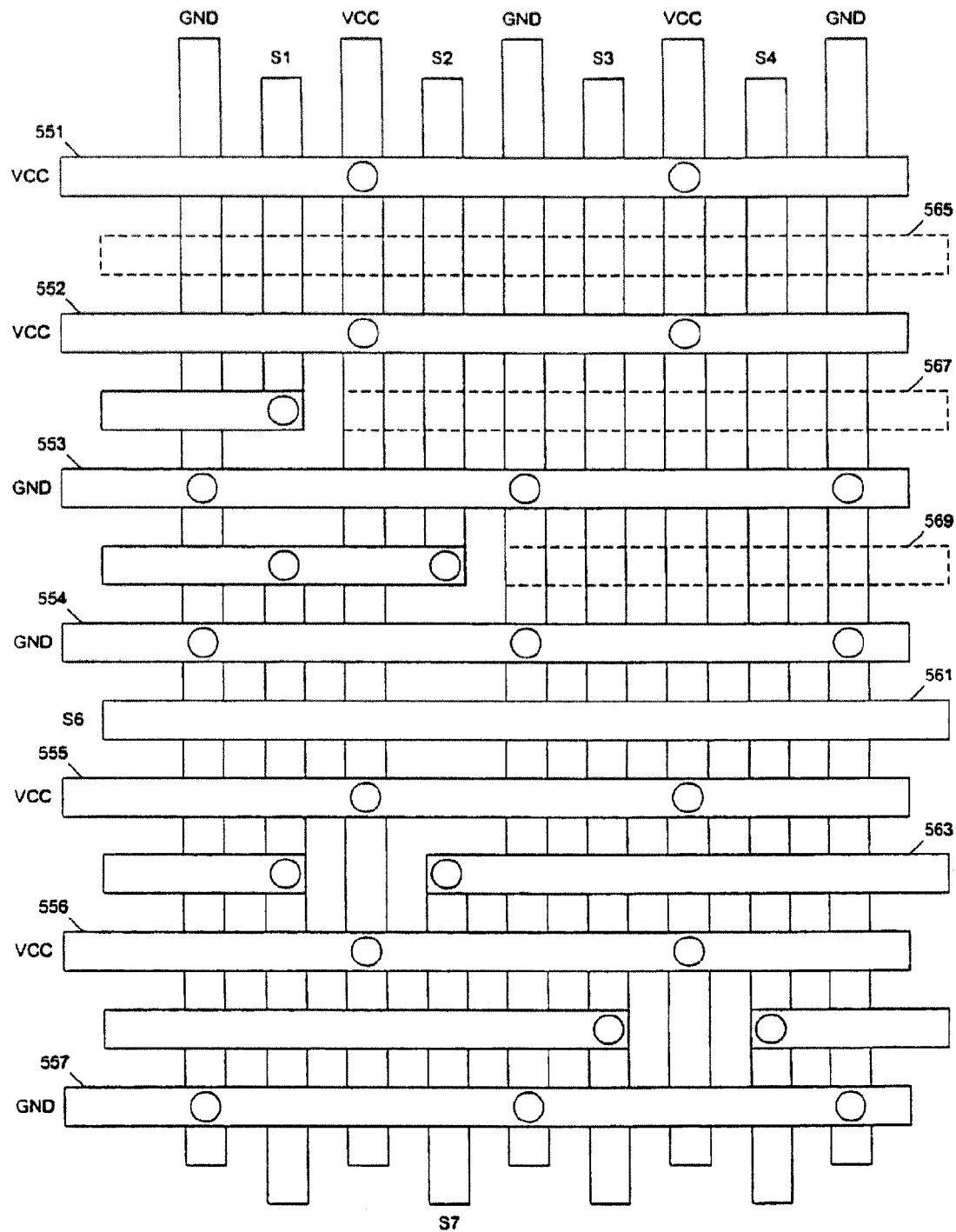
Figure 13:
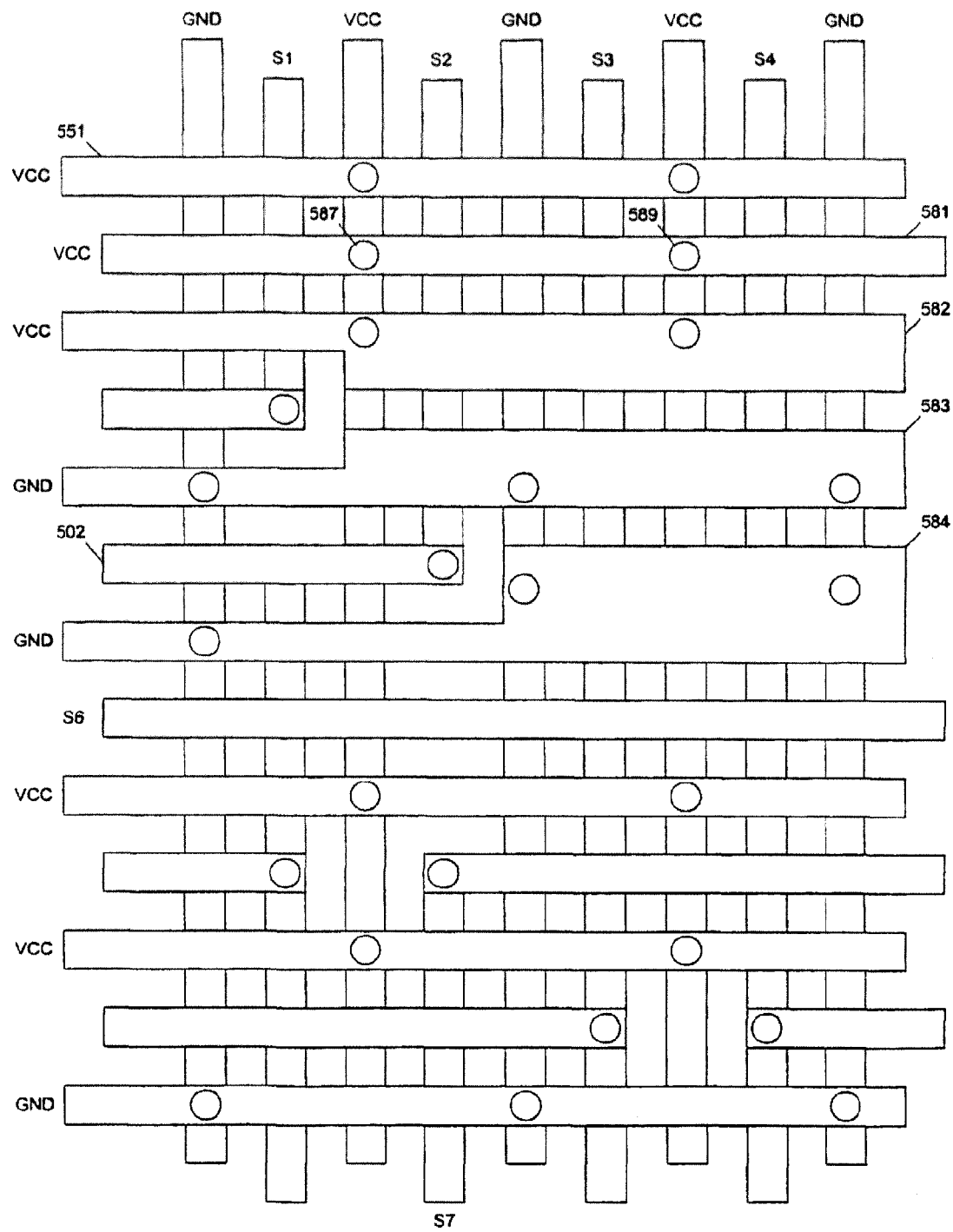

FIGS. 11-13 show detailed examples of signal lines shielded by two-layer shielding meshes according to embodiments of the present invention.

FIG. 11 is a top view of a shield mesh on two adjacent substrate layers. The insulating layer which separates these adjacent substrate layers is not shown. Segments of signal lines (e.g., 501-506 (S1-S6)) are shielded from each other between segments of reference voltage lines (e.g., 511, 513, 515, 517, and others). Vias 521, 522 and 523 connect GND line 513 in the upper layer to GND lines 515, 518 and 519 in the lower layer respectively so that GND line 513 is split into small segments. Similarly, vias 524-527 connect VCC line 517 in the lower layer to corresponding VCC lines in the upper layer (e.g., VCC line 511). Via 529 connects the segment of signal line 501 in the lower layer to the segment of signal line 501 in the upper layer. Each via for the shielding mesh provides a connection between layers and reduces the segment size of the shielding mesh to reduce the effective R-C value. In FIG. 11, a mesh of connected wires for voltage level VCC and a mesh of connected wires for voltage level GND are interwoven to form a shielding mesh, where each segment of the signal lines are shielded between two parallel adjacent reference lines of different voltages (e.g., GND and VCC) from segments of other closest signal lines.

In one embodiment of the present invention, the reference voltage lines in each of the layers are straight lines aligned to form a regular grid; in another embodiment, the reference voltage lines in each of the layers are neither straight nor aligned to form a regular grid. In one embodiment of the present invention, when the reference voltage lines and the signal lines are aligned to a grid, the reference voltage lines are on odd (or even) grid tracks; and the signal lines are routed on the even (or odd) grid tracks. In one embodiment of the present invention, when the reference voltage lines and the signal lines are aligned to a grid across multiple layers, the tracks are so assigned that there is no signal track directly on top of one another in parallel to avoid top bottom coupling. For example, if signals lines on layer N are on odd tracks, signals lines on layer N+2, which has the same routing direction as layer N, are routed on even tracks. This strategy causes the signal lines to be shielded by opposite power/ground not only on the left and right sides, but also on the top and bottom sides. Thus, the segment lengths are reduced; and the effective isolation between signal lines to reduce noise coupling is increased.

When the signal lines and shielding lines in a layer do not form a regular grid, the signal lines in one layer can be traced by shielding lines within the layer and in adjacent layers to provide top and bottom shielding.

In one embodiment of the present invention, the initial shielding mesh is designed (or selected) such that some shielding wires of the same reference voltage (e.g., VCC or GND) are placed next to each other. If a track between shielding wires of the same reference voltage is unused, the space between them can be filled in for conducting the reference voltage, which can dramatically improve the current carrying capacity of the shielding wire. Signal lines are routed between shielding wires of different voltages (e.g., a VCC/GND pair) to leave the tracks between pairs of shielding wires of a same reference voltages (e.g., a VCC/VCC pair, or a GND/GND pair) unused as much as possible. Signals less subjected to corruption can be routed between pairs of shielding wires of a same reference voltage. Different patterns of shielding wires, such as VCC, GND, VCC, GND, GND, VCC, GND, VCC, VCC, may be used for different tradeoff between shielding and current carrying capacity.

FIG. 12 is a top view of a shield mesh on two adjacent substrate layers where reference voltage lines 551-556 in the upper layer are in the sequence of VCC, VCC, GND, GND, VCC, VCC. Two reference voltage lines of the same voltage are placed near each other. A signal line routed between two reference voltage lines of different voltages are better shielded than a signal line routed between two reference voltage lines of the same voltage. Thus, critical signal lines (e.g., signal line 561) are first routed between reference voltage lines of different voltages (e.g., GND line 554 and VCC line 555); and other signal lines that are less sensitive to corruption through cross-talk, etc. (e.g., line 563) may be routed between two reference voltage lines of the same voltage (e.g., VCC lines 555 and 556). After all signal lines are routed, there may be tracks that are not used for routing signal lines. For example, tracks 565, 567 and 569 in FIG. 12 are not used for signal lines, which can be combined with the adjacent reference voltage lines to substantially widen (e.g., double the width) the corresponding reference voltage lines and to reduce their impedances. This combining of lines can be done automatically by computer aided design systems (e.g. systems which use IC routing software to design ICs). For example, track 569 shown in FIG. 12 can be merged with GND line 554 to form wider GND line 584 in FIG. 13; track 567 in FIG. 12 can be shared by VCC line 552 and GND line 553 to form wider VCC line 582 and wider GND line 583 to produce the result shown in FIG. 13; and track 565 in FIG. 12 is used as VCC line after vias 587 and 589 are inserted to connect line 581 to the VCC lines in the lower layer. It is understood that the unused tracks can also be combined with reference voltage lines in other forms. For example, voltage lines 551, 581 and 582 can all be combined into one wider line; and lines 584 and 583 may be combined so that the segment of signal line 502 in the upper layer is shielded by a U-shaped GND wire formed by the wire combined from lines 583 and 584.

When a track (or a portion of the track, e.g., 567 in FIG. 12) between two reference voltage lines of different voltages is not used for routing signal lines, the track can be used to widen the reference voltage lines (e.g., run a separate reference voltage line on the track, or combine the track with one of the reference voltage lines, or share the track by the reference voltage lines), as described above. Under some design rules which have spacing requirements that depend on wire width, it is desirable to run a separate reference voltage wire (e.g., VCC or GND) on the track. The separate reference voltage wire may be of a minimum width. Utilizing the open track between lines of different reference voltages (e.g., VCC and GND) for widening reference voltage lines has the advantage of introducing decoupling capacitance between the reference voltage lines. This approach is particularly useful, when 0.13 micron (and below) technology is used. The traditional way of adding decoupling capacitance is to fill available space with large transistors whose gates are used as capacitors. However, at 0.13 micron and below the leakage current across the gate becomes large, consuming too much power. Additionally, transistor based decoupling capacitance is resistive and is not good for suppressing high frequency noise. The decoupling capacitance introduced in the shielding grid is good for suppressing high frequency noise. Further, when a track (e.g., a portion of track) between two reference voltage lines of the same voltage (e.g., VCC) is not used for routing the signal lines, the track can be used for a line of the same voltage or a line of a different voltage. For example, track 565 between two VCC lines in FIG. 12 can be used for VCC or GND. When the track is used for a reference line of a different voltage (e.g., GND), additional decoupling capacitance is added; when the track is used for a reference line of the same voltage (e.g., VCC), the track can be combined with neighboring references lines (e.g., VCC lines 551 and 552) to further reduce the resistance of the combined reference line. This decoupling capacitance aspect is described further in conjunction with FIGS. 28A, 28B, 29A, 29B and 30.

FIG. 28A shows an example of a one layer shielding mesh which includes a repeating pattern of at least two adjacent first reference voltage lines (e.g. VDD) and at least two adjacent second reference voltage lines (e.g. VSS). The shielding mesh 1200 shown in FIG. 28A includes four VDD lines (1201A, 1201B, 1201C, and 1201D) and four VSS lines (1202A, 1202B, 1202C, and 1202D). The repeating pattern of two VDD and two VSS and two VDD . . . provides certain advantages which are described below. The shielding mesh 1200 may vary in size depending on the uses of the mesh. The density of the mesh may be very high such that the four lines 1201C, 1201D, 1202C and 1202D may be within a distance D (1203) which is less than 2 microns or smaller. In those instances when the shielding mesh 1200 is used to provide decoupling (e.g. bypass) capacitance, it is usually desirable to use a high density shielding mesh in order to obtain a desired level of decoupling capacitance between adjacent reference voltage lines. In other instances, the shielding mesh may have a lower density (e.g. D may be less than 20 microns or in some cases less than 50 microns). In the case of the shielding mesh 1200, it is used to shield at least one signal line 1204 and to provide at least one decoupling capacitance through an added reference voltage line 1207. This use of shielding mesh 1200 is shown in FIG. 28B. As shown in FIG. 28B, a signal line 1204 has been added to the shielding mesh between VDD reference voltage line 1201B and VSS reference voltage line 1202A. This signal line 1204 is shielded between these two reference voltage lines along its entire length on the layer containing the shielding mesh. It may or may not be shielded in the layers above or below. The signal line 1204 is coupled to lines (e.g. lines 1205C and 1205D) on other layers through connection vias 1205A and 1205B respectively. An additional reference voltage line 1207 has been added between VDD reference voltage lines 1201C and 1201D to provide a bypass or decoupling capacitance between VDD and VSS within the IC on the layer containing this shielding mesh. This additional reference voltage line 1207 provides about twice as much decoupling capacitance as compared to an additional VSS line between a VSS line and a VDD line (e.g. an additional VSS reference voltage line between VSS line 1202B and VDD line 1201C would provide only about one-half as much decoupling capacitance as the additional VSS line 1207 as shown in FIG. 28B). The repeating pattern of 2 VDD lines and 2 VSS lines provides this additional capacitance because an additional reference voltage line of a first polarity, which is designed to add decoupling capacitance, may be inserted between a pair of charged reference voltage lines of a second polarity. The additional reference voltage line 1207 may be coupled to another VSS line through the connection via 1208 (or through another via, not shown, somewhere along the length of line 1207). It will be understood that additional reference voltage lines may be added to increase the amount of decoupling capacitance provided by the shielding mesh, up to a desired amount of decoupling capacitance to be provided by the shielding mesh. Thus, for example, if more decoupling capacitance is desired even after line 1207 has been added, an additional reference voltage line may be added (e.g. an additional VDD line may be added between VSS lines 1202A and 1202B and an additional VSS line may be added between VDD lines 1201A and 1201B). The shielding mesh 1200 may be used exclusively for providing decoupling capacitance if no signal lines need to be shielded in a particular design.

FIGS. 29A and 29B show another example of a shielding mesh which includes shielding for signal lines and decoupling capacitance. The shielding mesh 1220 includes in a single layer of an IC a first plurality of lines 1226A, 1226B, 1226C, and 1226D which are designed to provide a first reference voltage (VSS in this case) and a second plurality of lines 1227A, 1227B, and 1227C which are designed to provide a second reference voltage (VDD in this case). The shielding mesh may have a high density which is useful when the mesh is also used to provide decoupling capacitance. The density may be defined by the number of lines (or portions of lines) within an area or the number of parallel lines intersecting a linear distance, such as the distance L (1225) in FIG. 29A. The distance L may have the same range as D (in FIG. 28A) over a variety of different designs. FIG. 29B shows the shielding mesh 1220 after two signal lines, 1230A and 1230B, and two additional reference voltage lines, 1231 and 1232, have been added to the shielding mesh as a result of a computer aided design process. Each of the signal lines 1230A and 1230B have been shielded between an adjacent pair of opposite reference voltage lines. For example, signal line 1230A is shielded between VSS line 1226A and VDD line 1227A. Connection vias 1229A and 1229B respectively provide electrical contact to an adjacent layer for signal lines 1230A and 1230B. The shielding mesh of FIG. 29B also includes two additional reference voltage lines 1231 and 1232 which are respectively coupled to an adjacent layer through connection vias 1231A and 1232B. The additional VSS reference voltage line 1231, in conjunction with VDD line 1227B, provides a decoupling capacitor. The additional VSS reference voltage line 1232 and the VDD line 1227C provide another decoupling capacitor. It will be appreciated that the remaining slots (between the original reference voltage lines of the mesh) may be used to add further additional reference voltage lines to increase the decoupling capacitance provided by the shielding mesh.

Figure 30:
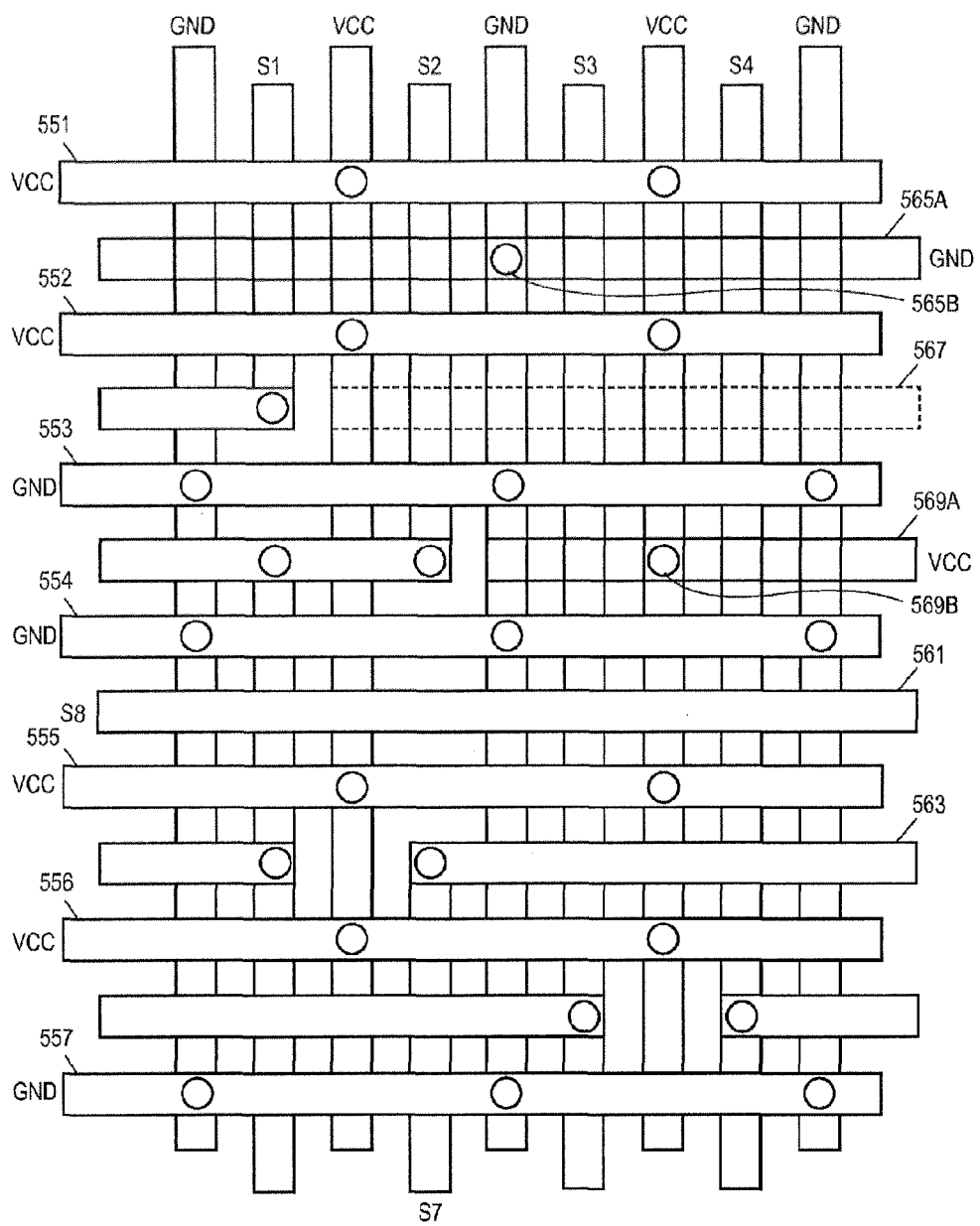
FIG. 30 shows a top view of a two layer shielding mesh (without showing an intervening insulating layer) which is similar to the shielding mesh of FIG. 12.

FIG. 30 shows another example of a shielding mesh. This shielding mesh is the same as the mesh of FIG. 12 except that a ground (GND) reference voltage line 565A has been added and a VCC reference voltage line 569A has been added to provide decoupling capacitance. The VCC line 569A is electrically coupled, through a connection via 569B, to another VCC line. The ground reference line 565A is electrically coupled, through a connection via 565B to another GND line.

Some embodiments of the present invention use a mesh of wires both to distribute power and to shield signals. In a typical IC, the wires for distributing power take a significant portion of routing resource. When the shielding wires are also used for distributing power, the area cost for shielding can be reduced significantly.

Figure 14:
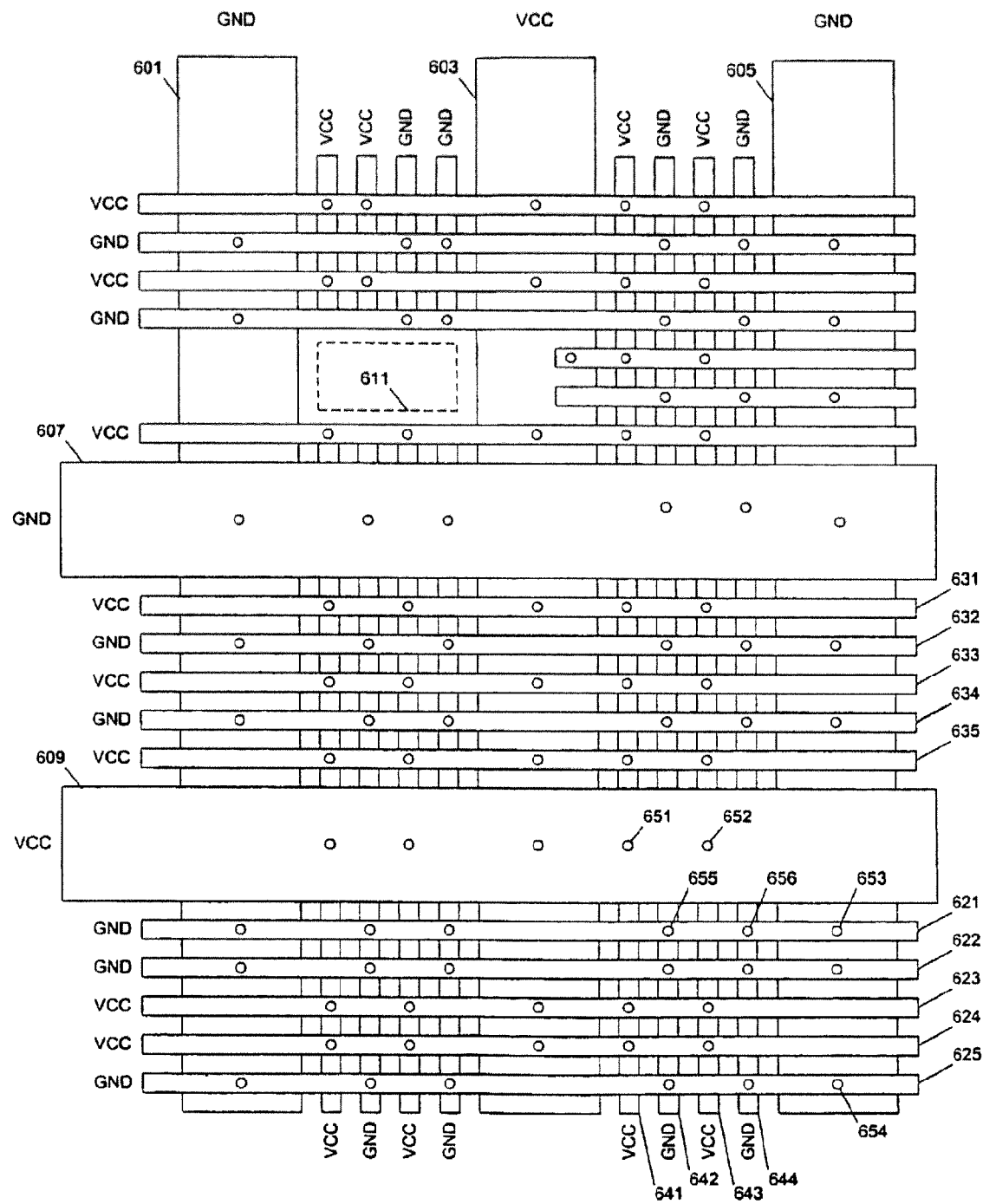
FIG. 14 shows a detailed example of a two-layer shielding meshes connected with a power grid according to one embodiment of the present invention.

FIG. 14 shows a detailed example of a two-layer shielding meshes connected with a power grid according to one embodiment of the present invention. The power grid has wider lines 601-605 and 607-609 to deliver power and ground to the IC circuit; and, the shielding meshes (e.g., a mesh formed by lines 621-625 and lines 641-644) has narrower reference voltage lines to shield signal lines (not shown in FIG. 14) routed in between the narrower reference voltage lines. The shielding lines (e.g., 641, 643, 621 and 625) tap into the power grid (e.g., through vias 651, 652, 653 and 654) to provide shielding and power; and other vias in the shielding mesh (e.g., vias 655 and 656) couple the lines in the mesh to one of the two reference voltages (e.g. VCC or ground). Due to the relatively small segment lengths between certain vias (e.g. vias 655 and 656), the shielding mesh functions to reduce the effective RC component of the lines being connected to, which in turn reduces the noise and coupling effect. The shielding mesh can be deployed on any substrate area where routing resources are used. The ratio in width between the power grid lines (e.g., line 605) and the shielding mesh lines can be a factor from 2 to 10, or more. In one embodiment of the present invention, a typical shielding wire is of the size (width and/or thickness) of a typical signal line.

In FIG. 14, it is seen that different regions may use different types of shielding meshes. For example, shielding wires 631-635 shield each of the tracks between an adjacent pair of the wires with different voltages (in other words a track for a signal wire between lines 631 and 632 is a track that shields the signal wire between two different reference voltages, VCC and GND); however, shielding wires 621-625 shield some tracks (e.g., between lines 621 and 622) between two of the wires with the same reference voltage.

A shielding mesh can be used in the routing channel between blocks on a substrate and also within a block of a substrate. Due to relatively small segment lengths of the shielding mesh, the shielding mesh reduces the effective RC component of the routing line and the noise and coupling effects caused by cross talk between signal lines.

In some congested regions, such as region 611 in FIG. 14, a window in the shielding mesh can be used to make room for routing signal lines in the window. In such windows, the signal lines are not shielded (or may be shielded at a lower shielding density than the shielding density outside of the window); and conventional methods can be used in the window to route signal lines to avoid signal integrity problems. Typically, the window in a layer of shielding mesh is used to route lines from other layers.

The shielding mesh near local congestion areas can be replaced with a window surrounded by a power ring. The area within the power ring, the window in the shielding mesh, may be completely unshielded and is taken into account for any wire routed through the window. The number of available tracks within the window is increased up to double the number of tracks available for routing signals. A sparser set of shielding wires, (e.g. a lower shielding density) such as those illustrated in FIGS. 7 and 8, can be used in the window. The creation of such windows in layers of shielding mesh can be done automatically by computer aided design systems, such as systems which use IC placement and routing software to design ICs.

For each wire routed through or in the window of the shielding mesh, it can be determined whether or not the coupling between adjacent signal lines may causes signal integrity problems. For example, an RLC model can be used to determine if the signal can be corrupted by coupling from other signal lines (or power/ground current, if the shielding lines are connected to the power/ground grid).

The congestion level (e.g. for routing signal lines) can be estimated by computer aided design systems in an early stage of routing or determined after an actual routing operation, which may be successful or not. Upon determining that the level of congestion has become unacceptable (e.g. the wiring density exceeds predetermined design rules), the computer aided design system can then introduce ("open") a representation of a window in a shielding mesh in order to route wires within the window. The computer aided design system can then route signal wires within the window in order to reduce the level of congestion.

Figure 15:
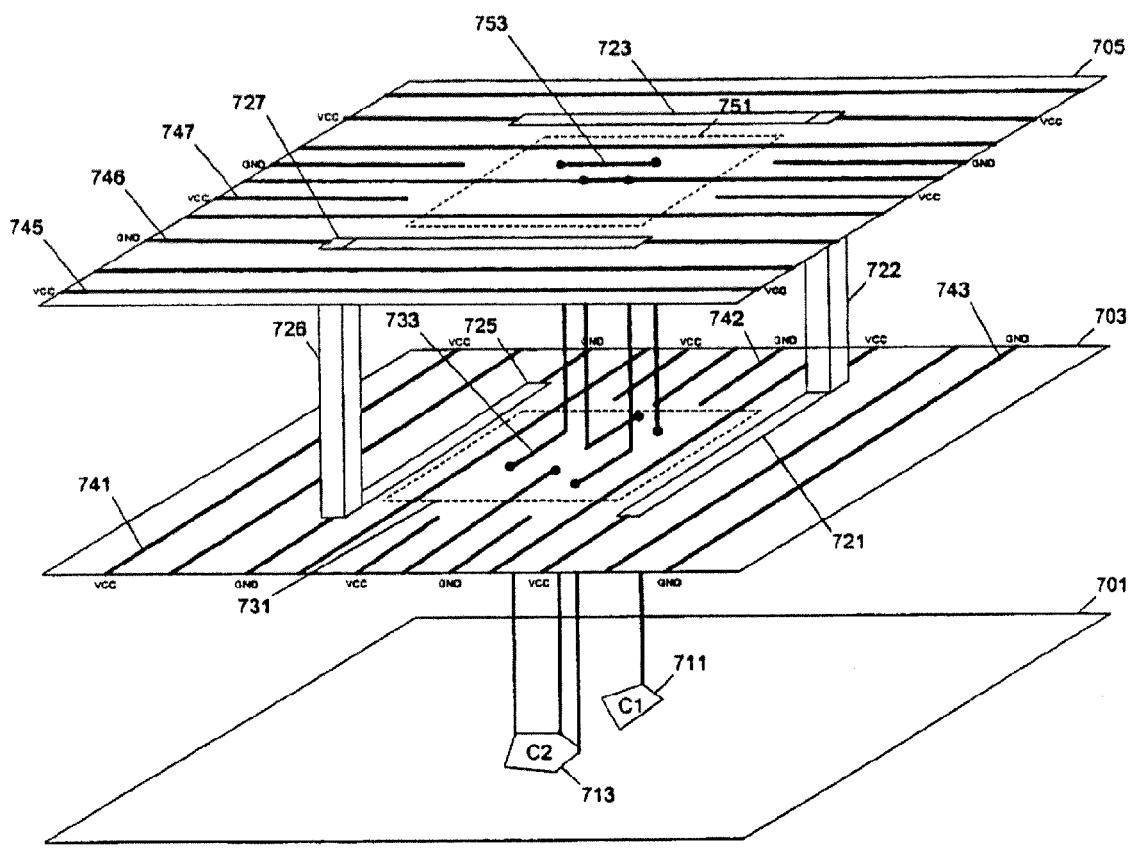
FIG. 15 shows a perspective view of a two-layer shielding mesh with a window for unshielded signal lines according to one embodiment of the present invention.

FIG. 15 shows a perspective view of a two-layer shielding mesh with a window on each layer of shielding mesh for unshielded signal lines according to one embodiment of the present invention. Cells (e.g., gates 711 and 713) on layer 701 on a substrate are connected through signal wires (e.g., lines 753 and 733). Within windows 751 and 731, signal lines are not shielded by shielding wires. Without shielding wires in windows 751 and 731, more resources (e.g. physical space on at least one layer of the IC) are available to route the signal lines. Outside windows 751 and 731, shielding wires (e.g., lines 741, 742, 743, 745, 746, 747) are used to provide shielding to the signal lines running in the tracks between the shielding lines. Around the windows, wide power lines (e.g., lines 721 and 723 connected through via 722 for VCC and lines 727 and 725 connected through via 726 for GND) are used to provide power to the region in the window and to reduce the impedance caused by the window in the mesh.

Figure 16:
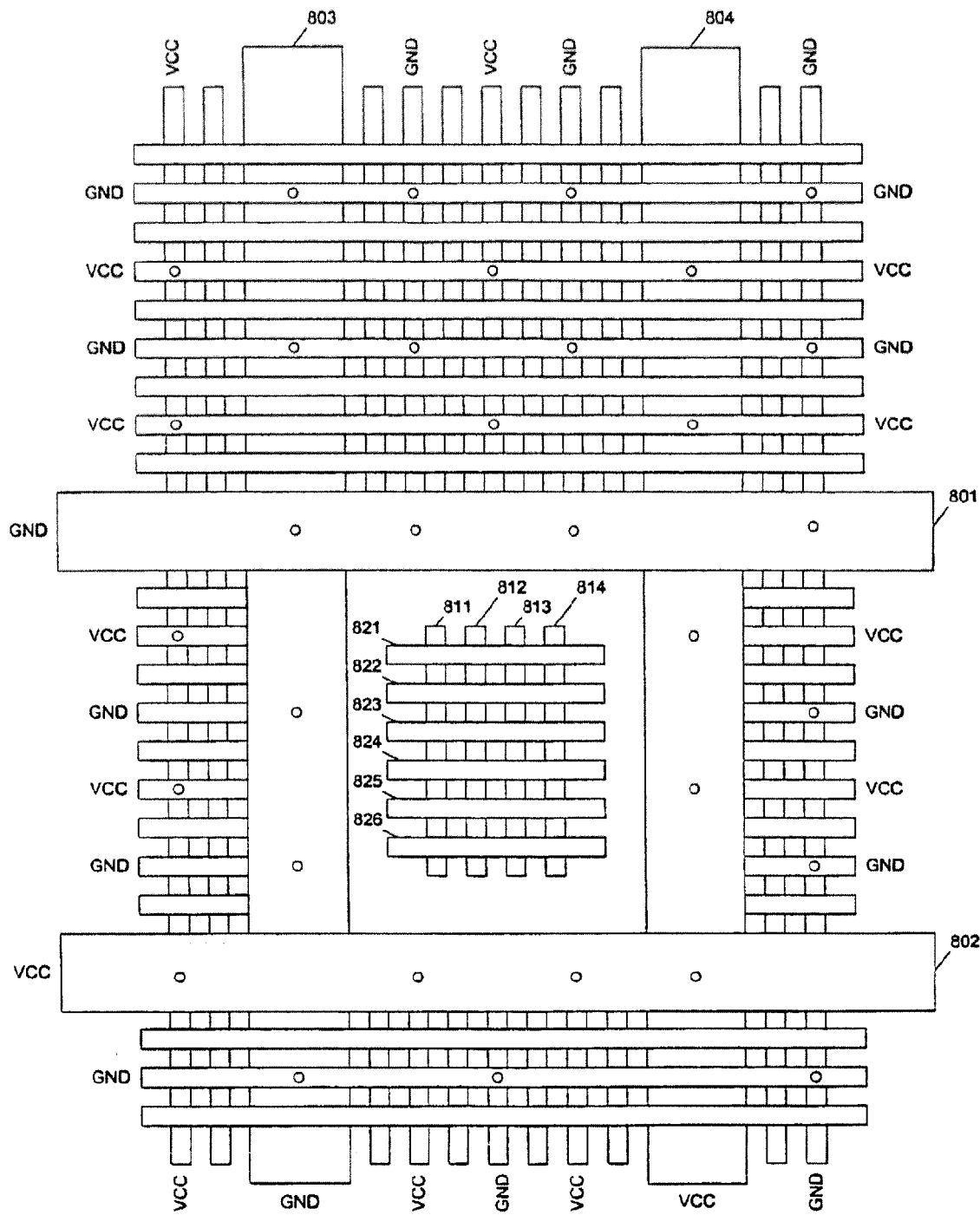
FIGS. 16-18 shows in top views detailed examples of two-layer shielding meshes with windows for unshielded signal lines according to embodiments of the present invention.
Figure 17:
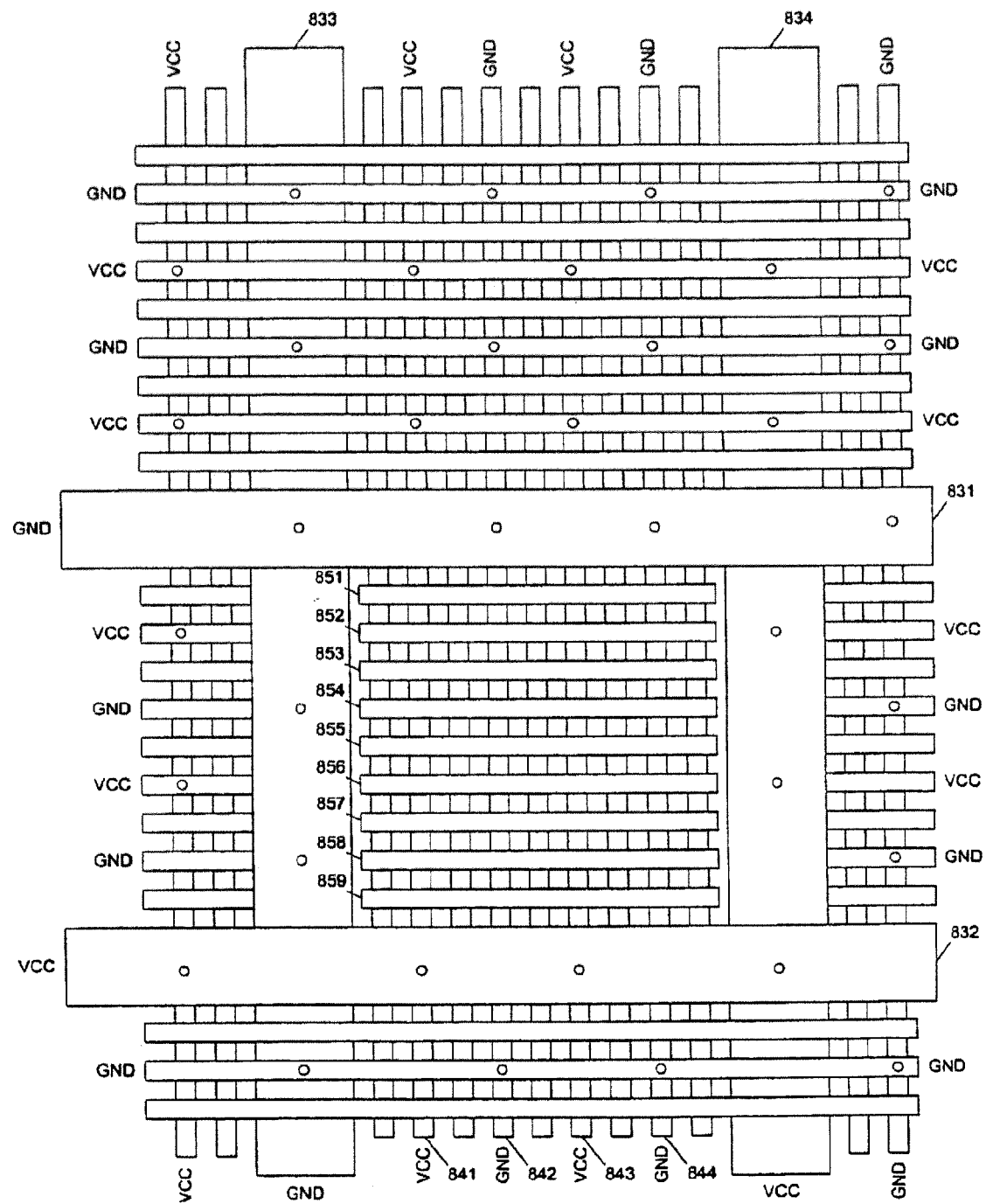
Figure 18:
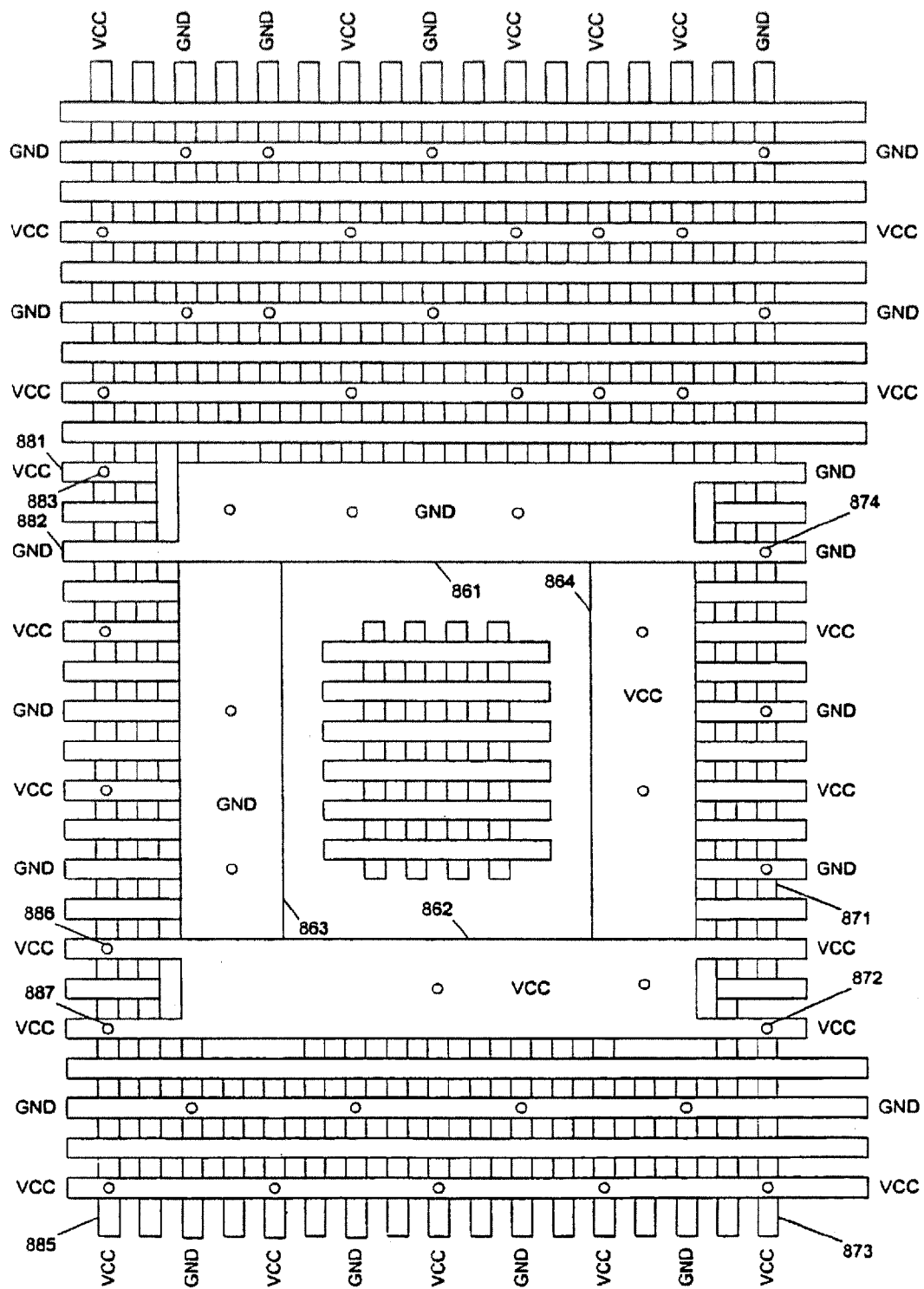

Although FIG. 15 illustrates two windows of the same size in a two-layer shielding mesh, the sizes of the windows in the two layers can be different. Further, a single layer of shielding mesh (without a second layer) may use a window. FIGS. 16-18 shows in top views detailed examples of two-layer shielding meshes with windows for unshielded signal lines according to embodiments of the present invention.

In the example of FIG. 16, a window is formed in a power grid between lines 801, 802, 803 and 804. Both the upper layer and the lower layer have the same window size. Tracks 811-814 in the lower layer and tracks 821-826 on the upper layer are all used to route signals from other layers, such as layers above tracks 821-826 and layers below the lower layer. In the example of FIG. 17, the window is only in the upper layer, where tracks 851-859 are used for routing signal lines to/from, for example, layers above tracks 851-859; and, the shielding mesh of lines 841-844 in the lower layer has no window between power grid lines 831, 832, 833 and 834. In the example of FIG. 18, a power ring of wide wires 861, 862, 863, and 864 are formed by combining adjacent reference voltage lines and the tracks in between so that the wires for the power ring are substantially wider (e.g., more than 2 to 5 times the width of an typical signal line). The power ring provides current flows around the windows to reduce (or compensate) the impedance in the shielding mesh caused by the window. VCC line 873 is connected to line 862 of the power ring through via 872. VCC line 873 is not connected to GND line 871; and GND line 871 taps into line 861 of the power ring through via 874. GND line 882 is connected to line 861 of the power ring; however, VCC line 881 is not connected to line 861 of the power ring. Instead, via 883 connects VCC line 881 to VCC line 885, which taps into the power ring through vias 886 and 887. Thus, different types of shielding meshes outside the power ring are formed by selectively placing the vias for connecting the shielding wires in different layers, selectively connecting or disconnecting shielding wires at certain locations, and selectively combining tracks.

From this description, it can be seen that a window in the shielding can be on a single metal layer (e.g., the layer of the horizontal lines in FIG. 17) or at the same location on two neighboring metal layers (e.g., the layers of the horizontal lines and vertical lines in FIG. 16). Further, it is understood that the windows on neighboring metal layers may not be at the same location and may not be of the same size. The windows on neighboring metal layers can have different sizes and partially overlapping with each other. It is desirable, but not always required, to constrain the size of the window such that the maximum length of a signal line in the window is less than an allowable unshielded length of the signal line. In this way, any unshielded signal lines in the window are not impacted enough by neighbors in the window. If a window is sized in this way, signal lines may be routed in the window without worrying about (or calculating parameters relating to) signal integrity (at least for the portion of the signal line in the window).

Although various examples of the present invention are illustrated using the routing architecture where the lines in the two neighboring layers are routed in a rectilinear way (e.g. the lines in one layer are at an angle of 90 degrees relative to the lines in the other (e.g. next) layer), it is understood that various embodiments of the present invention can also be used for different routing architectures. For example, the lines of two neighboring layers can be in an angle of, for example, 45 degrees so that the lines in one of the layers are routed in a diagonal direction. For example, in an X architecture (e.g., developed by Simplex, now Cadence) wires in a set of metal layers of a chip are routed in a direction that is 45 degrees from the standard architecture. It is understood that various embodiments of the present invention can be used with different angles of routing directions, regardless of the relative orientation between layers. For example, the wires in the first few (shielded) layers are routed in horizontal/vertical directions; and then, the wires in a shielded pair of layers are routed in diagonal directions (e.g., 45 degrees from the horizontal/vertical directions).

Figure 32:
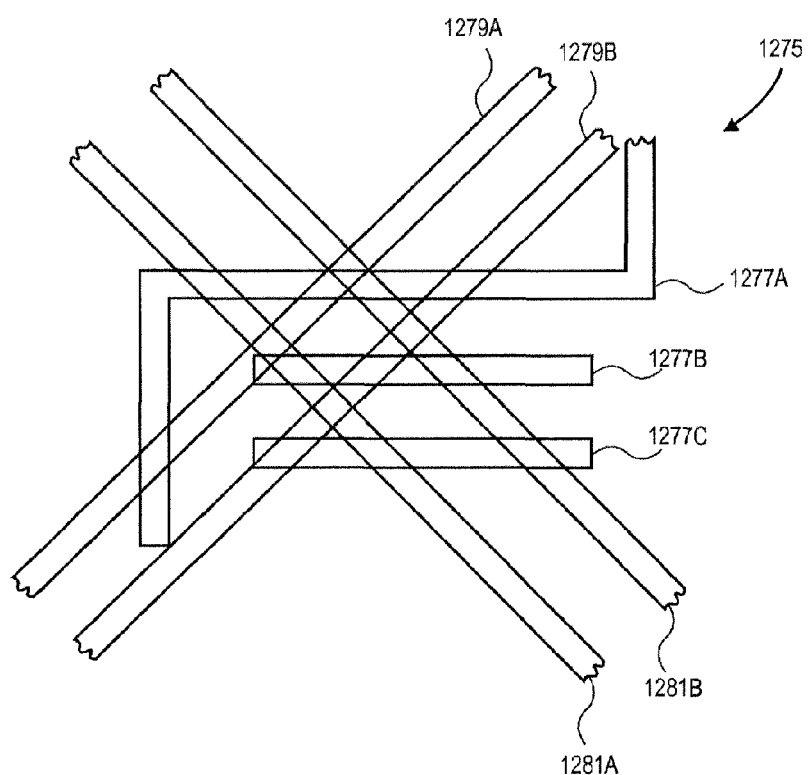
FIG. 32 shows a top view of two layers of a shielding mesh relative to two other layers (such as two other metal layers, e.g. "metal 2" and "metal 3" layers).

FIG. 32 shows an example of a routing architecture of an IC in which at least a first layer and a second layer have conductive lines (e.g. lines 1277A, 1277B, and 1277C) which are routed substantially orthogonally relative to a first reference axis and a second reference axis and in which at least two additional layers comprise a shielding mesh which includes conductive lines (e.g. lines 1279A, 1279B, 1281A, and 1281B) routed substantially non-orthogonally relative to the first and second reference axes. In the example of FIG. 32, lines 1277A, 1277B and 1277C may be lower metal layers (e.g. second and third metal layers in an IC) and lines 1279A and 1279B may be in the fourth metal layer of the IC and lines 1281A and 1281B may be in the fifth metal layer of the IC. It will be appreciated that FIG. 32 is a top view of a portion of an IC which is transparently rendered (such that lower metal layers can be seen). It can be seen from FIG. 32 that lines 1277A, 1277B, and 1277C are routed substantially orthogonally relative to first and second reference axes which may be the edge of the IC. Lines 1279A and 1279B are routed at a non-orthogonal angle (e.g. about 45°) relative to these two reference axes, and lines 1281A and 1281B are also routed at a non-orthogonal angle relative to these two reference axes. While the non-orthogonal angle may be about 45°, it will be appreciated that other angles may be used.

Figure 19:
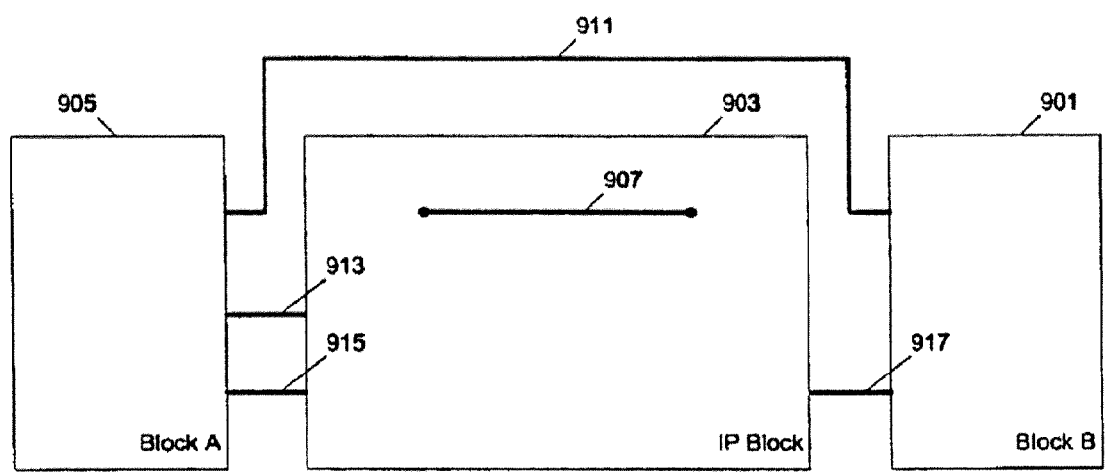
FIG. 19 shows an example of signal lines routed in the presence of an IP block without a shielding mesh.

FIG. 19 shows an example of signal lines routed in the presence of an IP (Intellectual Property) block without a shielding mesh. An IP block is a block of pre-designed circuitry, typically purchased or licensed from a vendor. This predesigned block is normally completely designed and laid out and completely routed (e.g. the internal routing of signals within the block are done and cannot be re-routed). There is typically a first designer which has designed the IP block which will then be used as a building block for a larger design which includes the predesigned block. For example, the design of the circuitry for scanning a keyboard (e.g., an Intel 8051 microcontroller like block) can be purchased and incorporated as a "black box" in an IC on a substrate. Other examples of such predesigned blocks include memory blocks from Virage Logic or logic cores (blocks) from ARM. Certain aspects of an IP block are typically unknown to the designer of the IC which is to incorporate the IP block so that any interference to the circuitry of the IP block would be avoided to preserve signal integrity. For example, blocks 905 and 901 are connected to IP block 903 through wires 913, 915 and 917. Signal line 911 connects blocks 905 and 901. Since certain aspects of the IP block are not known when designing the IC chip, it cannot be easily determined whether or not a signal wire that does not belong to the IP block can cause signal integrity problems when the signal wire is routed through or over the IP block. If the wire is routed through or over the IP block, capacitive and inductive coupling between the wire and the wires of the IP block (e.g., signal line 907) may cause signal integrity problems. Thus, a conventional method typically routes the wire (e.g., line 911) around the IP block, as shown in FIG. 19, rather than over the IP block. It can be seen from FIG. 19 that the IP block includes at least one routing layer for routing signals within the IP block and also for connecting the IP block to blocks (e.g. logic) outside of the IP block.

According to embodiments of the present invention, long routes for IP blocks can be routed in a shielding mesh through/over the IP block in, for example, a shielding layer that is an integral part of (and designed as part of the) predesigned block; and channels in the shielding mesh can be used for signal lines that do not belong to the IP blocks (e.g. signals that are not directly connected to the IP block or are not originating from the IP block), because there is no danger of coupling when the signal lines are shielded in the mesh within the IP block. Alternatively, a virtual route can be performed, where each route has a bound on a function of resistance and capacitance along the route through the shielding grid; and these routes are then completed as part of the chip top level routing. This provides more flexibility for top level routing. A successful independent route of the IP block can be used as a starting point to guarantee success in routing for the IP block.

Figure 20:
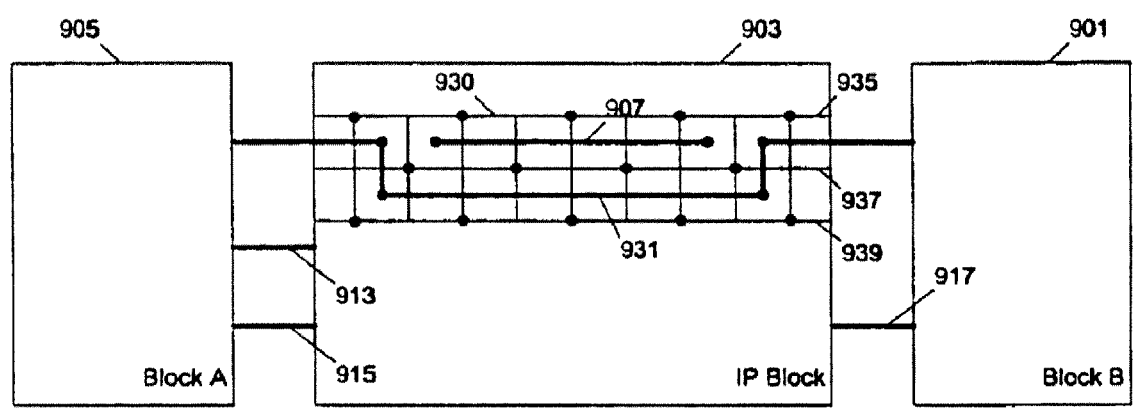
FIGS. 20-21 shows examples of signal lines routed through a region for an IP block in a shielding mesh according to embodiments of the present invention.
Figure 21:
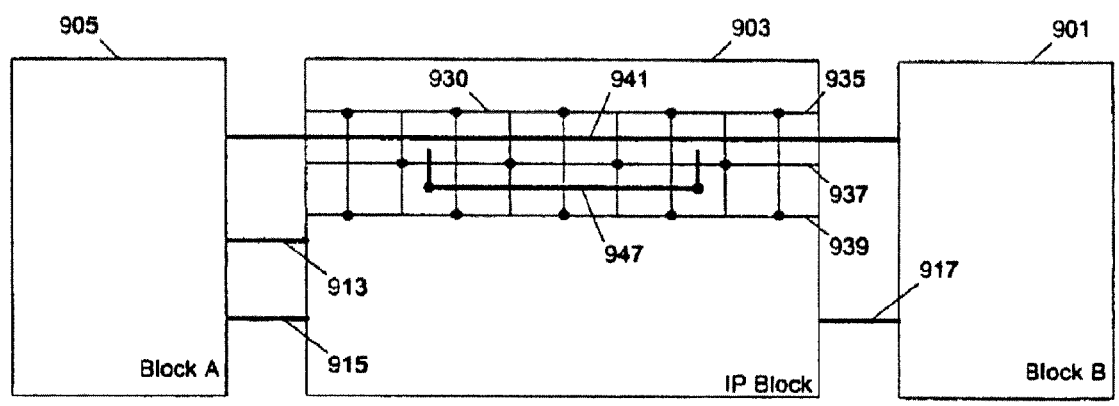

FIGS. 20-21 shows examples of signal lines routed through a region for an IP block in a shielding mesh according to embodiments of the present invention. In the top view of the IC in FIG. 20, shielding mesh 930, which is designed as an integral part of the predesigned IP block, is used to shield the wires (e.g., line 907 which originates in block 903 and ends in block 903) of IP block 903. When the design of block 903 is completed and ready to use in a larger design, the block 903 includes a completely laid out routing architecture except for an integral shielding layer (or layers) which is used to route lines originating in the block 903 or ending in the block 903 as well as lines which are not part of the block 903, such as signal lines which originate from another block and which are not directly connected to circuitry in block 903. Thus, while nearly all of the design of block 903 is completed and generally not revisable in the process of incorporating the block 903 into a larger design, an integral shielding layer in block 903 is capable of being changed. Reference voltage wires (e.g., lines 935, 937 and 939) are added into the routing area (a shielding mesh 930) of the IP block to shield signal lines. Signal line 931 for connecting blocks 905 and 901 is routed in shielding mesh 930 which is a two layer shielding mesh. Since signal line 931 is shielded from the signal lines (e.g., line 907) of the IP block, signal line 931 can be routed through the region for the IP block without signal integrity problems. Although FIG. 20 shows only an example where a signal line from outside an IP block is routed through the region of the IP block in a shielding mesh, it is apparent from this description to one skilled in the art that a shielding mesh can be used in many different ways to shield the signal lines that do not belong to the IP block from the wires of the IP block. For example, the shielding mesh can be in layers above the layers for routing the wires of the IP block; and a signal line for other blocks is routed in the shielding mesh above the IP block (e.g., a shielding line that runs in parallel with the signal line in a layer below the signal line can be used to shield the signal line from the signal lines below the shielding line; more details about inter-layer shielding are illustrated in FIG. 5). Further, wires of the IP block can be re-routed in the shielding mesh. FIG. 21 shows such an example, where wire 947 of IP block 903 is re-routed. The resistances (and/or capacitances) of the re-routed wires may be determined to prevent significant changes in the properties of the re-routed wires.

In addition to running signals at risk in the shielding grid, one can also limit the maximum unshielded run of high edge rate signals. In order to know the maximum unshielded length of a signal, one can create an RLC (Resistance, Inductance and Capacitance) model of the driver, wire, neighbor wires and associated coupling. The neighbors are known as aggressors and the signal being routed is known as the victim. The worst case edge rate (or current ramp for inductance) is inputted into the model to see of it causes a signal integrity problem. The maximum unshielded length for the signal being routed (victim) can then be reduced so that the signal integrity is preserved. One way to increase the maximum unshielded length is to limit the edge rate (or the di/dt for inductance) of the aggressors, by requiring them to be shielded. Clock nets, for example, have both high currents and edge rates and should therefore run shielded for most of their length. Other high fanout signals could have high currents even if they have moderate edge rates.

In order to achieve a complete route, it may be necessary to leave a number of signals somewhat over the risk threshold. In these cases, signal integrity can be achieved by existing techniques such as buffering/sizing the driver, picking alternate neighbor signals that do not transition at the same time as the potential victim, spacing the wire farther from other wires, widening the wire for part of its length to lower resistance, or dropping in a shield wire which can be easily connected to the shielding grid above or below. This will be much easier because the risk level has been dramatically reduced by partial use of shielding on the victims.

Figure 22:
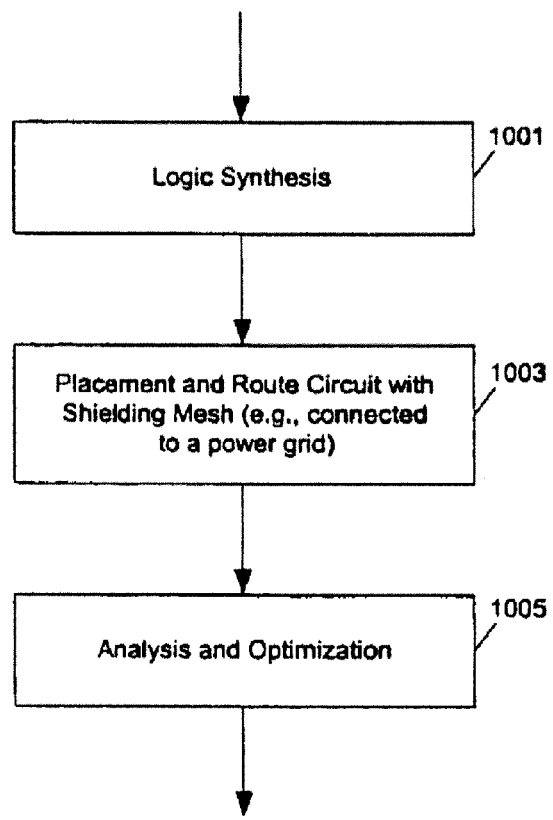
FIG. 22 shows a flow diagram of designing an integrated circuit according to one embodiment of the present invention.

FIG. 22 shows a flow diagram of designing an integrated circuit according to one embodiment of the present invention. The process can begin with the creation of a description of the desired circuit in a Hardware Description Language (HDL) which is known in the art. This description can then be compiled to yield another description such as a Register Transfer Level (RTL) description which can then be further processed in a logic synthesis process. Operation 1001 performs logic synthesis to create a logic element network that performs a given set of functions. The logic synthesis operation may transform and restructure the logic to optimize delays, areas and other design goals. The gate-level logic elements are mapped to vendor specific primitives which are placed in blocks on the chip. Operation 1003 places the vendor specific primitives on the chip and routes the wires between the primitives. At least a portion of the wires are routed in a shielding mesh, which is energized by at least two different voltages. Operation 1005 performs analysis and optimization to meet various design requirements, such as timing requirements, and to optimize performance. In place optimizations are typically performed to optimize timing by changing the physical characteristics (e.g., size) of the logic elements without changing the placement of the logic elements. In place optimizations typically tweak transistor sizes without moving the logic elements around. A timing analysis is typically performed based on the detailed placement and routing information to determine whether or not the timing requirements are satisfied. Some (or all) of operations 1001-1005 may be repeated in iterations to satisfy the design requirement and to optimize the design. The design process of FIG. 22 may be used with any of the various methods and processes described herein to produce an IC which includes a shielding mesh, and this design process may be performed with a computer aided design system which stores and manipulates digital representations (e.g. HDL listings, unplaced netlists, placed netlists, etc.) in the system. The representation includes information about the shielding mesh and routing of wires through the shielding mesh.

Figure 23:
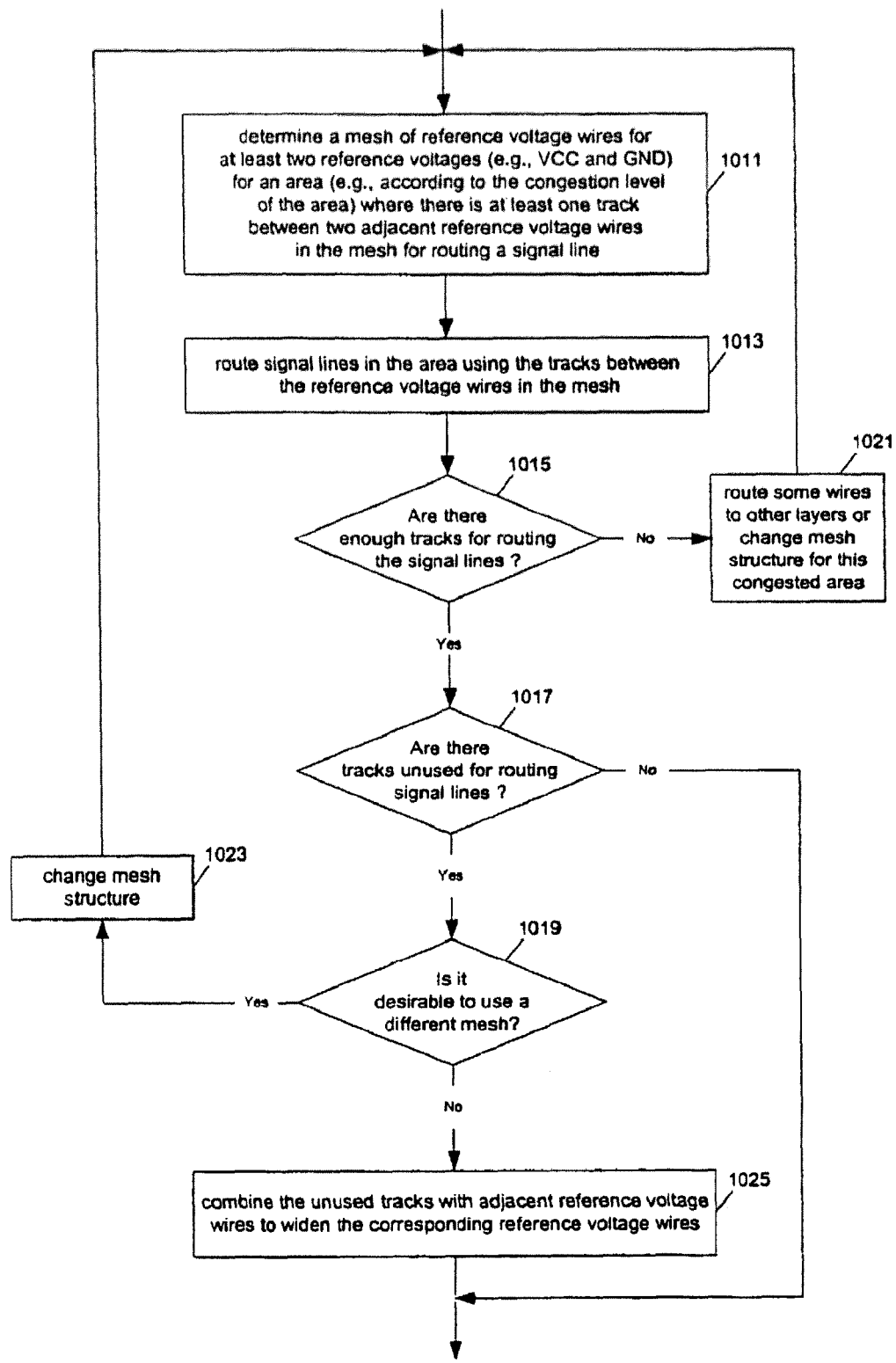
FIG. 23 shows a method to route signal lines for an integrated circuit according to one embodiment of the present invention.

FIG. 23 shows a method to route signal lines for an integrated circuit according to one embodiment of the present invention. Operation 1011 determines a mesh of reference voltage wires for at least two reference voltages (e.g., VCC and GND) for an area (e.g., according to the congestion level of the area) where there is at least one track between two adjacent reference voltage wires in the mesh for routing a signal line. In one embodiment of the present invention, the reference voltage wires are interconnected (e.g., through connection vias) for each of the reference voltages to form a reference voltage mesh so that the segments between the connections are reduced. According to the congestion level, which may be estimated before a routing operation or determined from a previous routing operation, the pattern of the reference voltage wires and tracks (e.g., patterns as shown in FIGS. 6-10) for routing signals is determined (or selected). For example, the shielding mesh may have a window with a ring (e.g., FIGS. 15-18) surrounding the window for a very congested area such as a congested area in a layer above or below the window; or a shielding mesh in one layer may have a pattern as shown in FIG. 10 for a less congested area or a shielding mesh in one layer may have a pattern as shown in FIG. 28A. Operation 1013 routes signal lines in the area using the tracks between the reference voltage wires in the mesh. If operation 1015 determines that there are not enough tracks for routing the signal lines, operation 1021 routes some wires to other layers or changes mesh structure (wire patterns) for this congested area; otherwise, operation 1017 determines whether or not there are tracks unused for routing signal lines. If there are unused tracks (entirely unused tracks, such as track 565 in FIG. 12, or partially unused tracks, such as track 567 in FIG. 12), operation 1019 determines whether or not it is desirable to use a different mesh. If it is desirable to use a different mesh, the mesh structure can be changed in operation 1023 to assign more areas for the shielding wires to improve the effectiveness of shielding and the capacity of the mesh to distribute current with minimum voltage drops; otherwise, operation 1025 combines the unused tracks with adjacent reference voltage wires to widen the corresponding reference voltage wires (generate wider shielding wires with larger current carrying capacities). Some operations in the example of FIG. 23 are optional; and different flow sequences may be used. For example, operations 1019 and 1023 are not performed in one embodiment of the present invention.

Figure 24:
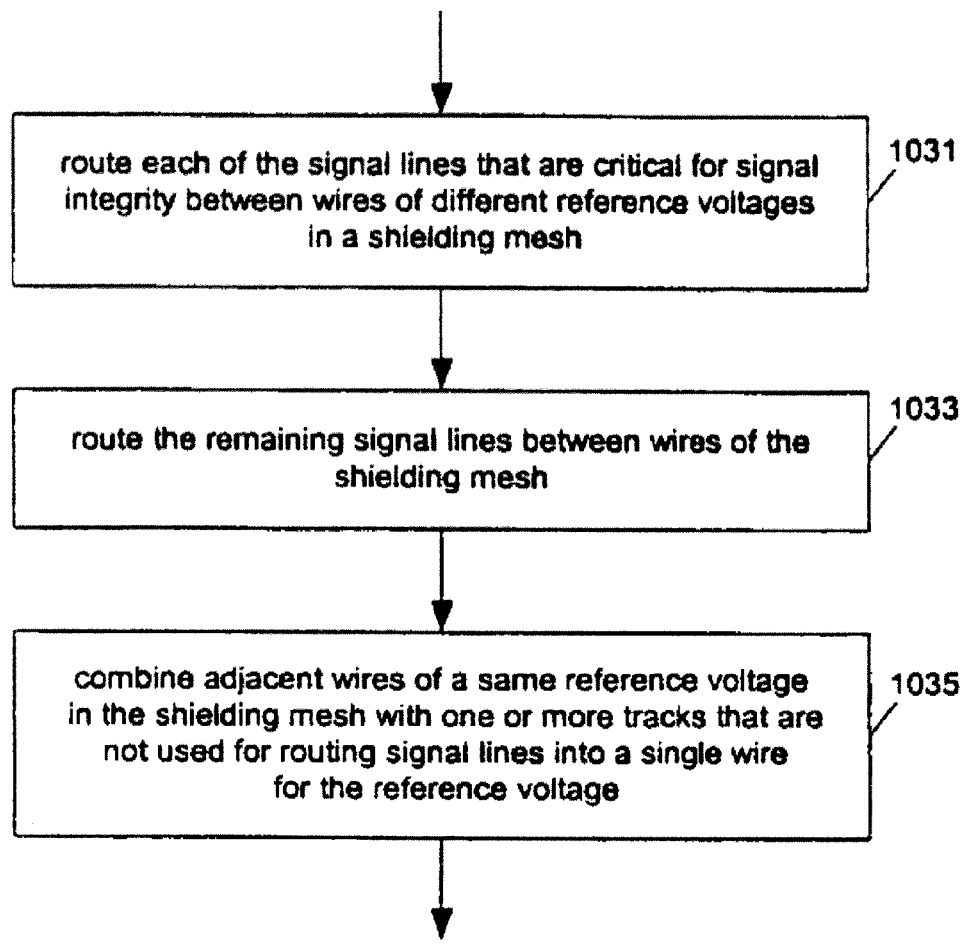
FIG. 24 shows a method to route signal lines in a shielding mesh according to one embodiment of the present invention.

FIG. 24 shows a method to route signal lines in a shielding mesh according to one embodiment of the present invention. After operation 1031 routes each of the signal lines that are critical for signal integrity between wires of different reference voltages in a shielding mesh, operation 1033 routes the remaining signal lines between wires of the shielding mesh. For example, noisy signal lines (e.g., with a strong drive strength) and long signal wires, which can be critical for signal integrity, are better shielded between shielding wires of different voltages (e.g., between GND and VCC); and short signal wires can be routed between shielding wires of a same voltage (e.g., between a GND/GND pair or a VCC/VCC pair). Operation 1035 combines adjacent wires of a same reference voltage in the shielding mesh with one or more tracks that are not used for routing signal lines into a single, larger wire for the reference voltage. Various methods to combines the adjacent wires, as illustrated in FIG. 13 and described above (e.g., splitting a track for widening adjacent shielding lines of different voltages, filling in the area between adjacent shielding lines of a same voltage, or combining a track with one adjacent shielding line, and others), can be used to widen shielding lines.

Figure 25:
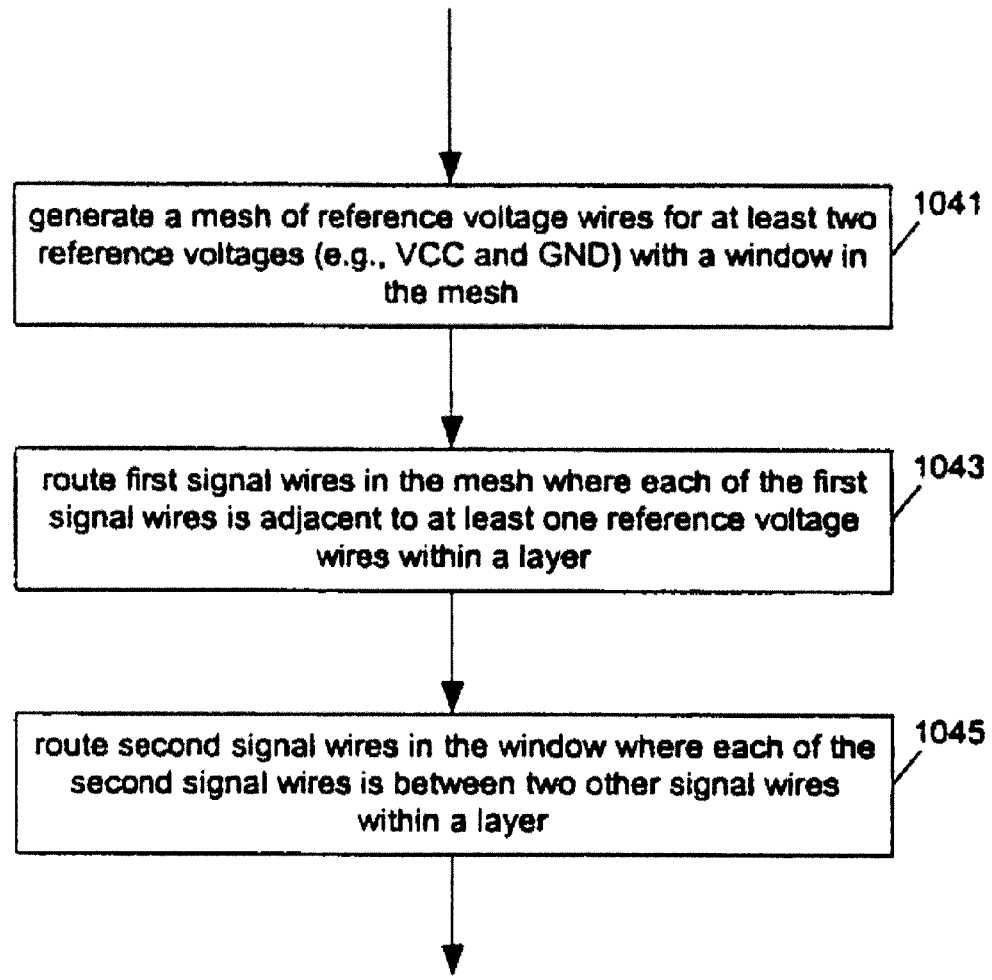
FIG. 25 shows a method to route signal lines in a shielding mesh with a window for unshielded lines according to one embodiment of the present invention.

FIG. 25 shows a method to route signal lines in a shielding mesh with a window for unshielded lines according to one embodiment of the present invention. This method may begin as a result of analysis, by a computer aided design system, of the level of congestion of wires and routes in a representation of the IC being designed. This may occur in an early stage of a routing process by the computer aided design system (e.g. as an estimation of congestion in the design, such as an estimation of space available for routing signal and other lines within the available, desired space of the IC under design or the level of congestion in the design may be determined after an actual routing operation. In this method, at least a portion of at least one layer of the representation of the IC includes a shielding mesh which has been introduced into the representation of the design stored by and manipulated by the computer aided design system. The analysis of the level of congestion takes into account the presence of the shielding mesh, which reduces the area available for routing of lines, such as signal lines, on the IC being designed. The analysis produces a determination of the level of congestion in the representation of the IC. Upon determining that the level of congestion has become unacceptable (e.g. the wiring density is too high to perform a successful routing of the lines on the IC given the desired size, in area, of the IC or the wiring density exceeds a predetermined design rule such as the minimum width of a line), then the computer aided design system introduces a window in the shielding mesh where the window has at least a lower density of shielding than the density of shielding in the shielding mesh which at least in part surrounds or abuts the window. The size of the window may be limited in order to assure that there is only a small length of signal lines which are unshielded in the window. It is possible to tolerate minimal coupling between smaller lengths of unshielded signal lines (rather than longer lengths of unshielded signal lines which will tend to couple signals more due to the longer length of the unshielded signal lines). Thus, the size of the window may be designed to limit its size which in turn will limit the size (e.g. length) of any unshielded signal lines in the window.

Operation 1041, performed by a computer aided design system, generates a mesh of reference voltage wires for at least two reference voltages (e.g., VCC and GND) with a window in the mesh. This may occur as a result of a computer aided design system creating a representation of a window in a representation of the shielding mesh. In one embodiment of the present invention, the window is surrounded by wider shielding wires to reduce the impedance in the shielding mesh caused by the window; in another embodiment of the present invention, a sparser set of shielding wires of different voltages are used in the window. Operation 1043 routes first signal wires in the mesh where each of the first signal wires is adjacent to at least one reference voltage wires within a layer; and operation 1045 routes second signal wires in the window where each of the second signal wires is between two other signal wires within a layer. Some of the second signal wires may be entirely in the window; and some of the second signal wires may be partially the window and partially shielded in the mesh. Signal integrity analysis may be performed for the second signal wires to determine if signal integrity in the IC is preserved.

Figure 26:
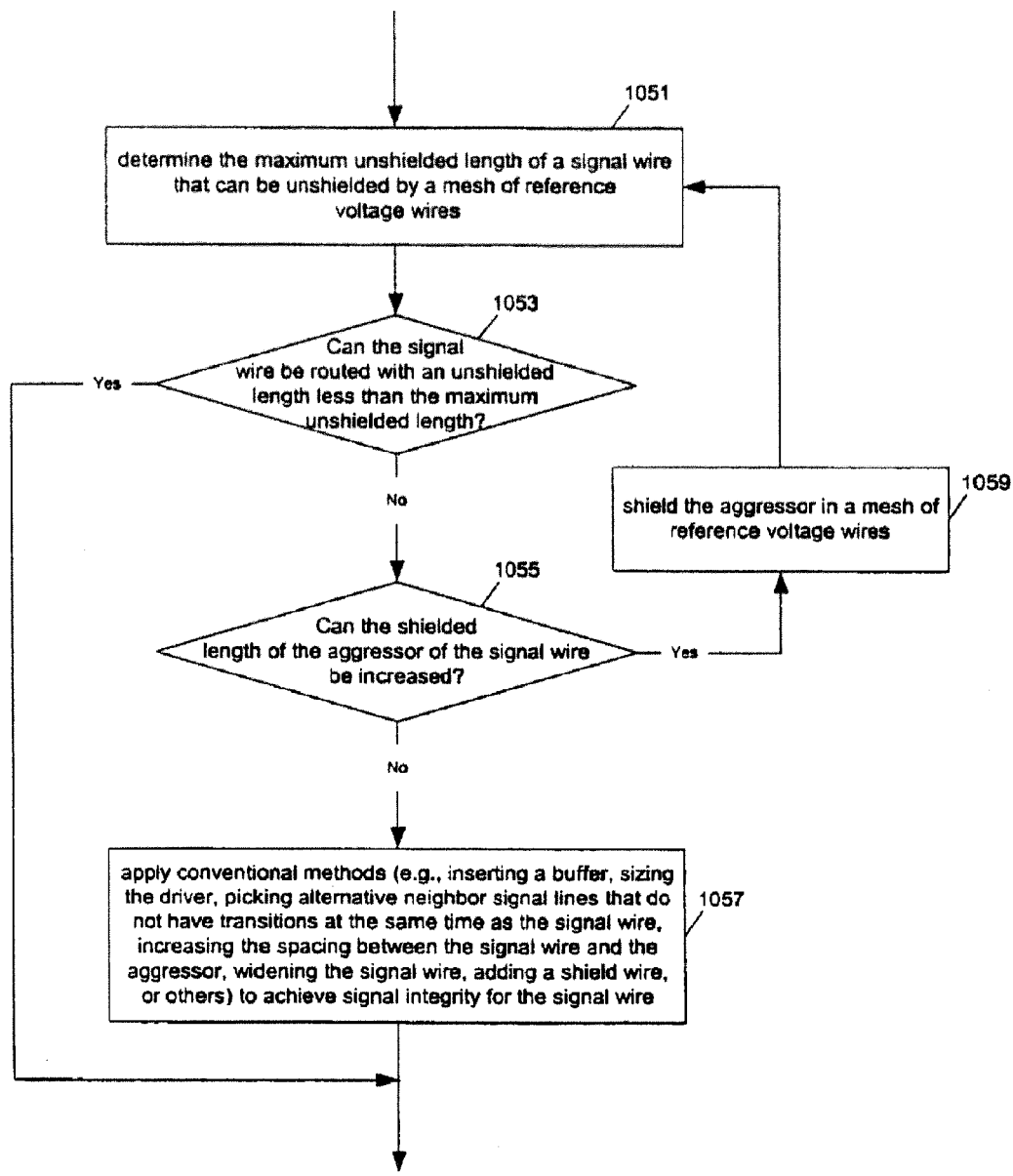
FIG. 26 shows a method to route unshielded or partially shielded signal lines in a window of a shielding mesh according to one embodiment of the present invention.

FIG. 26 shows a method to route unshielded or partially shielded signal lines in a window of a shielding mesh according to one embodiment of the present invention. Operation 1051 determines the maximum (allowable) unshielded length of a signal wire that can be unshielded by a mesh of reference voltage wires. In one embodiment of the present invention, an RLC (Resistance, Inductance and Capacitance) model of the driver, wire, and neighbor wires are used to determine the signal coupling. The neighbors are known as aggressors, and the signal line being routed is known as the victim. The RLC model assumes that a worst case aggressor is along an unshielded portion of the "victim." The RLC model is used to analyze the effect of the worst case edge rate (or current ramp for inductance) in order to determine the maximum unshielded length of the signal wire in assessing signal integrity. Operation 1053 determines whether or not the signal wire can be routed with an unshielded length less than the maximum unshielded length. If the signal cannot be routed with an routed with an unshielded length less than the maximum unshielded length and operation 1055 determines that the shielded length of the aggressor of the signal wire cannot be increased, operation 1057 applies conventional methods (e.g., inserting a buffer/repeater, sizing the driver, picking alternative neighbor signal lines that do not have transitions at the same time as the signal wire, increasing the spacing between the signal wire and the aggressor, widening the signal wire, adding a shield wire, or others) to achieve signal integrity for the signal wire. Otherwise, operation 1059 shields the aggressor in a mesh of reference voltage wires (e.g., reducing the portion of the aggressor that is not shielded in the shielding mesh).

Some embodiments of the present invention allow external signals to be routed through or over a region for an IP block (e.g. a predesigned block, such as block 903) without the fear of signal integrity problems caused by unknown signals being routed near the internal signals of the IP block.

Figure 27:
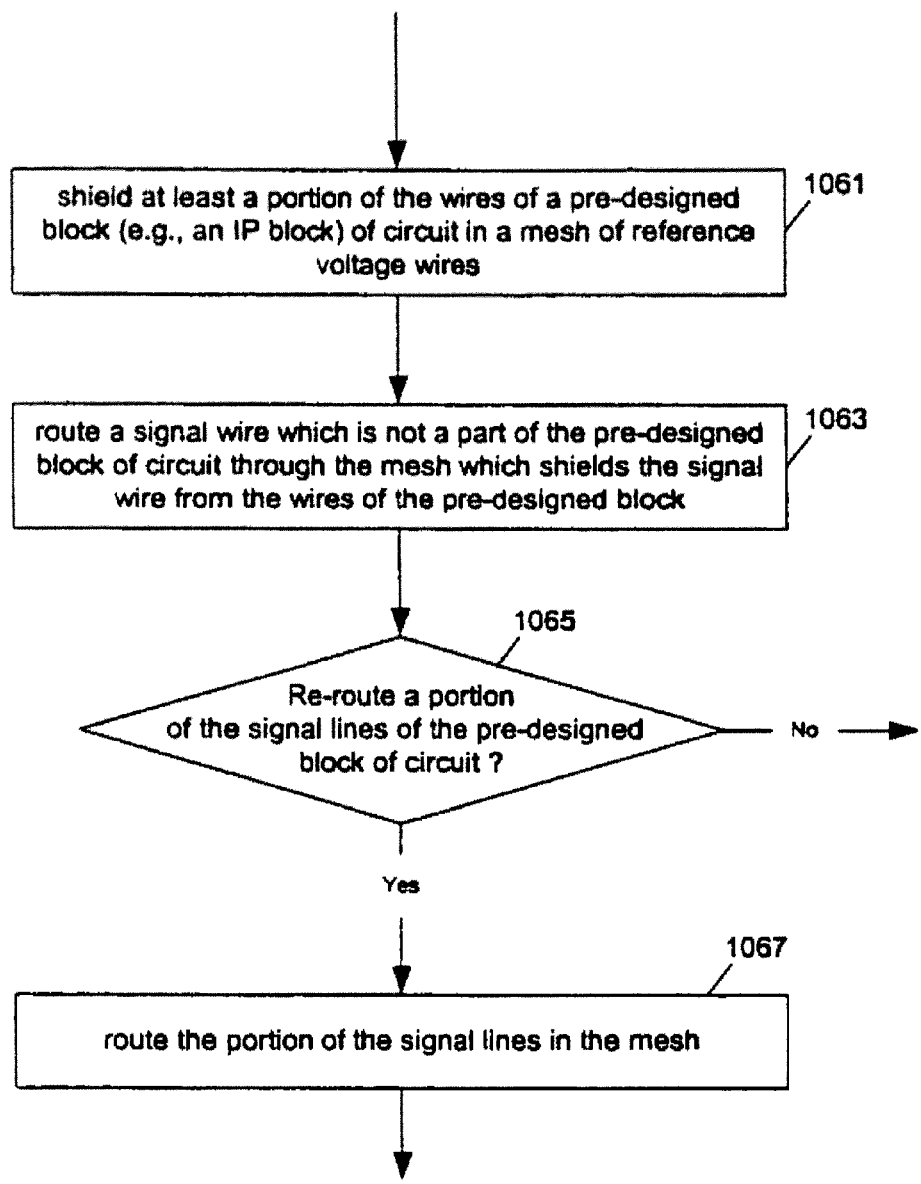
FIG. 27 shows a method to route signal lines through a region of a pre-designed block of circuit in a shielding mesh according to one embodiment of the present invention.

FIG. 27 shows a method to route signal lines through a region of a pre-designed block of circuit (such as an IP block) in a shielding mesh according to one embodiment of the present invention. Operation 1061 shields at least a portion of the wires of a pre-designed block (e.g., an IP block) of circuitry in a mesh of reference voltage wires. Operation 1063 routes a signal wire that is not a part of the pre-designed block of circuit through the mesh, which shields the signal wire from the wires of the pre-designed block. If operation 1065 determines that it is desirable to re-route a portion of the signal lines of the pre-designed block of circuit, operation 1067 routes the portion of the signal lines in the shielding mesh. Thus, after a shielding mesh is added to the routing area for the IP block (in a top view of the IC), signal wires for other block can be routed through or over the region defined by the IP block; and some of the wires of the IP block can be re-routed.

Figure 31:
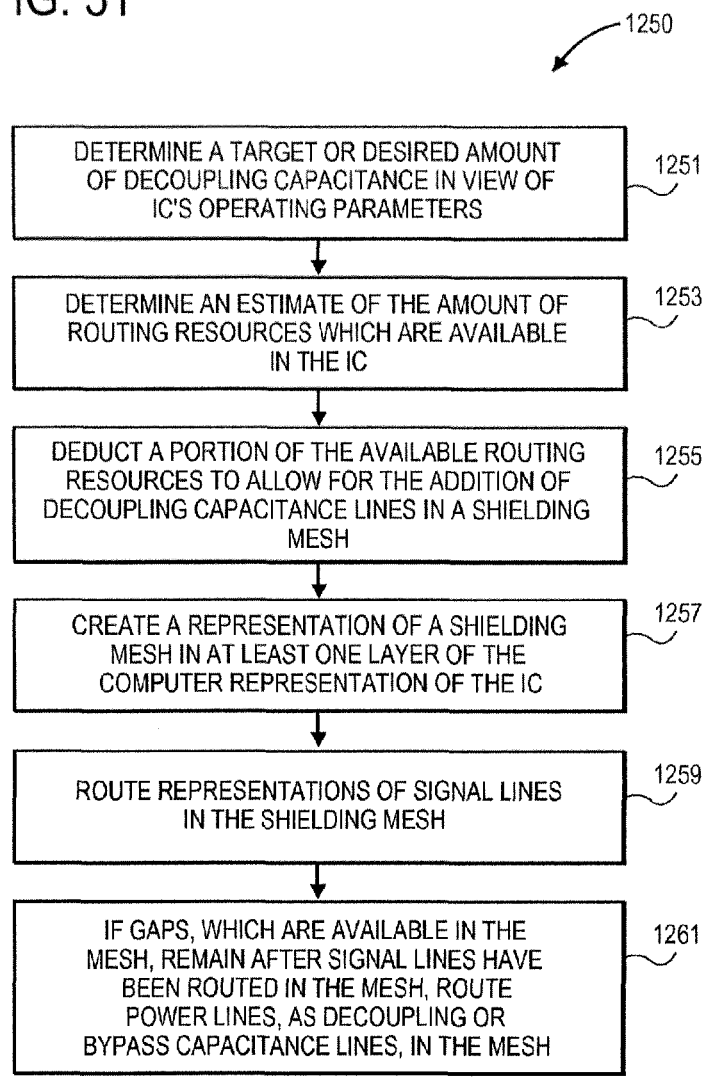
FIG. 31 is a flow chart showing one exemplary method of designing an IC.

FIG. 31 shows a flowchart which depicts a method 1250 of designing an IC which includes a shielding mesh with decoupling capacitance. This method may be used in designing shielding meshes as shown in FIG. 28B or 29B. The method 1250 includes operation 1251 in which a target (or desired) amount of decoupling capacitance is determined. In operation 1253, an estimate is made of the amount of available routing resources. In operation 1255, a portion of the available routing resources is deducted in order to preserve tracks in the shielding mesh for the addition of additional reference voltage lines (which act as decoupling capacitance lines) in the shielding mesh. A representation (e.g. a computer aided design representation) of the shielding mesh is created in operation 1257, and in operation 1259, representations of signal lines are routed in the shielding mesh. If gaps (e.g. the gap between lines 1201C and 1201D) in the shielding mesh are available after the signal lines have been routed, then additional reference voltage lines may be added in operation 1261 to increase the amount of decoupling capacitance, up to the amount of desired decoupling capacitance.

Figure 33:
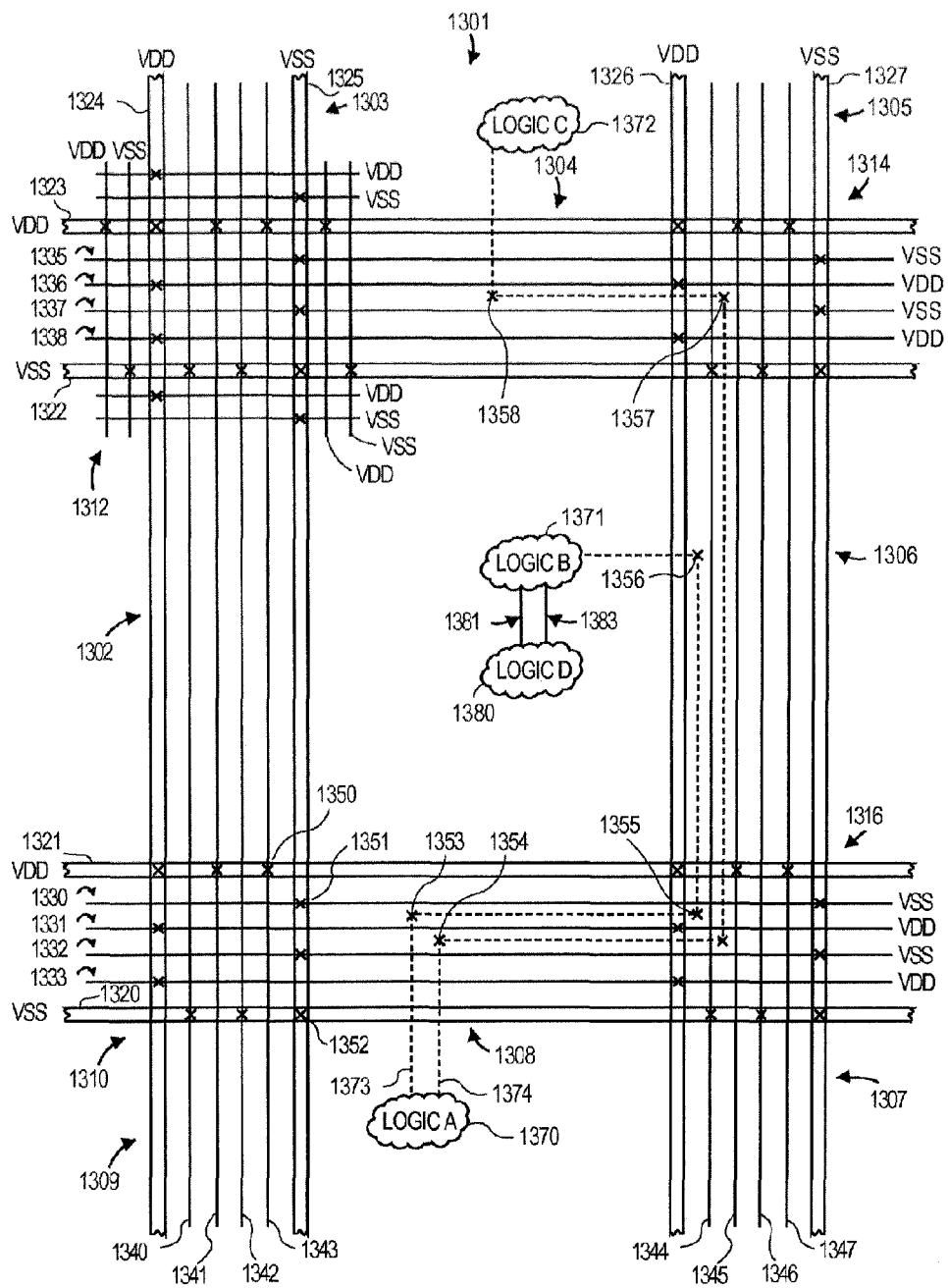
FIG. 33 shows a top view of another embodiment of a shielding mesh having two layers in portions of the shielding mesh and having one layer in other portions.

FIG. 33 shows an example of a shielding mesh which includes several different types of shielding in the mesh. FIG. 33 is a top view of a portion of an IC and shows two routing layers of the IC and also shows certain logic (logic A, B and C) which is on lower layers of the IC. The shielding mesh 1301 includes four double layer shielding meshes 1310, 1312, 1314, and 1316 and at least eight single layer shielding meshes 1302, 1303, 1304, 1305, 1306, 1307, 1308, and 1309. There are also unshielded regions which do not include any shielding wires, and thus any signal lines in these regions are unshielded. The unshielded regions include a region which contains logic A (1370), a region which contains logic B (1371) and which is bounded by single layer shielding meshes 1302, 1304, 1306 and 1308, and a region which contains logic C (1372). There are also unshielded regions to the left of a widened VDD line 1324 and to the right of a widened VSS line 1327 as shown in FIG. 33. Each shielding mesh contains a first plurality of lines (e.g. lines 1321, 1323, 1324, 1326, 1336, 1338, 1331, 1333, 1341, 1343, 1345 and 1347) which are designed to provide a first reference voltage (e.g. VDD) and a second plurality of lines (e.g. lines 1320, 1322, 1325, 1327, 1330, 1332, 1335, 1337, 1340, 1342, 1344, and 1346) which are designed to provide a second reference voltage (e.g. VSS in the case of FIG. 33). The larger reference voltage lines (e.g. lines 1320, 1321, 1322, 1323, 1324, 1325, 1326, and 1327) provide increased current carry capacity for the shielding and provide interconnections (e.g. through connection vias 1350, 1351, and 1352) to other reference voltage lines in the shielding mesh. The connection vias between layers are shown by an "X" in FIG. 33; FIG. 4 shows, in perspective view, examples of connection vias in a double layer shielding mesh (see connection vias 301 and 303 in FIG. 4). Additional connection vias may be added to further improve the quality (e.g. reduced impedance) of the shielding mesh. The connection vias are also used to route signal lines from one layer to another layer above or below the one layer; for example, connection vias 1353, 1354, 1355 and 1356 provide for the routing of signal lines from logic A (1370) to logic B (1371) and logic C (1372) as shown in FIG. 33. It will be appreciated that a single layer shielding mesh in the architecture of FIG. 33 will resemble the shielding mesh of FIG. 29; however, a double repeating pattern shielding mesh (e.g. as shown in FIG. 28) may alternatively be used in either or both of the single layer and double layer shielding meshes of FIG. 33. It will also be appreciated that additional reference voltage lines may be added to the shielding mesh to provide bypass capacitance between the reference voltages (e.g. see FIG. 28B; the adding of these additional reference voltages would normally be performed after successfully routing all signal lines in a manner which satisfies timing constraints of the IC. The double layer shielding mesh 1312 is slightly larger than the other double layer shielding meshes 1310, 1314 and 1316 and provides additional double layer shielding mesh capacity; the other double layer shielding meshes may similarly be increased in size. Similarly, one or more of the single layer shielding meshes may extend beyond the widened VSS and VDD lines.

The routing of signal lines in the shielding mesh 1301 will now be described relative to signal lines coupling logic A, logic B and logic C in FIG. 33. It will be appreciated that additional logic units with additional signal lines may also be routed in the shielding mesh of FIG. 33. Logic A (1370), in an unshielded region below the single layer shielding mesh 1308, provides two signal lines 1373 and 1374 which may both be outputs driven by a driver in logic A (1370). A first unshielded portion of signal line 1373 extends from logic A and is routed to an area below the single layer shielding mesh 1308. A connection via 1353 electrically connects signal line 1373 from one layer (e.g. a first layer) to another layer (e.g. a second layer) which includes the single layer shielding mesh 1308, from which point the signal line 1373 is routed in the single layer shielding mesh 1308 and into the double layer shielding mesh 1316 where the signal line 1373 is electrically connected, through connection via 1355, to a routing of signal line 1373, on the first layer, and this routing of signal line 1373 extends along an available gap or track in the single layer shielding mesh 1306 until it reaches the connection via 1356. At connection via 1356, the signal line 1373 is routed to the second layer and extends away from mesh 1306 in an unshielded region and connects to logic B to drive inputs in logic B. It can be seen from FIG. 33 that only a small portion of signal line 1373 is unshielded and this small portion may be within a maximum allowable unshielded length for signal line 1373. The unshielded regions of FIG. 33 may be considered "windows" (which are similar to the windows described herein, such as the window shown in FIG. 15).

Signal line 1374 has a similar routing path as signal line 1373 except that signal line 1374 passes through three single layer shielding meshes and two double layer shielding meshes on its way from logic A (1370) to logic B (1372). A first unshielded portion of signal line 1374 extends from logic A and is routed to an area below the single layer shielding mesh 1308. A connection via 1354 electrically connects signal line 1374 from the first layer to the second layer which includes the single layer shielding mesh 1308, from which point the signal line 1374 is routed in the mesh 1308 and into the double layer shielding mesh 1316. In this mesh 1316 the signal line 1374 is electrically connected through a connection via to a routing of signal line 1374, again on the first layer, through an available gap in the mesh 1306 until it reaches an electrical connection via 1357 within the double layer shielding mesh 1314 which connection via 1357 causes the signal line 1374 to be routed between lines 1336 and 1337, firstly in the double layer shielding mesh 1314 and then in the single layer shielding mesh 1304 until line 1374 reaches the connection via 1358. At connection via 1358, the signal line 1374 is routed to the first layer (from the second layer which includes lines 1336 and 1337) and extends away from mesh 1304 into an unshielded region which includes connections to logic C, where signal line 1374 connects to logic C to drive inputs in logic C (1372). It will be appreciated that the use of shielding meshes may allow higher power drivers (e.g. amplifiers) to be used to drive the signal lines which are shielded (e.g. lines 1373 and/or 1374).

It will also be appreciated that, as shown in FIG. 33, additional logic units (e.g. logic D, labeled 1380) may be connected through unshielded signal lines 1381 and 1383 to logic B in the unshielded region which contains both logic B and logic D. It is possible, in the example shown in FIG. 33, to route signal lines 1381 and 1383 without shielding because these lines are short enough (e.g. the maximum unshielded length calculated from RLC models for signal lines 1381 and 1383 is less than the actual unshielded length of the routed signal lines 1381 and 1383 shown in FIG. 33) that they do not require shielding. It will also be appreciated that a predesigned block (e.g. an IP block with or without its own integral shielding mesh) may be incorporated into an unshielded region.

An alternative of the shielding mesh 1301 may use a structure which is similar to the shielding mesh 1301 but in which one or more portions of the mesh exist on other layers (other than the two layers which comprise, for example, the double layer shielding mesh 1310). For instance, one or more of the long primarily single layer meshes (e.g. mesh 1306 and 1308) and their shielded signal lines (e.g. 1373 and 1374) may be routed for a portion of their runs along the two layers having double layer shielding meshes 1310 and 1316 and then be routed down or up, through connection vias, to other layers and then back to the two layers having the double layer meshes 1310 and 1316. Thus, the single layer mesh runs between the crossover areas (the double layer mesh areas) may change to other layers. In one particular embodiment these single layer mesh runs with their shielded signal lines may be placed on pre-fabricated or pre-configured layers such as those found in gate arrays and structured ASICs where some mesh layers are held fixed across different designs, which saves routing resources on the configurable layers. In this case, the unused routing tracks between reference voltages can be used to increase the current carrying capacity of the power grid and to provide bypass capacitance for the grid. A subset of these routing tracks may also be pre-configured with repeaters to improve performance and signal integrity of signals routed over very long distances.

Figure 34A:
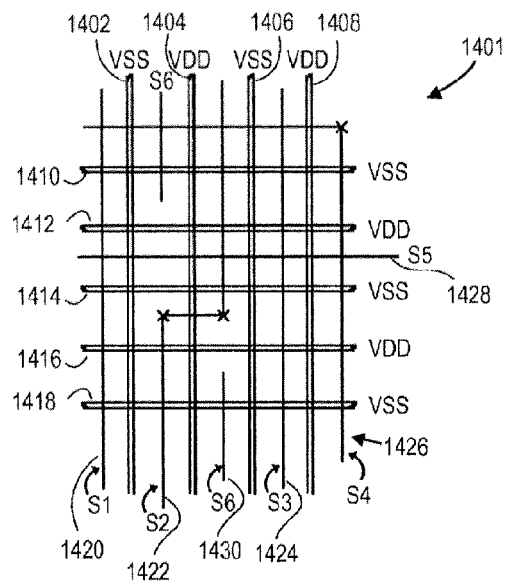
FIGS. 34A and 34B show a top view of a shielding mesh which changes in the process of designing an IC, according to another embodiment.
Figure 34B:
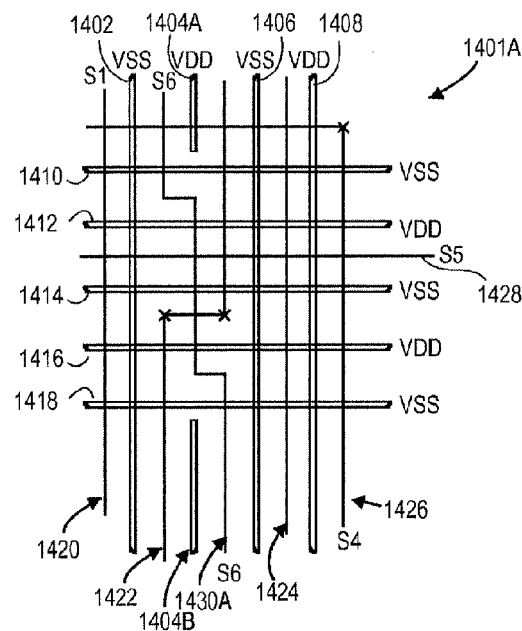
Figure 35:
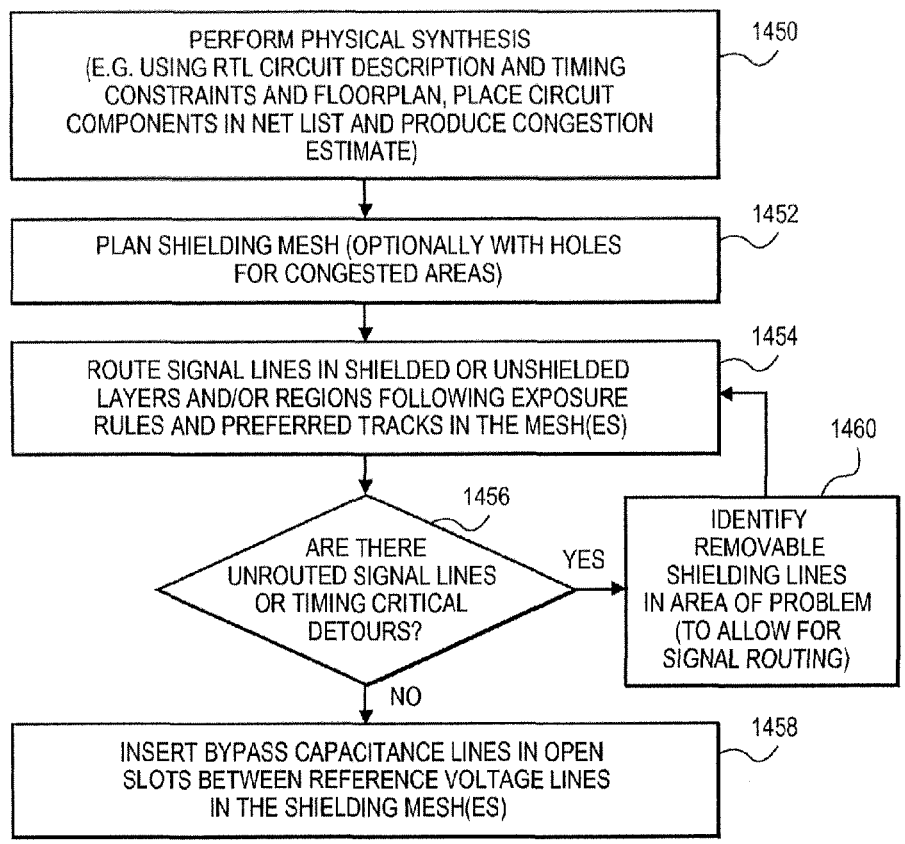
FIG. 35 is a flow chart which shows an exemplary method of designing an IC according to another aspect of the invention.

FIGS. 34A, 34B and 35 show another exemplary method for designing an IC. Operation 1450 of FIG. 35 may begin after a compilation of a technology independent HDL (hardware description language) into an RTL (register transfer level) description which is converted into a technology dependent RTL netlist. Other techniques may be used to create the RTL netlist. In operation 1450, physical synthesis is performed using an RTL circuit description (e.g. an RTL netlist) and timing constraints and a floorplan (if any); this physical synthesis places the logic primitives in the netlist and optionally generates a congestion estimate (e.g. an estimate of the amount of routing relative to the available routing resources). In operation 1452, a shielding mesh is planned. The shielding mesh may include an optional hole or window for routing in congested areas. Then in operation 1454, signal lines are routed in shielded or unshielded layers or regions based upon exposure rules for signal lines and based upon the use of preferred tracks in the mesh. These exposure rules include: (a) routing long signal lines between opposite reference voltage lines in a shielding mesh, if possible; (b) routing noisy signal lines (e.g. those having predictably high edge rates) between opposite reference voltage lines in a shielding mesh; (c) routing clock lines in the shielding mesh; (d) routing signal lines, which have a length which exceed their calculated maximum unshielded line length, in a shielding mesh; (e) routing in a shielding mesh signal lines which transition between signal states (e.g. high to low and vice versa) at near the same time as another adjacent signal line and (f) routing signal lines which are not directly connected to a predesigned block (e.g. IP block) through an integral shielding layer in the block. Other exposure rules and preferred tracks are also described herein. An exemplary result of operation 1454 is shown in FIG. 34A in which a two layer shielding mesh 1401 includes a first plurality of reference voltage lines 1402, 1406, 1410, 1414 and 1418 which provide a first reference voltage (VSS in this example) and a second plurality of reference voltage lines 1404, 1408, 1412, and 1416 which provide a second reference voltage (VDD in this example). These reference voltage lines together form the two layer shielding mesh 1401. The operation 1454 has successfully routed signal lines S1 (1420), S2 (1422), S3 (1424), S4 (1426) and S5 (1428) through the shielding mesh 1401. Connection vias between layers are shown with an "X." Signal line S6 (1430) has not been successfully routed by the first performance of operation 1454, and this is shown in FIG. 34A as a lack of connection between the upper and lower portions of signal line S6. This failure to route a signal line is detected in operation 1456 of FIG. 35 and causes the system to perform operation 1460. Operation 1456 also detects whether a routing of a signal line has caused a timing critical signal to be too late (e.g. a detour of a critical path signal line has caused the signal line to have a negative slack); if this is detected, operation 1460 is also performed. An exemplary result of operation 1460 and a repeat of operation 1454 is shown in FIG. 34B as operation 1460 has identified that a portion of shielding line 1404 is removable and that shielding line has been removed and replaced with shielding lines 1404A and 1404B which leave a gap to allow for routing of signal line S6 (1430A) which is shown, in FIG. 34B, as routed through the track previously reserved for line 1404. After operation 1456 determines that routing was successful, then in operation 1458, bypass capacitance lines may be added in the open slots between reference voltage lines. For example, in the case of the shielding mesh 1401A, an additional reference voltage line (e.g. VSS) may be added between reference voltage lines 1410 and 1412 and/or between lines 1416 and 1418. The amount of additional reference voltage lines which are added will depend upon the desired or target amount of decoupling or bypass capacitance for the shielding mesh.

Figure 36:
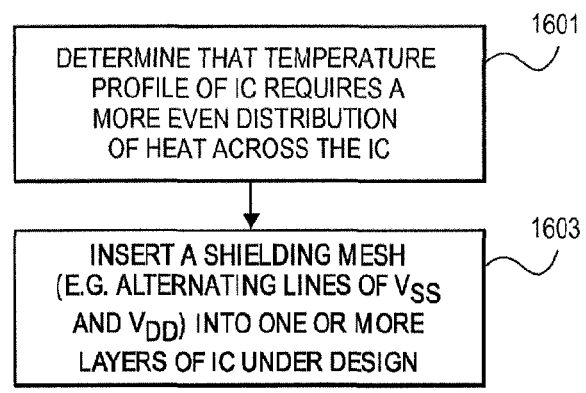
FIG. 36 shows another exemplary method for designing an IC according to another aspect of the invention.

FIG. 36 shows another aspect of the inventions described herein. An exemplary embodiment of this aspect is shown in the operations of FIG. 36. In operation 1601, a temperature profile of an integrated circuit is determined, and from this temperature profile, it is determined that the temperature profile of the integrated circuit is too uneven and therefore requires a more even distribution of heat across the integrated circuit. This operation may be performed through software simulation of the integrated circuit or through actual physical temperature measurements of various points on the integrated circuit. If the temperature profile is relatively flat across the surface of the integrated circuit, this would indicate that the temperature distribution across the integrated circuit is relatively even. On the other hand, if the profile reveals peaks and valleys which represent high and low points of temperature readings over the integrated circuit, then the temperature profile may be too uneven. In response to determining that the temperature profile is too uneven, a designer may insert in operation 1603 a shielding mesh which typically includes alternating lines of first and second reference voltages. This shielding mesh may be added to one or more layers of the integrated circuit which is being designed. The insertion of the shielding mesh may be performed through a computer aided design program which inserts a representation of the shielding mesh into a representation of the integrated circuit which is then fabricated to include the shielding mesh into the actual, physical integrated circuit. The shielding mesh will help to even out the distribution of temperatures on the integrated circuit.

Figure 37:
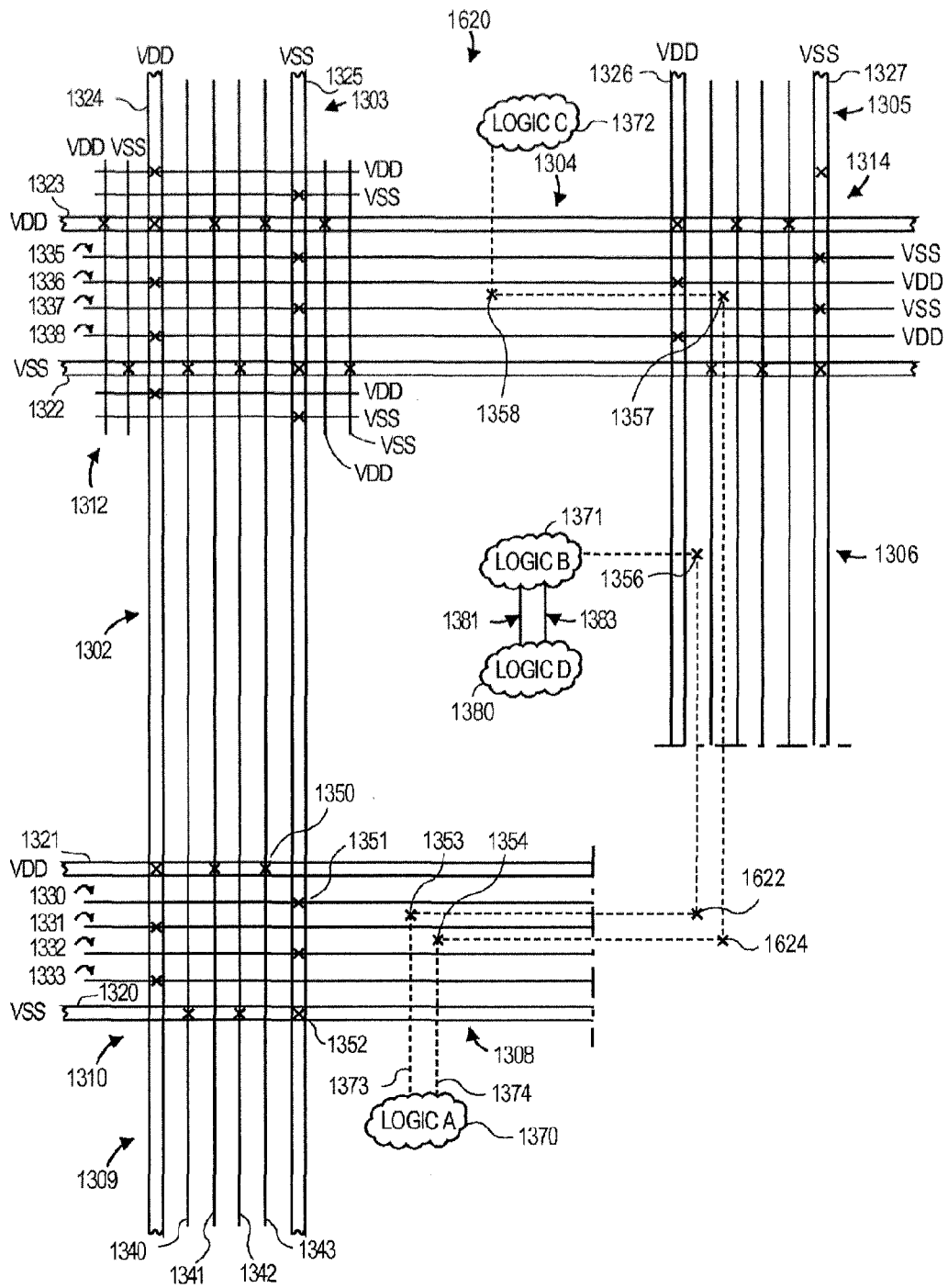
FIG. 37 shows another exemplary embodiment of a shielding mesh in two layers of an IC.

FIG. 37 shows an alternative embodiment of the shielding mesh shown in FIG. 33. In this alternative embodiment, a portion of the shielding mesh has been eliminated as shown in FIG. 37. In this particular example, a double layer shielding mesh has been removed which leaves several signals unshielded as they transition from one layer to the other layer through two connection vias. In particular, signal lines 1373 and 1374 transition from one layer to another layer through connection vias 1622 and 1624 in an unshielded region of the integrated circuit 1620 shown in FIG. 37. This may be acceptable when the length of the unshielded portion of these lines is relatively short or this may be acceptable when the signal transition times of the two lines are relatively different (e.g. the transition times of the two signals on these two signal lines do not overlap or differ by more than a predetermined period of time, such as 20 nanoseconds). It will be appreciated that alternative examples may include the removal of other shielding portions of the shielding mesh such as additional portions of the double layer shielding mesh or additional portions of the single layer shielding mesh.

Figure 38:
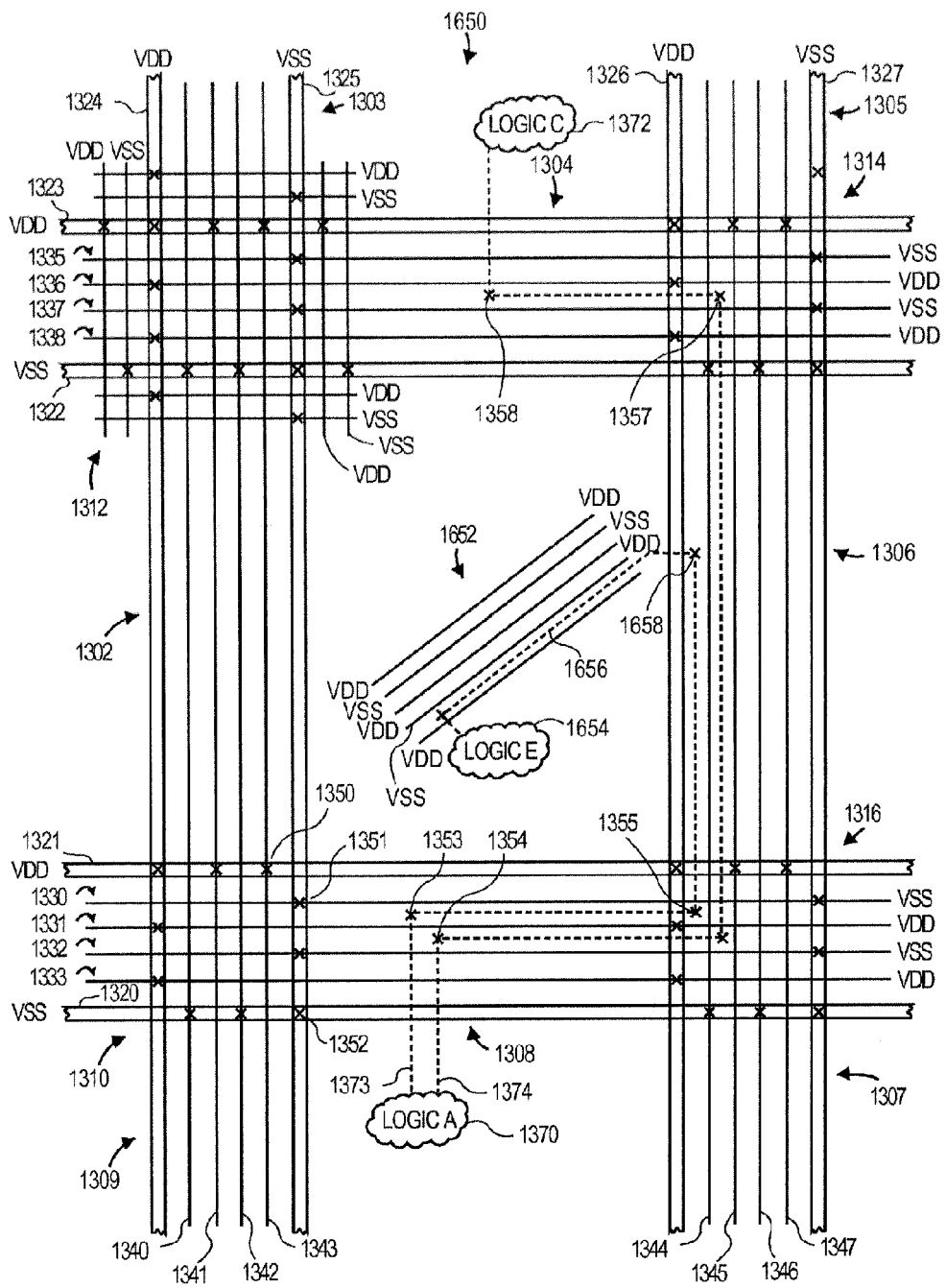
FIG. 38 shows another exemplary embodiment of a shielding mesh in two layers of an IC.

FIG. 38 shows an integrated circuit 1650 which is another alternative embodiment of the shielding mesh shown in FIG. 33. In the shielding mesh shown in FIG. 38, there is an additional shielding mesh 1652 which has been inserted into the central region (a previously unshielded region) of the shielding mesh. This shielding mesh 1652 includes a plurality of lines carrying reference voltages VDD and VSS, where these lines are arranged substantially diagonally (e.g. about 45°) relative to all of the other lines in the shielding mesh shown in FIG. 38. Signals may be routed through this shielding mesh 1652, such as signal 1656 from logic E designated as logic 1654, and this signal is then routed through a connection via 1658 into the remainder of the shielding mesh as shown in FIG. 38.

Figure 39:
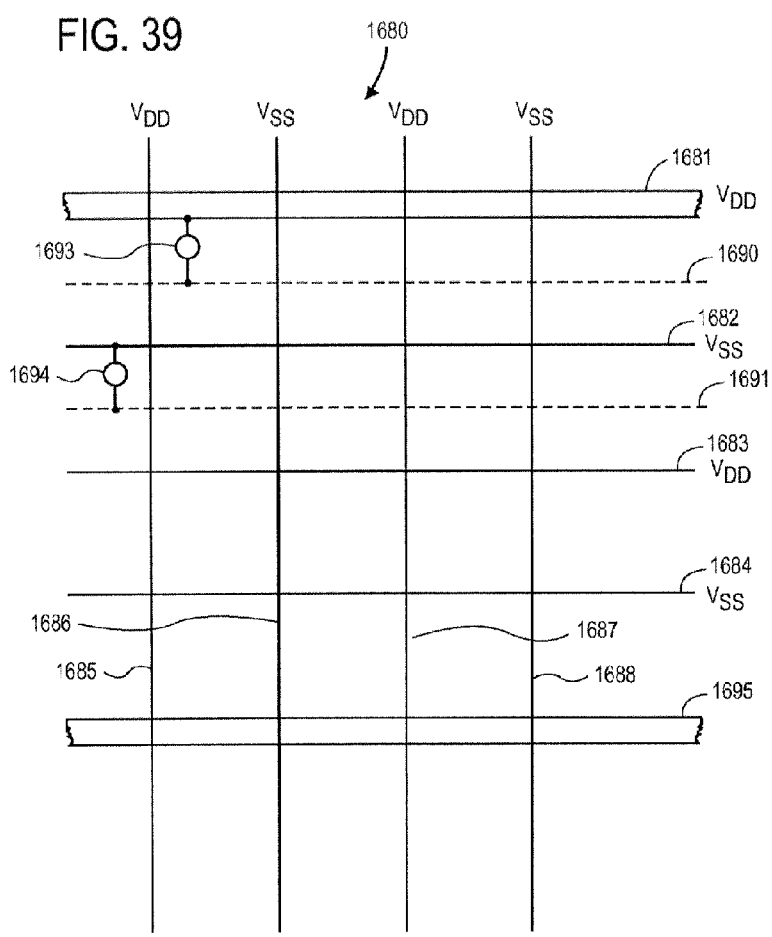
FIG. 39 shows another exemplary embodiment of shielding meshes in an IC.

FIG. 39 shows another example of a shielding mesh which includes two layers of conductive lines providing alternating reference voltages. In particular, the shielding mesh 1680 includes lines 1685, 1686, 1687, and 1688 in one layer, and also includes conductive lines 1681, 1682, 1683, 1684, and 1695 in another layer, which may be an adjacent layer (adjacent to the layer containing lines 1685-1688). Two signal lines 1690 and 1691 are shown routed through the shielding mesh formed by lines 1681-1684 and 1695. These signal lines are coupled to adjacent reference voltage lines which form the shielding mesh. In particular, signal line 1690 is coupled through an interconnection device 1693 to the line 1681 which forms a portion of the shielding mesh in one layer of the shielding mesh 1680. Similarly, the signal line 1691 is coupled to an interconnection device 1694 to the reference voltage line 1682 which is part of the shielding mesh. This particular embodiment allows a signal line to be selectively connected through an interconnection device to one of the reference voltage lines in the shielding mesh. The connection may be selected through the use of an active device, such as an active field effect transistor, or may be selected through the use of a fuse or anti-fuse. Thus, the interconnection device may be an active transistor or a fuse which is programmable or an anti-fuse which is programmable. This allows a designer to use the shielding mesh or a portion of the shielding mesh for additional programmability when designing an integrated circuit.

Figure 40:
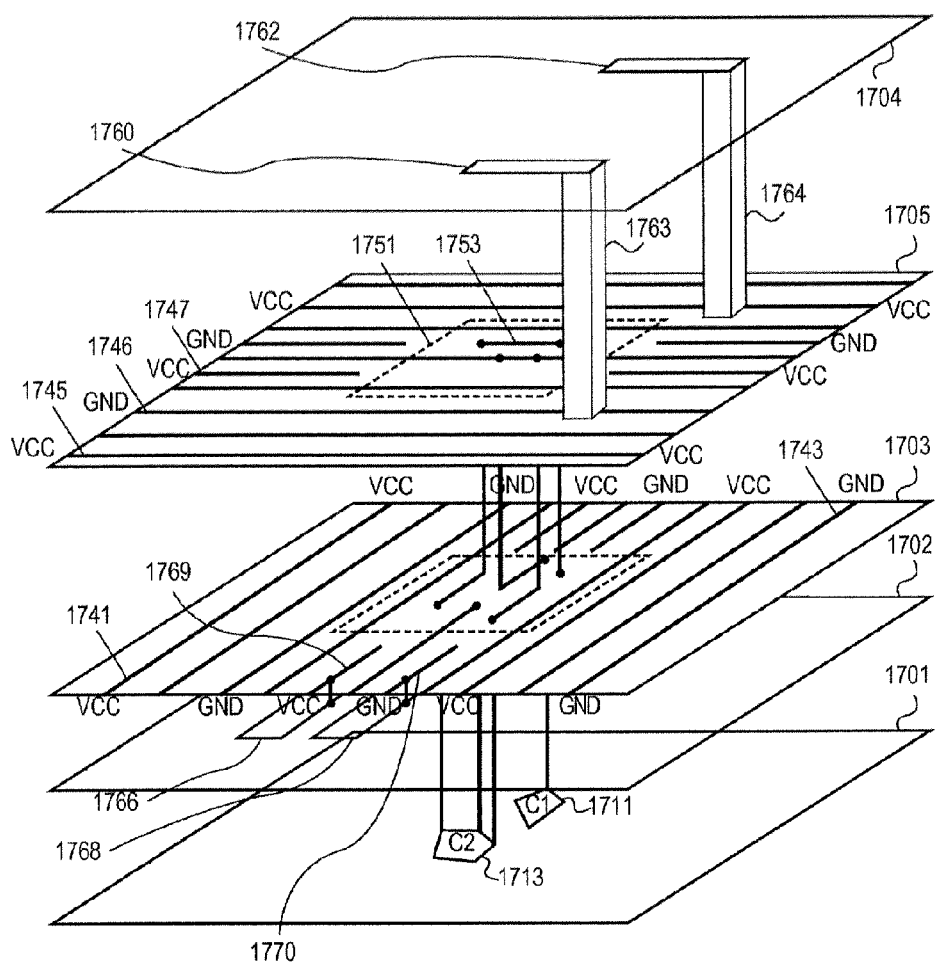
FIG. 40 shows a multi-level, perspective view of two shielding meshes and two other layers with power lines which are used to feed power to the two shielding meshes.

FIG. 40 shows an alternative embodiment of a shielding mesh having a window which is unshielded and having power rings to provide the reference voltages to the shielding mesh. The embodiment of FIG. 40 may be considered an alternative embodiment of the shielding mesh shown in FIG. 15. The shielding mesh shown in FIG. 40 includes a first layer 1703 and a second layer 1705, each of which includes a shielding mesh formed of the plurality of conductive lines carrying, in an alternating manner, two reference voltages (in this case, VCC and ground). In each of these layers, there is a window in which the lines in the shielding mesh which carry the reference voltages are absent; this area may be referred to as windows in each shielding mesh and provide for the routing of signal lines in an unshielded manner. These windows are often created when there is congestion in routing signals through the shielding mesh. Two other layers 1702 and 1704 are also shown in this representation (in a perspective view) of the various layers of an integrated circuit. Layers 1704 and 1702 include power rings or power lines which are enlarged conductive lines which supply, through these larger lines, the two reference voltages to shielding meshes. In particular, power lines 1760 and 1762 provide through vias 1763 and 1764 respectively, the reference voltages to at least two of the conductive lines in the shielding mesh of layer 1705. It will be appreciated that each power line in the layer 1704 may feed multiple reference voltage lines in the underlying layer 1705. For example, a power line on layer 1704 running perpendicular to the lines in layer 1705 may provide multiple connections through multiple vias to all or some of the corresponding reference voltage lines on the underlying layer 1705. The layer 1702 which is disposed under the layer 1703 also provides through enlarged power lines connections to lines in the shielding mesh in layer 1703. In particular, power lines 1766 and 1768 provide a lower resistance conductive path for the reference voltages to their respective lines in the shielding mesh of layer 1703. This is unlike the configuration shown in FIG. 15 in which the power rings are disposed within the same layers as the shielding mesh itself.

Figure 41:
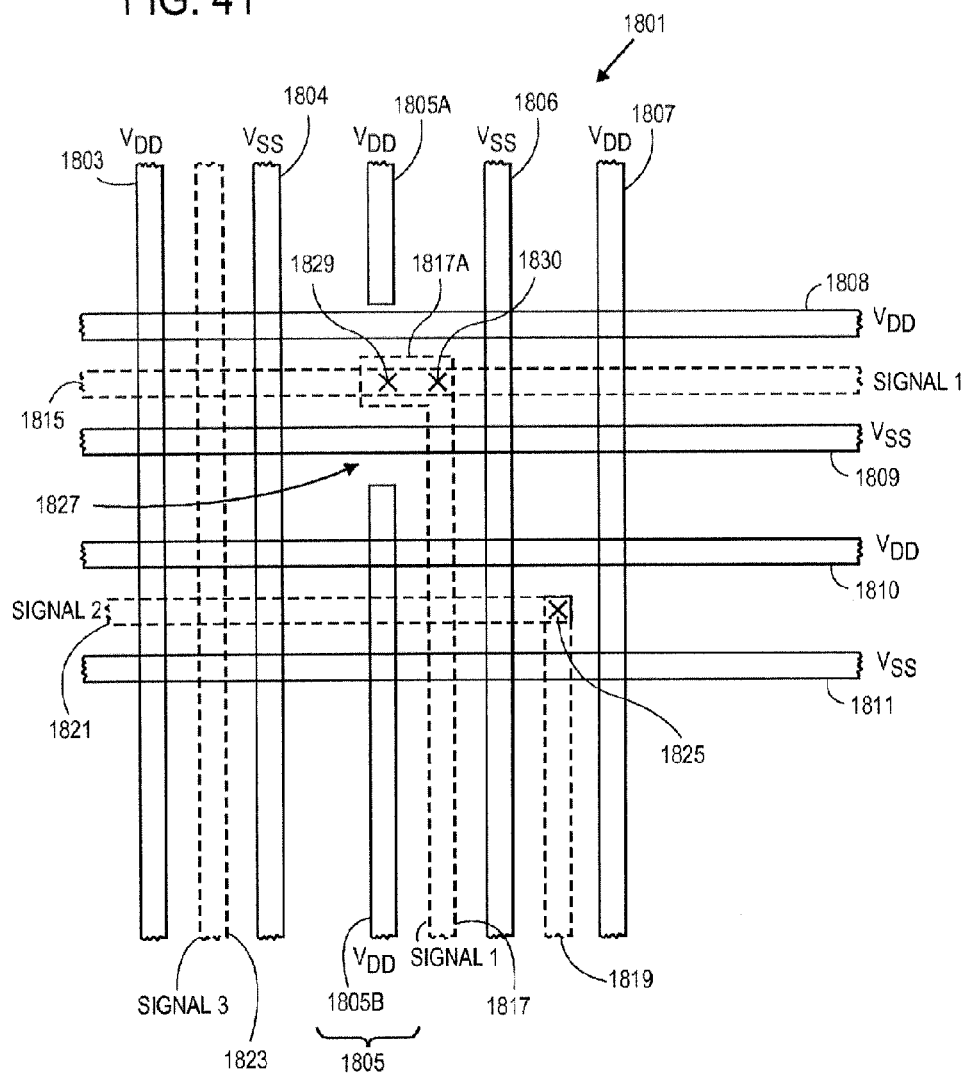
FIG. 41 shows another exemplary embodiment of shielding meshes in an IC.

FIG. 41 shows another embodiment of a shielding mesh 1801 which may be used in an integrated circuit. In the top level view of FIG. 41, a two layer shielding mesh includes a first set of reference voltage lines 1808, 1809, 1810, and 1811 on one layer of the integrated circuit and a second set of reference voltage lines 1803, 1804, 1805, 1806, and 1807 on a second layer of the integrated circuit. The reference voltage line 1805 is shown as two parts 1805A and 1805B because this reference voltage line has been broken into two parts in a manner which is similar to the reference voltage line 1404 shown in FIG. 34A which is broken into two parts 1404A and 1404B shown in FIG. 34B. The break in the reference line creates an opening 1827 which allows the signal line 1817 to have an enlarged portion of that signal line routed into the opening 1827. This enlarged portion 1817A includes two connection vias 1829 and 1830 which are used to couple the line 1817 to the signal line 1815 in the other layer as shown in FIG. 41. Two other signal lines are also shown in the shielding mesh (signal lines 1821 and 1819) as well as signal line 1823. These other lines are also routed through the shielding mesh. The ability to provide two connection vias within the shielding mesh increases the current carrying capacity in the transition between one layer to another layer. The enlarged portion of the signal line 1817A allows for the use of multiple connection vias to allow this interconnection to occur with less resistance. The architecture shown in FIG. 41 may be intentionally designed in cases where signals need to have low resistance and where it is possible to break a reference voltage line in a shielding mesh, such as the reference voltage line 1805 which is broken into two portions 1805A and 1805B.

Figure 42:
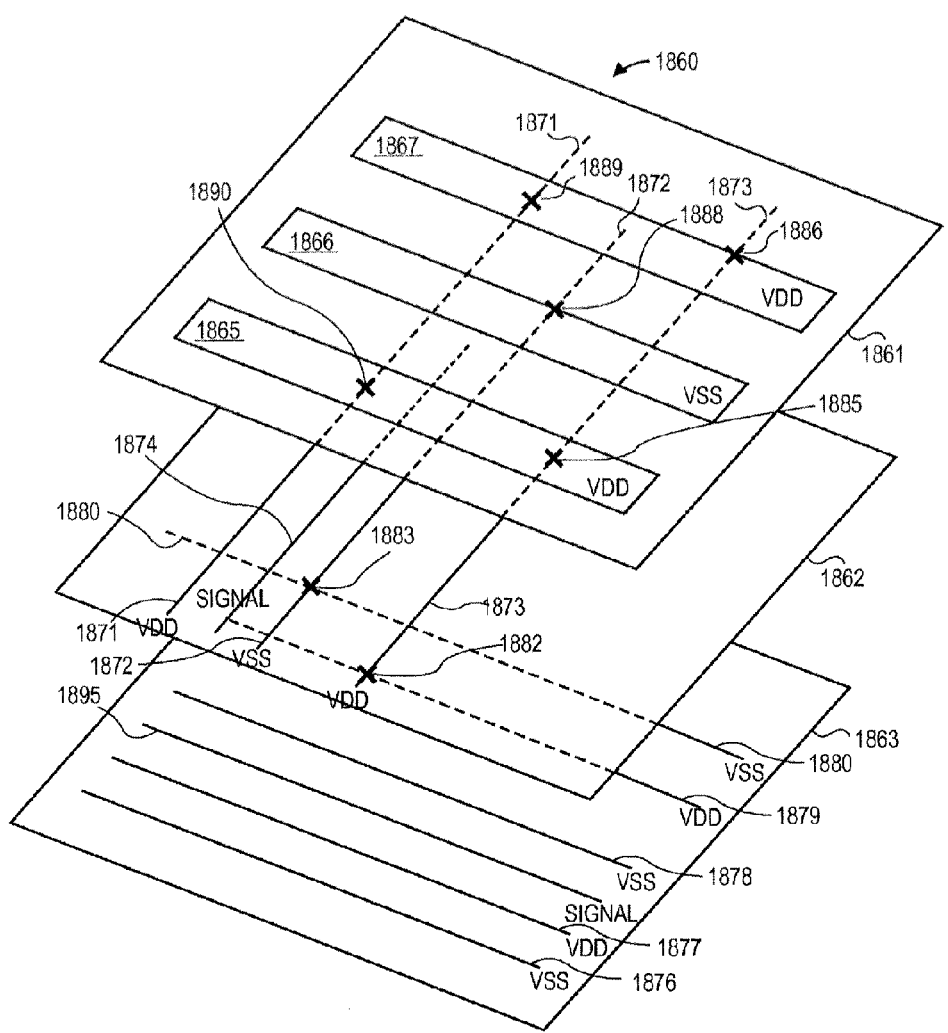
FIG. 42 shows a multi-level, perspective view of two shielding meshes and another layer with power lines which are used to feed power to the two shielding meshes.

FIG. 42 shows another example of a shielding mesh in an integrated circuit. In the perspective view of the multiple layers of the shielding mesh shown in FIG. 42, the shielding mesh includes a first group of reference voltage lines in the layer 1863 and a second group of reference voltage lines in the layer 1862. Signal lines may be routed through these shielding meshes in the manner described herein. An additional layer 1861 includes enlarged reference voltage lines which provide a lower resistance path in order to supply the reference voltages to the reference lines in the shielding mesh.

Figure 43:
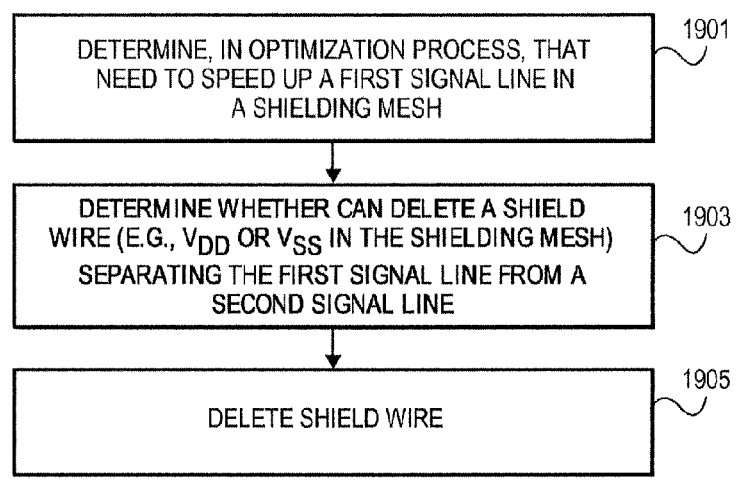
FIG. 43 shows another exemplary method for designing an IC according to another aspect of the invention.

FIG. 43 shows a flowchart which illustrates another aspect of the inventions described herein. In an exemplary method of this aspect which is shown in FIG. 43, operation 1901 determines, in an optimization process, that there is a need to speed up a first signal line which is in a shielding mesh. If this need exists, then in operation 1903 the computer aided design system can determine whether a shielding wire, such as a first or second reference voltage line in a shielding mesh, can be removed, where this shielding wire separates the first signal line which needs to be speeded up from a second signal line. This can be determined by, for example, examining the transition times of the signals appearing on the first signal line and the second signal line. If these transition times do not overlap or differ by more than a predetermined period of time, the shield wire may be deleted. This will allow for the increase in the speed of signal transmission on at least one of these two signal lines. FIG. 43 illustrates another aspect of the inventions which indicates a difference in philosophy in designing an integrated circuit. Prior art systems often do not provide shielding initially in a design. Rather, prior art methods typically determine if there is a signal integrity problem and if there is, then these prior art techniques add the shielding (in order to try to fix the signal integrity problem) after determining there is a signal integrity problem. According to one aspect of the inventions described herein, some of the methods described use a "safe" approach in which the shielding mesh is added at the beginning of the design process and wires are routed in the shielding mesh and then the shielding mesh is selectively altered by deleting shielding lines in the shielding mesh, creating openings in the shielding lines, etc.

Figure 44:
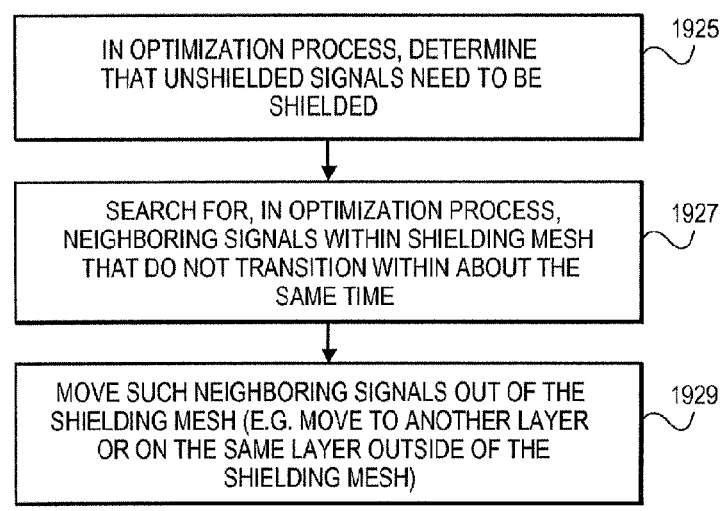
FIG. 44 shows another exemplary method for designing an IC according to another aspect of the invention.

FIG. 44 is a flowchart illustrating an exemplary method according to another aspect of the inventions. In this method, which may be part of an optimization process, it is determined whether unshielded signals need to be shielded in operation 1925. If such unshielded signals do exist, then in operation 1927, the computer aided design system searches for neighboring signals within a shielding mesh that do not transition within about the same time. These neighboring signals may then be moved in operation 1929 out of the shielding mesh in order to allow the previously unshielded signals to be placed into the shielding mesh.

Although some examples of the present invention are illustrated with shielding meshes that are aligned with a substrate grid, the wires of a shielding mesh may not aligned with any grid. Further, the wires of a shielding mesh within a layer do not have to run in a same direction. A router can introduce the shielding mesh into the substrate while routing the signal wires; and, a shielding mesh may evolve during a routine operation as the router introduces new shielding wires, combines shielding wires and tracks in between, removes some shielding wires for routing signals, etc.

In one embodiment of the present invention, a fully connected power and ground shielding mesh can be used to remove capacitive and inductive coupling. The main sources for this mesh are the main power grid trunks, independent power and ground trunks, and/or other reference voltages stabilized for shielding, where they are relatively noiseless. A shielding mesh can also be connected to more than two reference voltages.

The shielding mesh can also be used in standard cells or gate array routing areas, routing channels or routing channels on top of hard macros, data bus routing, control bus routing, address bus routing, analog signal routing, clocks and clock bus routing, or any other signal lines. It will be appreciated that, normally, the reference voltages (and the lines carrying the reference voltages) are not intended to fluctuate over time; that is, these lines are intended to have relatively stable voltages over time. Signal lines, on the other hand, are intended (and expected) to fluctuate over time as a result of the operation of the circuit.

With two or more interwoven meshes, each of which is fully connected and energized at two or more reference voltages, the automated chip routing can be much more worry-free; and the signal integrity problems due to capacitive and inductive coupling can be virtually eradicated.

While most embodiments of the present invention are intended for use in systems containing signal routing software (e.g. place and route systems or physical synthesis systems), the invention is not necessarily limited to such use. Although use of other languages and computer programs is possible (e.g. a computer program may be written to describe hardware and thus be considered an expression in an HDL and may be compiled or the invention, in some embodiments, may allocate and reallocate a logic representation, e.g. a netlist, which was created without the use of an HDL), embodiments of the present invention have been described in the context of use in HDL synthesis systems and physical synthesis systems, and particularly those designed for use with integrated circuits which have vendor-specific technology/architectures. As is well known, the target architecture is typically determined by a supplier of programmable ICs. Examples of target architecture are the structured ASIC targets such as NEC's ISSP (Instant Silicon Solution Platforms) devices and LSI Logic's Rapid Chip devices. For certain preferred embodiments, the present invention may be employed with application-specific integrated circuits (ASICs).

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A non-transitory machine readable medium containing executable computer program instructions which when executed by a data processing system cause the data processing system to perform a method of designing an integrated circuit (IC), the method comprising:

generating a representation of a shielding mesh in at least one layer of a representation of a design of the IC, the shielding mesh having a first plurality of lines which are designed to provide a first reference voltage and having a second plurality of lines which are designed to provide a second reference voltage and wherein the shielding mesh comprises a window in which signal lines are routed with less shielding than signal lines which are routed in the shielding mesh; and generating a representation of power supply lines in at least a first layer of the representation of the IC, the first layer containing the representation of the power supply lines being different than the at least one layer which contains the shielding mesh, the power supply lines being coupled to the shielding mesh and being larger in width than the first plurality of lines and the second plurality of lines.

2. The non-transitory machine medium as in claim 1 wherein the power supply lines are aligned in substantial geometric registration with the window and wherein the power supply lines include lines which are designed to provide the first reference voltage and lines which are designed to provide the second reference voltage.

3. The non-transitory machine readable medium as in claim 1 wherein the at least one layer which contains the shielding mesh does not contain power supply lines, having larger widths than the first plurality of lines and the second plurality of lines, in proximity to the shielding mesh.

4. The non-transitory machine readable medium of claim 1, wherein the method further comprises
generating a representation of power supply lines in at least a second layer of the representation of the IC.

5. The non-transitory machine readable medium of claim 1, wherein the power supply lines are coupled to the shielding mesh through vias between the first layer and the at least one layer.

6. The non-transitory machine readable medium of claim 1, wherein at least one of the power supply lines is coupled to at least two of the first plurality of lines.

7. A method to design an integrated circuit (IC), the method comprising:
generating a representation of a shielding mesh in at least one layer of a representation of a design of the IC, the shielding mesh having a first plurality of lines which are designed to provide a first reference voltage and having a second plurality of lines which are designed to provide a second reference voltage and wherein the shielding mesh comprises a window in which signal lines are routed with less shielding than signal lines which are routed in the shielding mesh; and
generating a representation of power supply lines in at least a first layer of the representation of the IC, the first layer containing the representation of the power supply lines being different than the at least one layer which contains the shielding mesh, the power supply lines being coupled to the shielding mesh and being larger in width than the first plurality of lines and the second plurality of lines, wherein at least one of the generating the representation of the shielding mesh and the generating the representation of the power supply lines is performed by a processor.

8. The method of claim 7 wherein the power supply lines are aligned in substantial geometric registration with the window and wherein the power supply lines include lines which are designed to provide the first reference voltage and lines which are designed to provide the second reference voltage.

9. The method of claim 7 wherein the at least one layer which contains the shielding mesh does not contain power supply lines, having larger widths than the first plurality of lines and the second plurality of lines, in proximity to the shielding mesh.

10. The method of claim 7, wherein the method further comprises
generating a representation of power supply lines in at least a second layer of the representation of the IC.

11. The method of claim 7, wherein the power supply lines are coupled to the shielding mesh through vias between the first layer and the at least one layer.

12. The method of claim 7, wherein at least one of the power supply lines is coupled to at least two of the first plurality of lines.

13. A data processing system to design an integrated circuit (IC), the data processing system comprising:
means for generating a representation of a shielding mesh in at least one layer of a representation of a design of the IC, the shielding mesh having a first plurality of lines which are designed to provide a first reference voltage and having a second plurality of lines which are designed to provide a second reference voltage and wherein the shielding mesh comprises a window in which signal lines are routed with less shielding than signal lines which are routed in the shielding mesh; and
means for generating a representation of power supply lines in at least a first layer of the representation of the IC, the first layer containing the representation of the power supply lines being different than the at least one layer which contains the shielding mesh, the power supply lines being coupled to the shielding mesh and being larger in width than the first plurality of lines and the second plurality of lines.

\* \* \* \* \*